(12) United States Patent
Kang et al.

(10) Patent No.: US 9,905,538 B2
(45) Date of Patent: Feb. 27, 2018

(54) CHIP-STACKED SEMICONDUCTOR PACKAGE AND METHOD OF MANUFACTURING THE SAME

(71) Applicant: Samsung Electronics Co., Ltd., Suwon-si, Gyeonggi-do (KR)

(72) Inventors: Un-Byoung Kang, Hwaseong-si (KR); Tae-Je Cho, Hwaseong-si (KR); Byung-Hyug Roh, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 7 days.

(21) Appl. No.: 15/402,521

(22) Filed: Jan. 10, 2017

(65) Prior Publication Data
US 2017/0125387 A1 May 4, 2017

Related U.S. Application Data

(62) Division of application No. 14/509,317, filed on Oct. 8, 2014, now Pat. No. 9,601,465.

(30) Foreign Application Priority Data

Oct. 16, 2013 (KR) .......................... 10-2013-0123599

(51) Int. Cl.
*H01L 25/065* (2006.01)
*H01L 23/00* (2006.01)
(Continued)

(52) U.S. Cl.
CPC ........ *H01L 25/0657* (2013.01); *H01L 21/561* (2013.01); *H01L 21/563* (2013.01);
(Continued)

(58) Field of Classification Search
CPC ..................................................... H01L 24/94
See application file for complete search history.

(56) References Cited

U.S. PATENT DOCUMENTS 7,843,052 B1 * 11/2010 Yoo ........................ H01L 21/561
257/686
8,298,914 B2 10/2012 Farooq et al.
(Continued)

FOREIGN PATENT DOCUMENTS

JP 2012146853 A 8/2012
JP 2013021058 A 1/2013
(Continued)

*Primary Examiner* — Ermias Woldegeorgis
(74) *Attorney, Agent, or Firm* — Harness, Dickey & Pierce, P.L.C.

(57) ABSTRACT

A chip-stacked semiconductor package includes a first chip having a first front surface, a first back surface, and a first connection member on the first front surface, the first back surface being opposite to the first front surface; a second chip having a second front surface, a second back surface, a second connection member and a first through-silicon via (TSV) electrically connected to the second connection member, the second back surface opposite to the second front surface, and the second connection member on the second front face; and a first sealing member between the first front surface and the second front surface, the first sealing member filling a space between the first connection member and the second connection member, the first connection member of the first chip and the second connection member of the second chip being symmetric with respect to each other.

20 Claims, 44 Drawing Sheets

(51) Int. Cl.
  *H01L 21/56* (2006.01)
  *H01L 21/768* (2006.01)
  *H01L 21/78* (2006.01)
  *H01L 25/00* (2006.01)
  *H01L 23/31* (2006.01)
  *H01L 23/29* (2006.01)

(52) U.S. Cl.
  CPC ........ *H01L 21/76898* (2013.01); *H01L 21/78* (2013.01); *H01L 23/3135* (2013.01); *H01L 23/3142* (2013.01); *H01L 24/11* (2013.01); *H01L 24/17* (2013.01); *H01L 24/92* (2013.01); *H01L 24/94* (2013.01); *H01L 24/96* (2013.01); *H01L 24/97* (2013.01); *H01L 25/50* (2013.01); H01L 21/565 (2013.01); H01L 23/295 (2013.01); H01L 23/3128 (2013.01); H01L 24/05 (2013.01); H01L 24/13 (2013.01); H01L 24/16 (2013.01); H01L 2224/0231 (2013.01); H01L 2224/02372 (2013.01); H01L 2224/0346 (2013.01); H01L 2224/0401 (2013.01); H01L 2224/05009 (2013.01); H01L 2224/0557 (2013.01); H01L 2224/05548 (2013.01); H01L 2224/05572 (2013.01); H01L 2224/05624 (2013.01); H01L 2224/05647 (2013.01); H01L 2224/06131 (2013.01); H01L 2224/131 (2013.01); H01L 2224/13023 (2013.01); H01L 2224/13025 (2013.01); H01L 2224/13124 (2013.01); H01L 2224/13144 (2013.01); H01L 2224/13147 (2013.01); H01L 2224/1413 (2013.01); H01L 2224/14181 (2013.01); H01L 2224/16113 (2013.01); H01L 2224/16146 (2013.01); H01L 2224/16148 (2013.01); H01L 2224/16227 (2013.01); H01L 2224/16238 (2013.01); H01L 2224/1713 (2013.01); H01L 2224/17181 (2013.01); H01L 2224/73204 (2013.01); H01L 2224/9202 (2013.01); H01L 2224/92125 (2013.01); H01L 2224/94 (2013.01); H01L 2224/97 (2013.01); H01L 2225/06513 (2013.01); H01L 2225/06517 (2013.01); H01L 2225/06541 (2013.01); H01L 2225/06555 (2013.01); H01L 2924/05442 (2013.01); H01L 2924/0665 (2013.01); H01L 2924/12042 (2013.01); H01L 2924/14 (2013.01); H01L 2924/181 (2013.01); H01L 2924/186 (2013.01)

(56) References Cited

U.S. PATENT DOCUMENTS

| | | | |
|---|---|---|---|
| 2007/0228546 A1* | 10/2007 | So | H01L 25/0657 257/690 |
| 2007/0278657 A1 | 12/2007 | Lee | |
| 2011/0193229 A1 | 8/2011 | Ma et al. | |
| 2011/0237027 A1* | 9/2011 | Kim | H01L 25/16 438/107 |
| 2012/0038045 A1 | 2/2012 | Lee | |
| 2012/0049361 A1 | 3/2012 | Park et al. | |
| 2012/0077314 A1 | 3/2012 | Park et al. | |
| 2012/0088332 A1* | 4/2012 | Lee | H01L 21/561 438/113 |
| 2012/0282735 A1* | 11/2012 | Ahn | H01L 21/76898 438/109 |
| 2013/0082399 A1 | 4/2013 | Kim et al. | |

FOREIGN PATENT DOCUMENTS

| | | |
|---|---|---|
| JP | 2013033952 A | 2/2013 |
| JP | 2013089999 A | 4/2013 |
| KR | 10-1069517 B1 | 9/2011 |

* cited by examiner

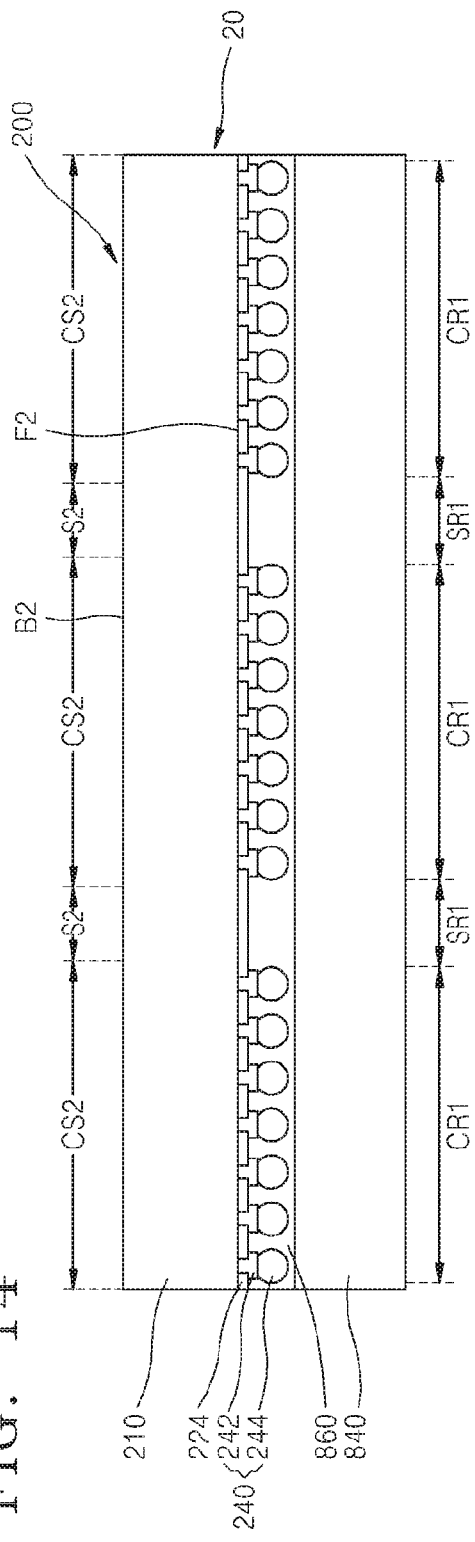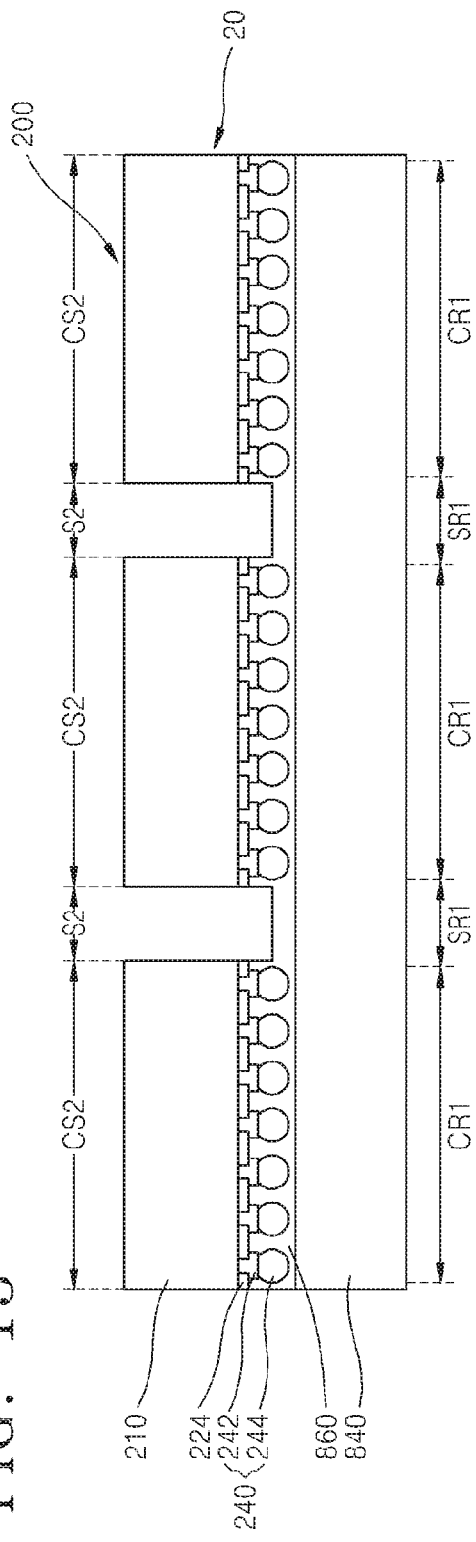

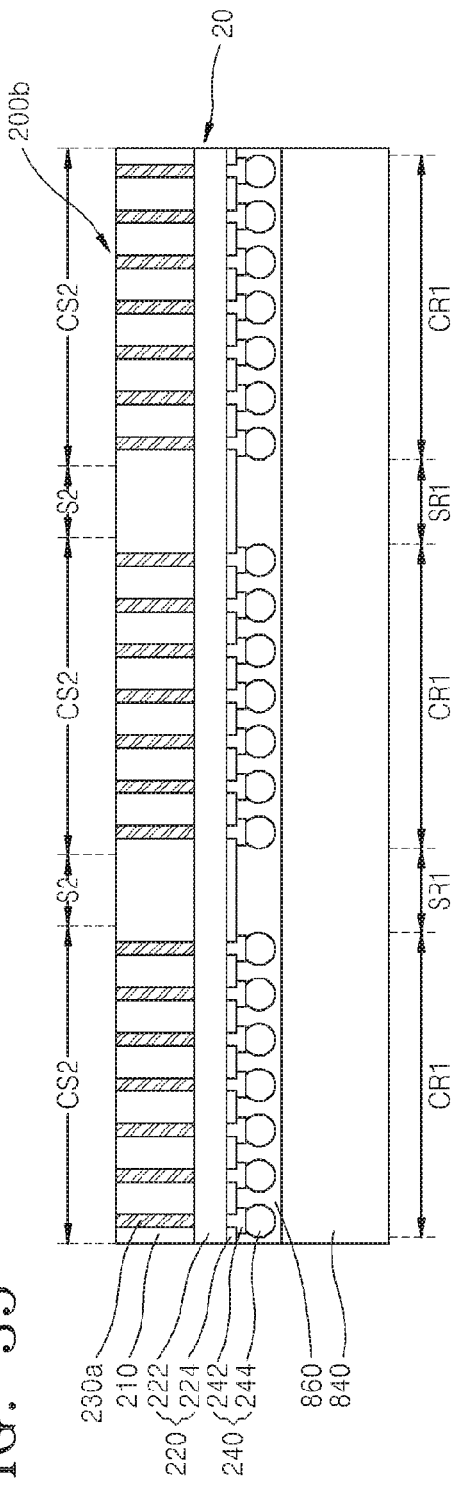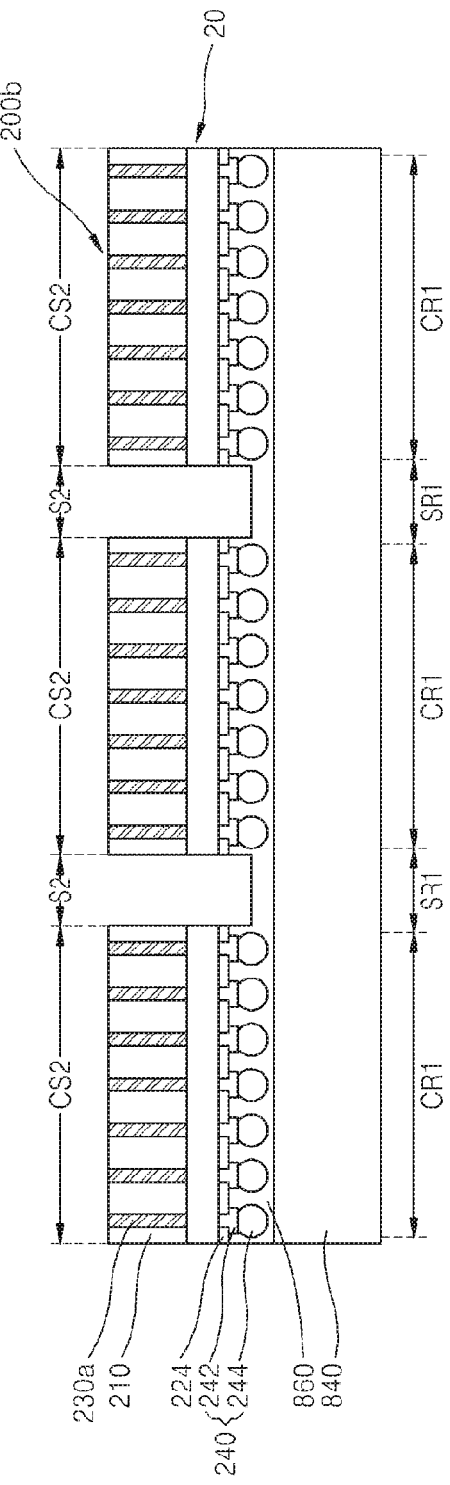

CHIP-STACKED SEMICONDUCTOR PACKAGE AND METHOD OF MANUFACTURING THE SAME

CROSS-REFERENCE TO RELATED APPLICATIONS

This application is a divisional application of and claims priority under 35 U.S.C. § 120/121 to U.S. application Ser. No. 14/509,317 filed Oct. 8, 2014, which claims priority under 35 U.S.C. § 119 to Korean Patent Application No. 10-2013-0123599, filed on Oct. 16, 2013, in the Korean Intellectual Property Office, the entire contents of each of these applications are incorporated herein by reference.

BACKGROUND

Inventive concepts relate to a semiconductor package and/or a method of manufacturing the same, such as, a chip-stacked semiconductor package including a plurality of chips that are stacked one another and/or a method of manufacturing the chip-stacked semiconductor package.

The semiconductor industry refers to a collection of companies having objectives to fabricate semiconductor devices that have a compact design, multi-functions, high storage capacity, and high reliability at low costs. One of important technology which may achieve those objectives is a semiconductor package technology. A chip-stacked semiconductor package including a plurality of chips that are stacked on one another is suggested as a method for achieving those objectives in the semiconductor package technology.

SUMMARY

Inventive concepts provide a chip-stacked semiconductor package that may have a compact design, multi-functions, and a high storage capacity by stacking a plurality of chips.

Inventive concepts also provide a method of manufacturing the chip-stacked semiconductor package at low costs.

According to an example embodiment of inventive concepts, there is provided a chip-stacked semiconductor package including a first chip having a first front surface, a first back surface, and a first connection member on the first front surface, the first back surface being opposite to the first front surface; a second chip having a second front surface, a second back surface, a second connection member and a first through-silicon via (TSV) electrically connected to the second connection member, the second back surface opposite to the second front surface, and the second connection member on the second front face; and a first sealing member between the first front surface and the second front surface, the first sealing member filling a space between the first connection member and the second connection member, the first connection member of the first chip and the second connection member of the second chip being symmetric with respect to each other.

The first sealing member may be a connected portion between the first connection member and the second connection member, and the first sealing member is also on a side surface of the second chip.

The chip-stacked semiconductor package may further include a third connection member on the second back surface of the second chip. The third connection member connects the first chip and the second chip to one of a main chip and a board substrate. The chip-stacked semiconductor package may further include a fourth connection member electrically connected to the third connection member and at least one third chip.

The chip-stacked semiconductor package may further include a fifth connection member on a third back surface of the third chip. The chip-stacked semiconductor package may further include a second sealing member that fills a space between the third connection member and the fourth connection member. The second sealing member may be on a connected portion between the third connection member and the fourth connection member, and the second sealing member may be on a side surface of the third chip.

A size of the first chip may be greater than or equal to a size of the second chip. A thickness of the first chip may be greater than or equal to a thickness of the second chip.

The first back surface and side surfaces of the first chip may be exposed. Side surfaces of the second chip may be exposed.

The first sealing member may be at least one of an underfill, an adhesive, and a molding member.

According to an example embodiment of inventive concepts, there is provided a chip-stacked semiconductor package including a first chip that includes a first body layer having a first front surface and a first back surface opposite to the first front surface, and a first connection member that is formed on the first front surface; a second chip that includes a second body layer having a second front surface and a second back surface opposite to the second front surface, a first through-silicon via (TSV) in the second body layer, a second connection member on the second front surface to face the first front surface, the second connection member electrically connected to the first TSV, and a third connection member on the second back surface of the second chip, the third connection member electrically connected to the first TSV; a first sealing member between the first front surface and the second front surface, the first sealing member fills a space between the first connection member and the second connection member.

The chip-stacked semiconductor package further includes at least one third chip on the second back surface of the second chip, the third chip includes a third body layer having a third front surface and a third back surface opposite to the third front surface, a second TSV in the third body layer, and a fourth connection member on the third front surface to face the second back surface and is electrically connected to the third connection member; and a second sealing member between the second back surface and the third front surface, the second sealing member fills a space between the third connection member and the fourth connection member, the first connection member of the first chip and the second connection member of the second chip being symmetric with respect to each other.

The first TSV and the second TSV entirely pass through the second body layer and the third body layer respectively.

The first TSV and the second TSV partially pass through the second body layer and the third body layer respectively, a multi-layer wiring pattern is insulated by an insulating layer and is on the first and second TSVs, and the multi-layer wiring pattern is electrically connected to the first and second TSVs.

A fifth connection member may be on the third back surface of the third chip. The fifth connection member connects the first through third chips to one of a main chip or a board substrate.

The first sealing member may be on a connected portion between the first connection member and the second connection member, and the first sealing member is on a side surface of the second chip, and the second sealing member is on a connected portion between the third connection member and the fourth connection member, and the second sealing member on a side surface of the third chip.

A thickness of the first chip may be greater than or equal to a thickness of the third chip.

The first back surface and side surfaces of the first chip may be exposed, and side surfaces of each of the second chip and the third chip may be exposed.

According to another example embodiment of inventive concepts, there is provided a method of manufacturing a chip-stacked semiconductor package, the method including preparing a base wafer, the base wager including a plurality of first chips, each of the plurality of first chips has a first front surface, a first back surface that is opposite to the first front surface, and a first connection member on the first front surface; preparing a plurality of second chips, each of the plurality of second chips having a second front surface, a second back surface that is opposite to the second front surface, and a second connection member on the second front surface; stacking the plurality of second chips on the plurality of first chips, such that the second connection member is electrically connected to the first connection member between the first front surface and the second front surface; sealing the plurality of second chips that are formed on the base wafer by using a first sealing member; forming a first through-silicon via (TSV) that is electrically connected to the second connection member in each of the plurality of second chips; separating the plurality of first chips and the plurality of second chips that are formed on the base wafer, wherein first connection member of each of the plurality of first chips and the second connection member of each of the plurality of second chips are arranged in a symmetric fashion with respect to each other.

After the forming the first TSV, the method may further include forming a third connection member that is connected to the first TSV on the second back surface of each of the plurality of second chips.

The method may further include attaching at least one third chip to each of the plurality of second chips, wherein each of the at least one third chip has a third front surface, a third back surface that is opposite to the third front surface, and a fourth connection member on the third front surface, the fourth connection member is electrically connected to the third connection member between the second back surface and the third front surface.

The method may further include sealing the at least one third chip using a second sealing member; and forming a second TSV that is electrically connected to the third connection member, the second TSV being in the at least one third chip.

The separating of the plurality of first and second chips includes sawing the base wafer to form the first sealing member on side surfaces of each of the plurality of second chips.

The separating of the plurality of first and second chips may include sawing the base wafer to expose side surfaces of each of the plurality of second chips.

According to another example embodiment of inventive concepts, there is provided a method of manufacturing a chip-stacked semiconductor package, the method including preparing a base wafer, the base wafer including a plurality of first chips, each of the plurality of first chips has a first front surface, a first back surface that is opposite to the first front surface, and a first connection member on the first front surface; preparing a plurality of second chips, each of the plurality of first chips has a second front surface, a second back surface that is opposite to the second front surface, a second connection member on the second front surface, and a first through-silicon via (TSV) in each of the plurality of second chips, and the first TSV is electrically connected to the second connection member; stacking the plurality of second chips on the plurality of first chips such that the first connection member and the second connection member symmetric with respect to each other; electrically connecting the second connection member to the first connection member between the first front surface and the second front surface; sealing the plurality of second chips by using a first sealing member; forming a third connection on the second back surface of each of the plurality of second chips, the third connection member connected to the first TSV; attaching at least one third chip to each of the plurality of second chips having a third front surface, a third back surface opposite to the third front surface, a fourth connection member on the third front surface, and a second TSV connected to the fourth connection member, the second TSV electrically connecting the fourth connection member to the third connection member between the second back surface and the third front surface; sealing the at least one third chip using a second sealing member; and separating the plurality of first chips, the plurality of second chips, and the at least one third chip.

The separating of the plurality of first chips, the plurality of second chips, and the at least one third chip may include sawing the base wafer to form the first sealing member and the second sealing member on side surfaces of the plurality of second chips and the at least one third chip.

The separating of the plurality of first chips, the plurality of second chips, and the at least one third chip may include sawing the base wafer to expose side surfaces of each of the plurality of second chips and the at least one third chip.

BRIEF DESCRIPTION OF THE DRAWINGS

Example embodiments of inventive concepts will be more clearly understood from the following detailed description taken in conjunction with the accompanying drawings in which:

FIGS. 14 and 15 are cross-sectional views for explaining a method of manufacturing a second chip, according to an example embodiment of inventive concepts;

FIGS. 35 and 36 are cross-sectional views for explaining a method of manufacturing a second chip used in a method of manufacturing a chip-stacked semiconductor package, according to an example embodiment of inventive concepts;

DETAILED DESCRIPTION OF EXAMPLE EMBODIMENTS

Figure 1:
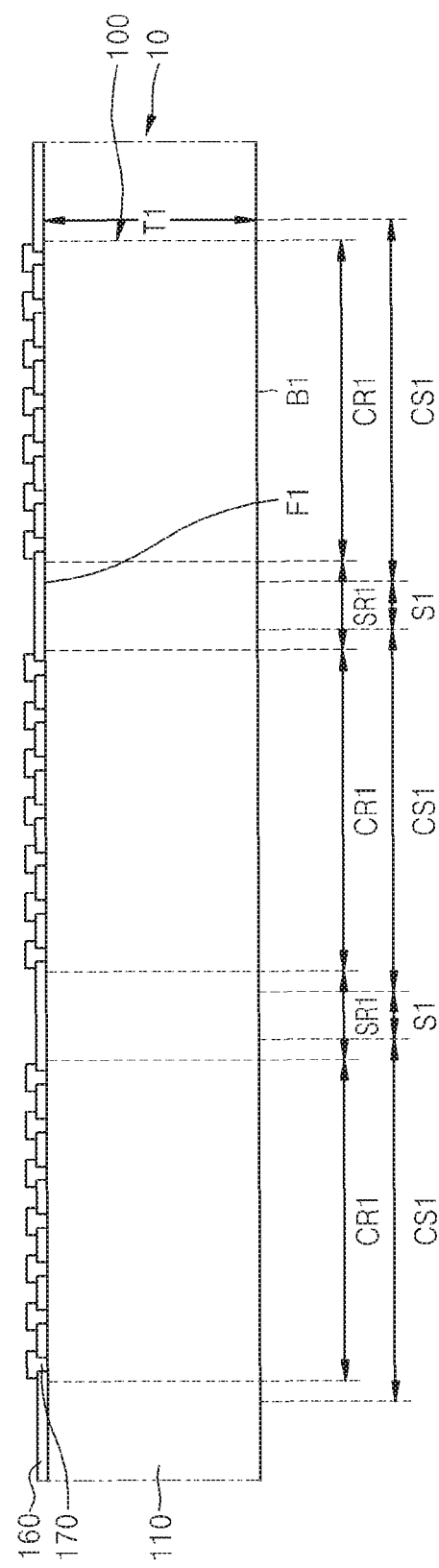
FIGS. 1 through 13 are views for explaining a method of manufacturing a chip-stacked semiconductor package according to an example embodiment of inventive concepts and the chip-stacked semiconductor package manufactured by using the method.

As used herein, the term "and/or" includes any and all combinations of one or more of the associated listed items. Expressions such as "at least one of," when preceding a list of elements, modify the entire list of elements and do not modify the individual elements of the list.

Inventive concepts will now be described more fully with reference to the accompanying drawings, in which example embodiments of inventive concepts are shown.

Inventive concepts now will be described more fully hereinafter with reference to the accompanying drawings, in which elements of inventive concepts are shown. Inventive concepts may, however, be embodied in many different forms and should not be construed as limited to example embodiments set forth herein. Rather, example embodiments are provided so that this disclosure will be thorough and complete, and will fully convey the scope of inventive concepts to one of ordinary skill in the art. Also, a thickness or a size of each layer in the drawings is exaggerated for clarity and convenience of explanation.

It will be understood that when an element, such as a layer, a region, or a substrate, is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements present. Like reference numerals denote like elements throughout.

It will be understood that, although the terms first, second, third etc. may be used herein to describe various members, parts, regions, layers, and/or portions, these members, parts, regions, layers, and/or portions should not be limited by these terms. These terms are only used to distinguish one member, part, region, layer, or portion from another member, part, region, layer, or portion. Thus, a first member, part, region, layer, or portion discussed below could be termed a second member, part, region, layer, or portion without departing from the teachings of example embodiments.

Spatially relative terms, such as "above," "upper," "beneath," "below," "lower," and the like, may be used herein for ease of description to describe one element's relationship to another element(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements would then be oriented "above" the other elements. Thus, the exemplary term "above" may encompass both an orientation of above and below. The device may be otherwise oriented (rotated 90 degrees or at other orientations) and spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

Example embodiments are described herein with reference to cross-sectional illustrations that are schematic illustrations of example embodiments. As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. The following embodiments may be realized as one or in the combination of one or more thereof.

FIGS. 1 through 13 are views for explaining a method of manufacturing a chip-stacked semiconductor package according to an example embodiment of inventive concepts and the chip-stacked semiconductor package manufactured by using the method. FIGS. 1, 3, and 5 through 13 are cross-sectional views, and FIGS. 2 and 4 are plan views.

Figure 2:
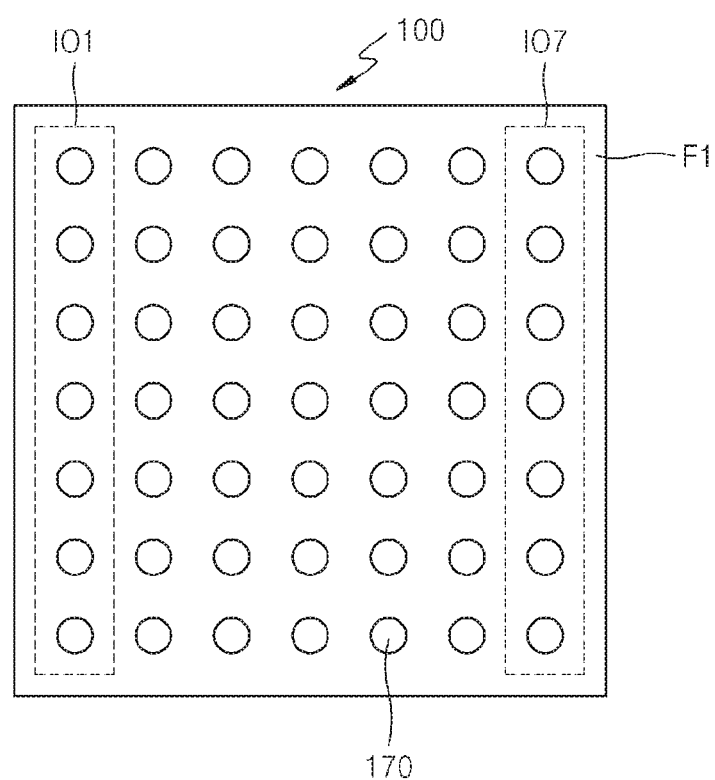

Referring to FIGS. 1 and 2, a base wafer 10 including a plurality of first chips 100 is prepared. The base wafer 10 is completed by simultaneously forming the first chips 100 at a wafer level.

In the base wafer 10, a size of a first chip area is denoted by CR1. The size CR1 of the first chip area may be a width or a length. A size of a scribe line area between the first chips 100 is denoted by SR1. The size SR1 of the scribe line area may be a width or a length.

A size of each of the first chips 100 completed by a subsequent sawing process performed on the base wafer 10 may be denoted by CS1. The size CS1 of the first chip 100 may be a width or a length. A size sawn with a blade in the scribe line area through the subsequent sawing process is denoted by S 1. The size Si sawn with the blade may be a width or a length. The size Si sawn with the blade may be a width of the blade. Although three first chips 100 are formed on the base wafer 10 for convenience of explanation in FIG. 1, tens to hundreds of chips may be formed on the base wafer 10.

Each of the first chips 100 may have a thickness T1. The first chip 100 may have a first front surface F1 and a first back surface B1 that is opposite to the first front surface F1. The first front surface F1 may be a surface of the base wafer 10. The first chip 100 may include a first body layer 110, a passivation layer 160, and a first connection member 170.

The first body layer 110 may include a silicon substrate (not shown), an integrated circuit layer that is formed on the silicon substrate, and an interlayer insulating layer (not shown) that covers the integrated circuit layer. The first body layer 110 may have the first front surface F1 and the first back surface B1 that is opposite to the first front surface F1, like the first chip 100.

The first connection member 170 may be a bump pad. The first connection member 170 may be a conductive pad that is disposed on the first chip 100. The first connection member 170 may be formed on the first front surface F1 as shown in FIG. 2, and an input/output pad group IO1 may be formed on the left side of the first connection member 170, and an input/output pad group IO7 may be formed on the right side of the first connection member 170. The input/output pad groups IO1 and IO7 are example, and example embodiments are not limited thereto.

The input/output pad groups IO1 and IO7 may be arranged in a mirror-symmetric fashion about a second connection member 240 (see FIG. 3) of each of second chips 200 (see FIG. 3) that is mounted later. In other words, the first connection member 170 may be arranged in a mirror-symmetric fashion in consideration of the second connection member 240 of the second chip 200. The first connection member 170 may be formed of a conductive material. The first connection member 170 may be formed of aluminium (Al) or copper (Cu), and may be formed by using pulse plating or direct current plating. However, the first connection member 170 is not limited to the above materials or methods.

The passivation layer 160 may be formed on a top surface of the first body layer 110 and may protect the first body layer 110 from the outside. The passivation layer 160 may insulate the first connection members 170 from each other. The passivation layer 160 may be formed of an oxide film or a nitride film, or a double layer consisting of an oxide film and a nitride film. Alternatively, the passivation layer 160 may be formed of an oxide film, for example, a silicon oxide film made of $SiO_2$, by using high-density plasma chemical vapor deposition (HDP-CVD).

Figure 3:
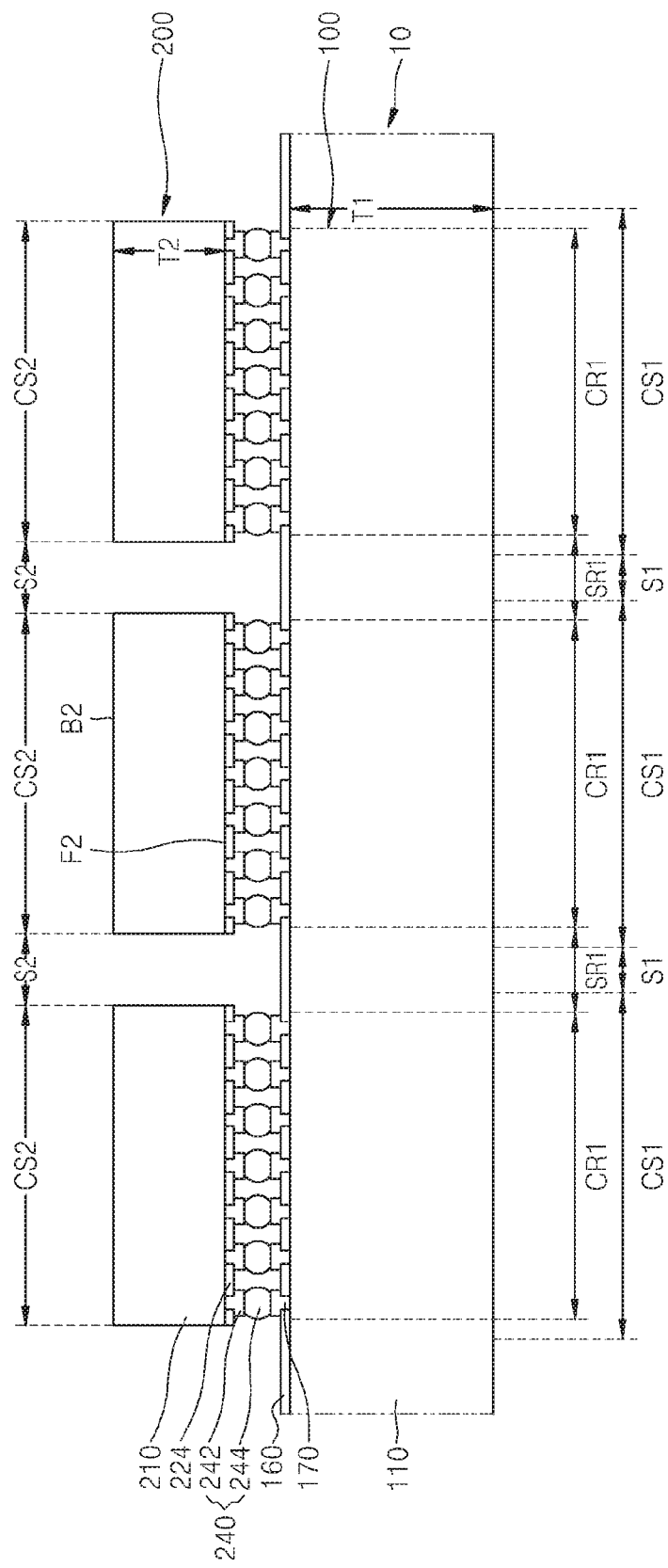
Figure 4:
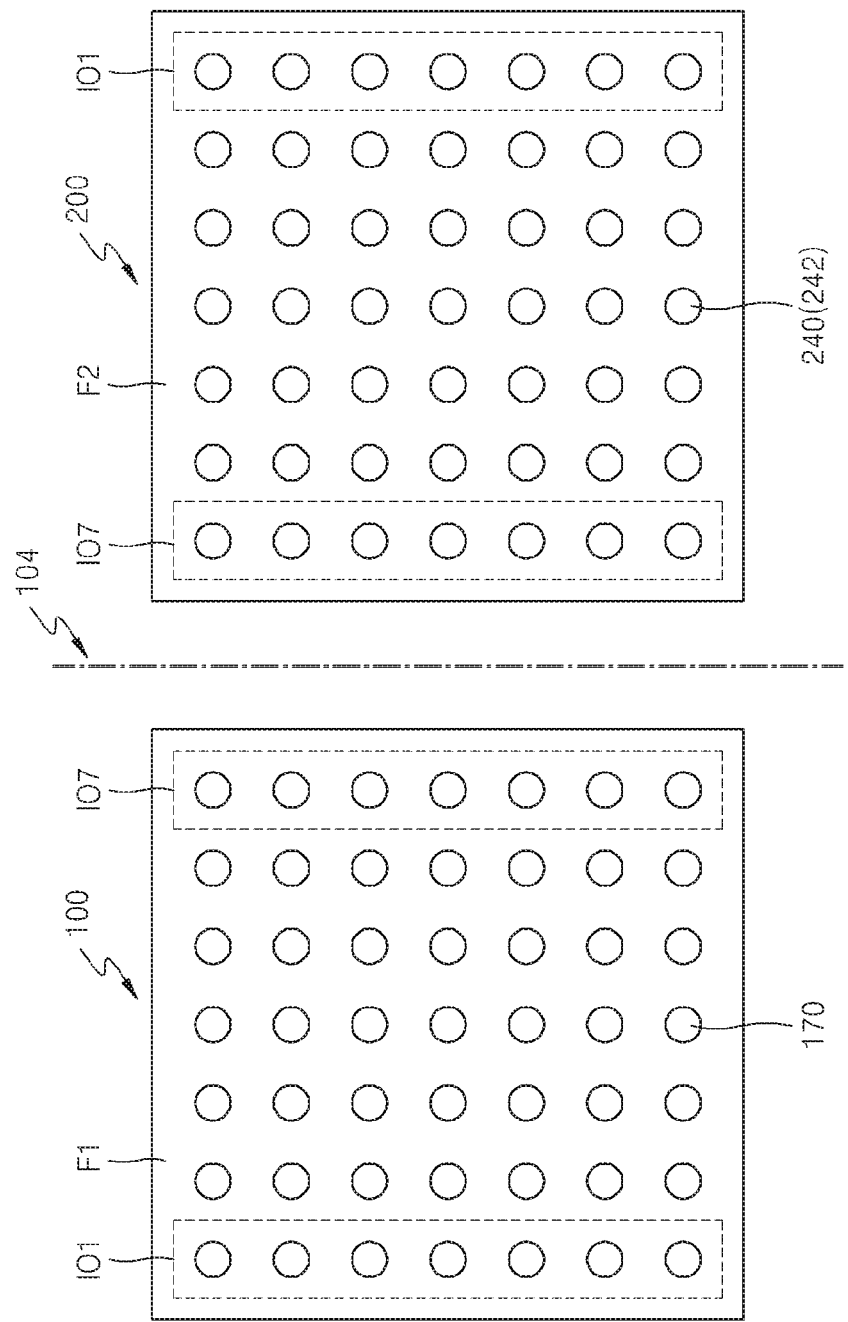

Referring to FIGS. 3 and 4, the plurality of second chips 200 each of which has a second front surface F2 and a second back surface B2 that is opposite to the second front surface F2 are prepared. A process of manufacturing the second chips 200 will be explained below in detail with reference to FIGS. 14 and 15. Each of the second chips 200 may include a second body layer 210, a passivation layer 224, and the second connection member 240.

The second body layer 210 may include a silicon substrate (not shown), an integrated circuit layer that is formed on the silicon substrate, and an interlayer insulating layer (not shown) that covers the integrated circuit layer, like the first body layer 110 of the first chip 100. The second body layer 210 may have the second front surface F2 and the second back surface B2 that is opposite to the second front surface F2. The integrated circuit layer may be formed on the second front surface F2 of the second body layer 210. The second front surface F2 of the second body layer 210 may be an active surface on which device constituent elements are formed. The second back surface B2 of the second body layer 210 may be a non-active surface on which device constituent elements are not formed. The passivation layer 224 may be formed on the bottom of the second body layer 210.

The second connection member 240 may include a bump pad 242 and a bump 244. The bump pad 242 may be formed of a conductive material and may be formed on the passivation layer 224. An under-bump metal (UBM, not shown) may be formed on the bump pad 242. The bump pad 242 and the first connection member 170 may be formed of the same material or different materials, and may be formed by using the same method or different methods.

The bump 244 may be formed on the bump pad 242. The bump 244 may be formed of a conductive material such as Cu, Al, gold (Au), or solder. However, the bump 244 is not limited to the above materials.

The second chips 200 are respectively stacked on the first chips 100 that are formed on the base wafer 10. That is, the second chips 200 are stacked on the first chips 100 such that the second front surface F2 of each of the second chips 200 faces the first front surface F1 of each of the first chips 100. The second connection member 240 is electrically connected to the first connection member 170 between the first front surface F1 and the second front surface F2. The stacking may be performed by adhering the second connection member 240 of the second chip 200 to the first connection member 170 of the first chip 100 by using thermo-compression. The second connection member 240 may be connected to the first connection member 170 of the first chip 100.

The second connection member 240 may be formed on the second front surface F2 as shown in FIG. 4. The second connection member 240 and the first connection member 170 (see FIGS. 1 and 2) may be arranged in a mirror-symmetric fashion 104 with each other. That is, the input/output pad group IO7 may be formed on the left side of the second connection member 240, and the input/output pad group IO1 may be formed on the right side of the second connection member 240. In other words, the input/output pad groups IO1 and IO7 of the second connection member 240 of the second chip 200 and the first connection member 170 of the first chip 100 may be arranged in a mirror-symmetric fashion with each other.

When the second connection member 240 of the second chip and the first connection member 170 of the first chip 100 are disposed in a mirror-symmetric fashion with each other, the second chip 200 may be stacked on the first chip 100. The second chip 200 and the first chip 100 may be of different types. Alternatively, the second chip 200 and the first chip 100 may be of the same type.

The second chip 200 may have a thickness T2. The thickness T2 of the second chip 200 may be less than the thickness T1 of the first chip 100. A size of the second chip 200 is denoted by CS2. The size CS2 of the second chip 200 may be a width or a length. The size CS2 of the second chip 200 may be less than or equal to the size CS1 of the first chip 100.

S2 denotes a size sawn with a blade in a scribe line area of a wafer for second chip (not shown), may be a width or a length, and is greater than the size S1. The size S2 may be a width of the blade. Since the size CS2 of the second chip 200 is less than or equal to the size CS1 of the first chip 100 and the size S2 sawn with the blade is greater than the size S1, a subsequent underfill process and a subsequent sawing process may be easily performed.

The second chips 200 are stacked on the first chips 100 that are formed on the base wafer 10 as shown in FIGS. 3 and 4. That is, the second chips 200 are stacked in a chip on wafer (COW) method on the base wafer 10 including the first chips 100.

When the first chips 100 and the second chips 200 are to be stacked, the second chips 200 are directly respectively stacked on the first chips 100 that are formed on the base wafer 10 without using a temporary carrier wafer. Accordingly, a manufacturing process of attaching a temporary carrier wafer to the base wafer 10 and then detaching the temporary carrier wafer from the base wafer 10 does not need to be performed. Also, since the temporary carrier wafer does not need to be used, package manufacturing costs may be greatly reduced.

Figure 5:
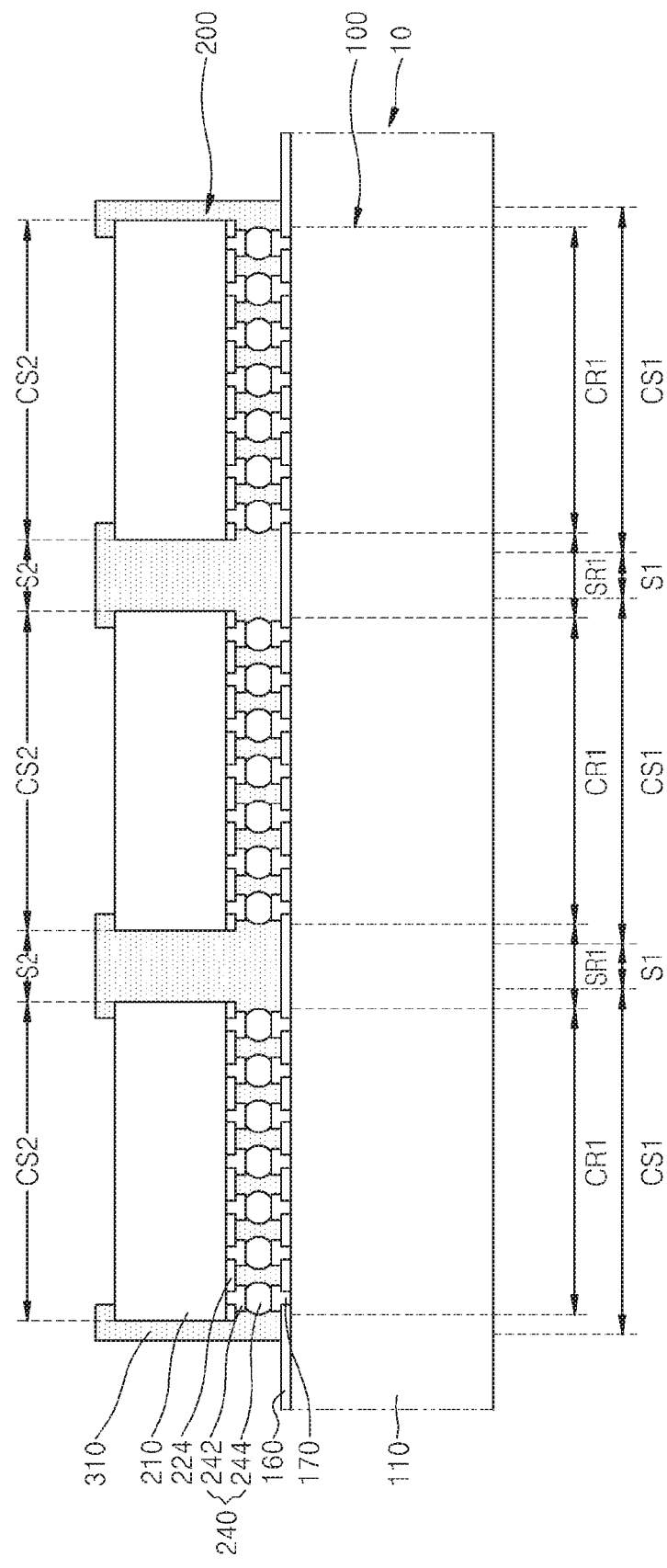

Referring to FIG. 5, an underfill 310 that fills a connected portion between the first chip 100 and the second chip 200 is formed. An underfill process may be easily performed even when a size of the scribe line area, that is, a width of the scribe line area, is small, on a highly integrated wafer by reducing a size of the second chip 200 that is stacked on the first chip 100. The underfill 310 may fill the connected portion between the first chip 100 and the second chip 200, that is, a connected portion between the first connection member 170 of the first chip 100 and the second connection member 240 of the second chip 200. The underfill 310 may be formed of an underfill resin such as an epoxy resin, and may include a silica filler or flux. The underfill 310 and a molding member that is to be subsequently formed may be formed of the same material or different materials.

As shown, the underfill 310 may seal the connected portion between the first chip 100 and the second chip 200 and may partially seal a side surface and the second back surface B2 of the second chip 200. That is, the underfill 310 may fill only the connected portion between the first chip 100 and the second chip 200, or the underfill 310 may be formed to surround the side surface of the second chip 200 while filling the connected portion between the first chip 100 and the second chip 200. The underfill 310 may be formed to overlap with another underfill 310 adjacent thereto. Once the underfill 310 surrounds the side surface of the second chip 200, a side surface of the underfill 310 may be exposed after a semiconductor package is completed. The underfill process may be omitted when a molded underfill (MUF) process is used.

Figure 6:
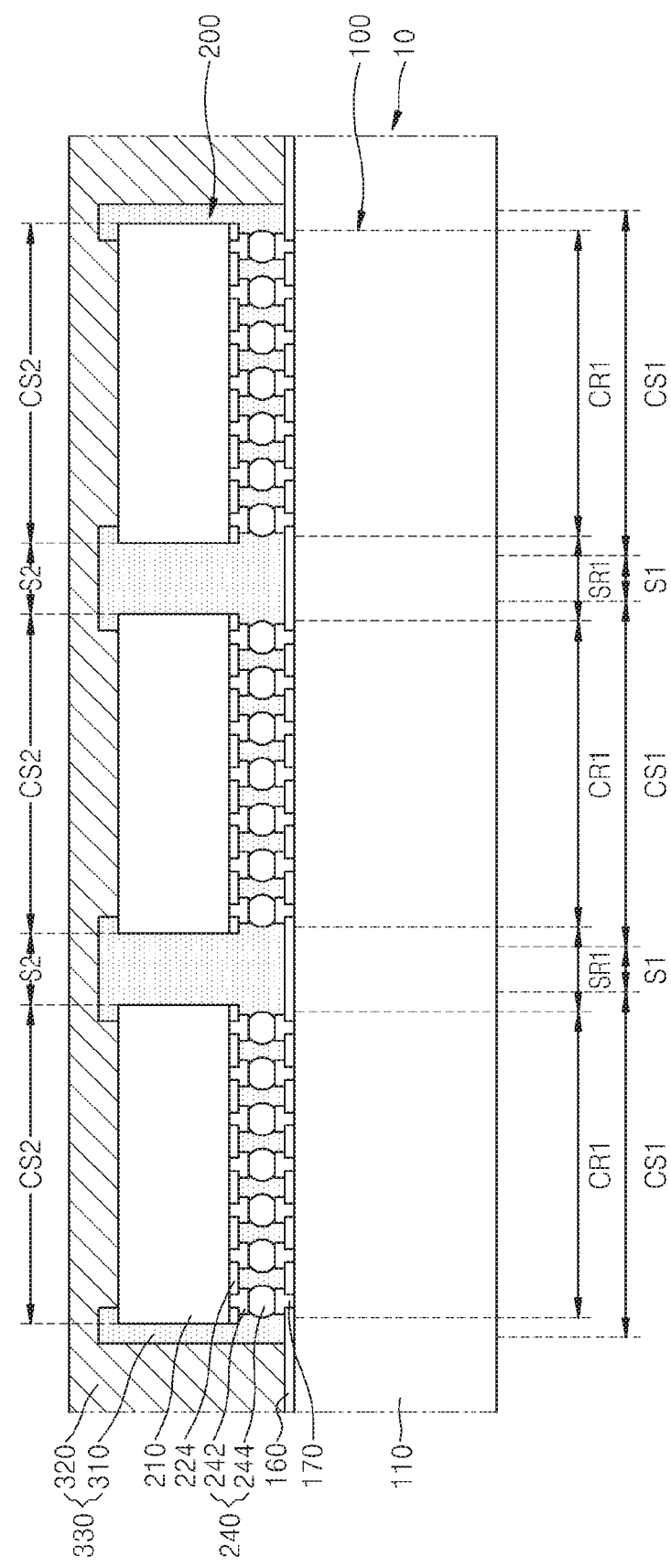
Figure 7:
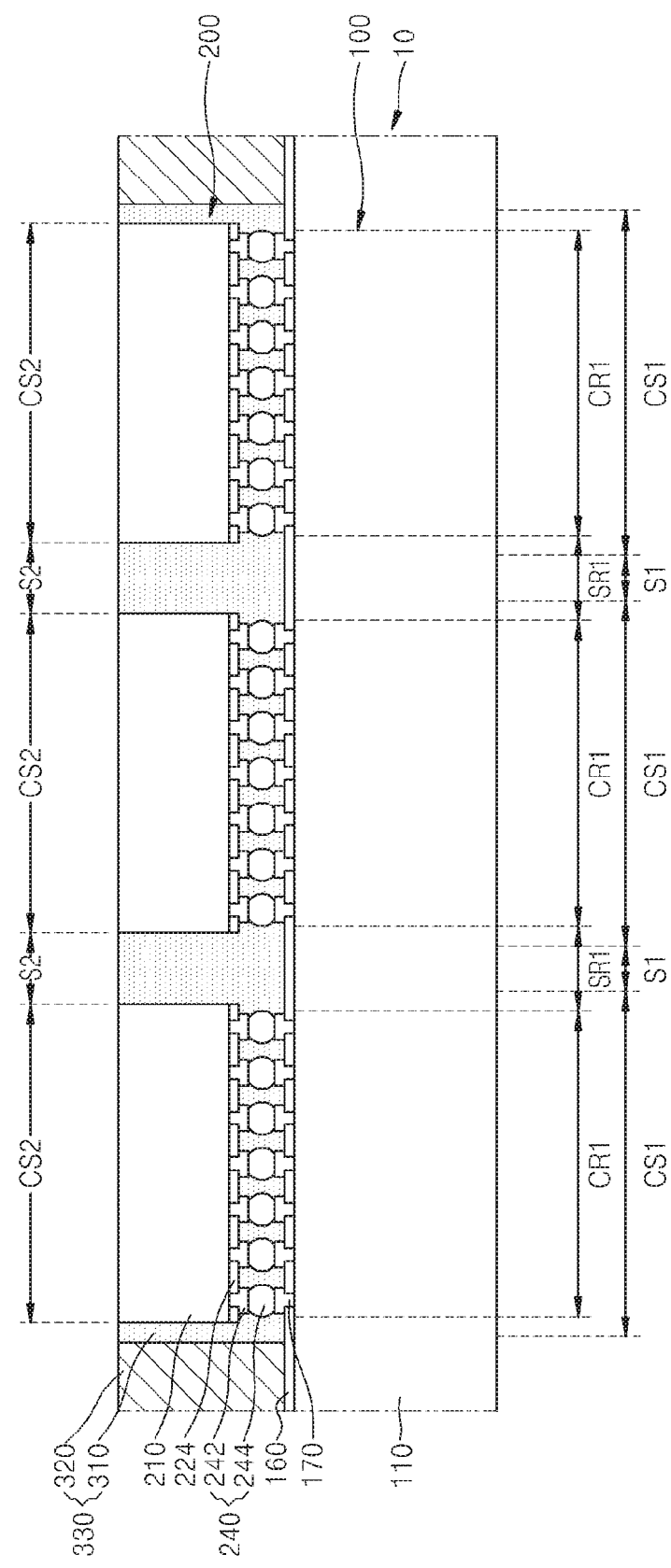

Referring to FIGS. 6 and 7, a molding member 320 that molds the second chip 200 adhered to the base wafer 10 is formed as shown in FIG. 6. The molding member 320 may be formed of a polymer such as a resin. For example, the molding member 320 may be formed of an epoxy molding compound (EMC). Accordingly, the first chip 100 and the second chip 200 are sealed by using a first sealing member 330 including the underfill 310 and the molding member 320. The first sealing member 330 may seal side surfaces and the second back surface B2 of the second chip 200. Due to the underfill 310, the molding member 320 may seal a side surface of the underfill 310.

As shown in FIG. 7, a top surface (second back surface B2) of the second chip 200 may be exposed by grinding a top surface of the first sealing member 330. The top surface of the first sealing member 330 may be ground to have the same height as that of the top surface (second back surface B2) of the second chip 200. The top surface of the second chip 200 may be a back surface of a semiconductor substrate (that is, a silicon substrate) on which an integrated circuit layer is not formed, and thus the back surface of the silicon substrate may be exposed to the outside.

Figure 8:
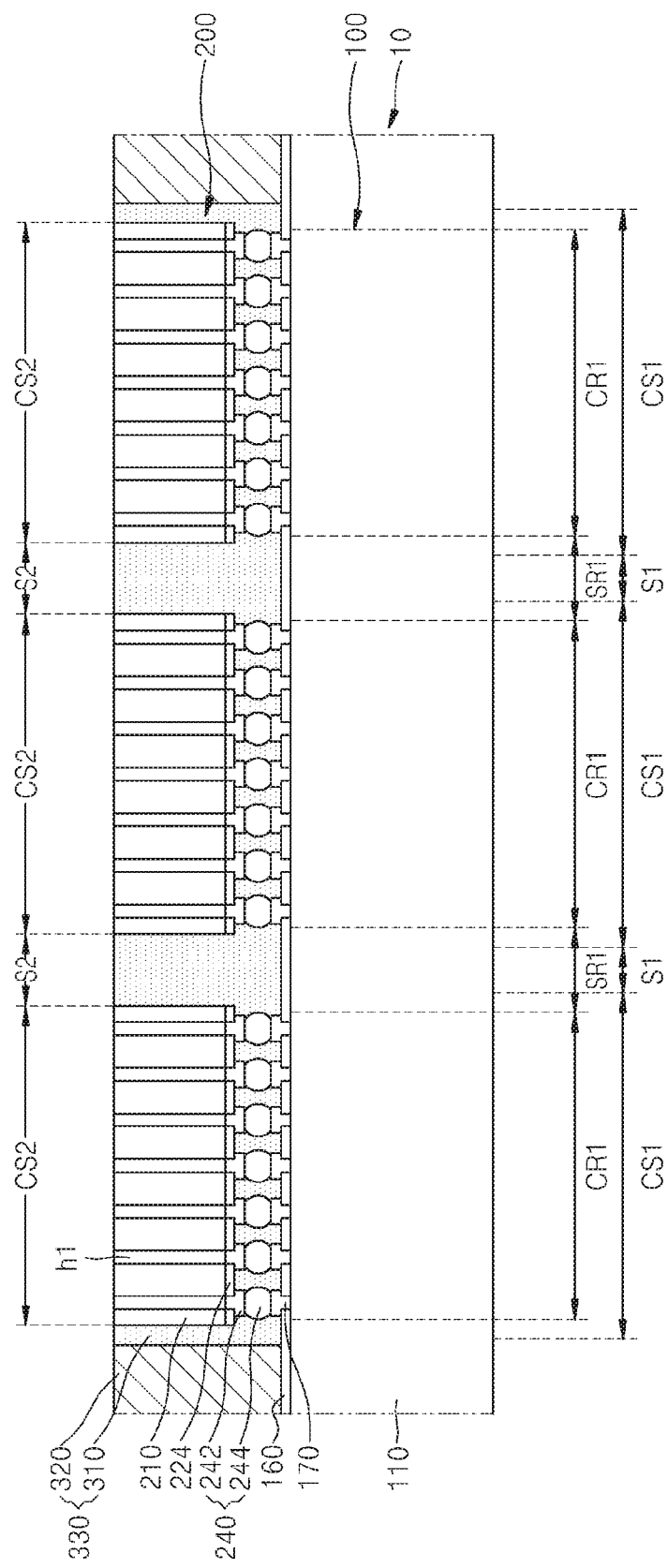
Figure 9:
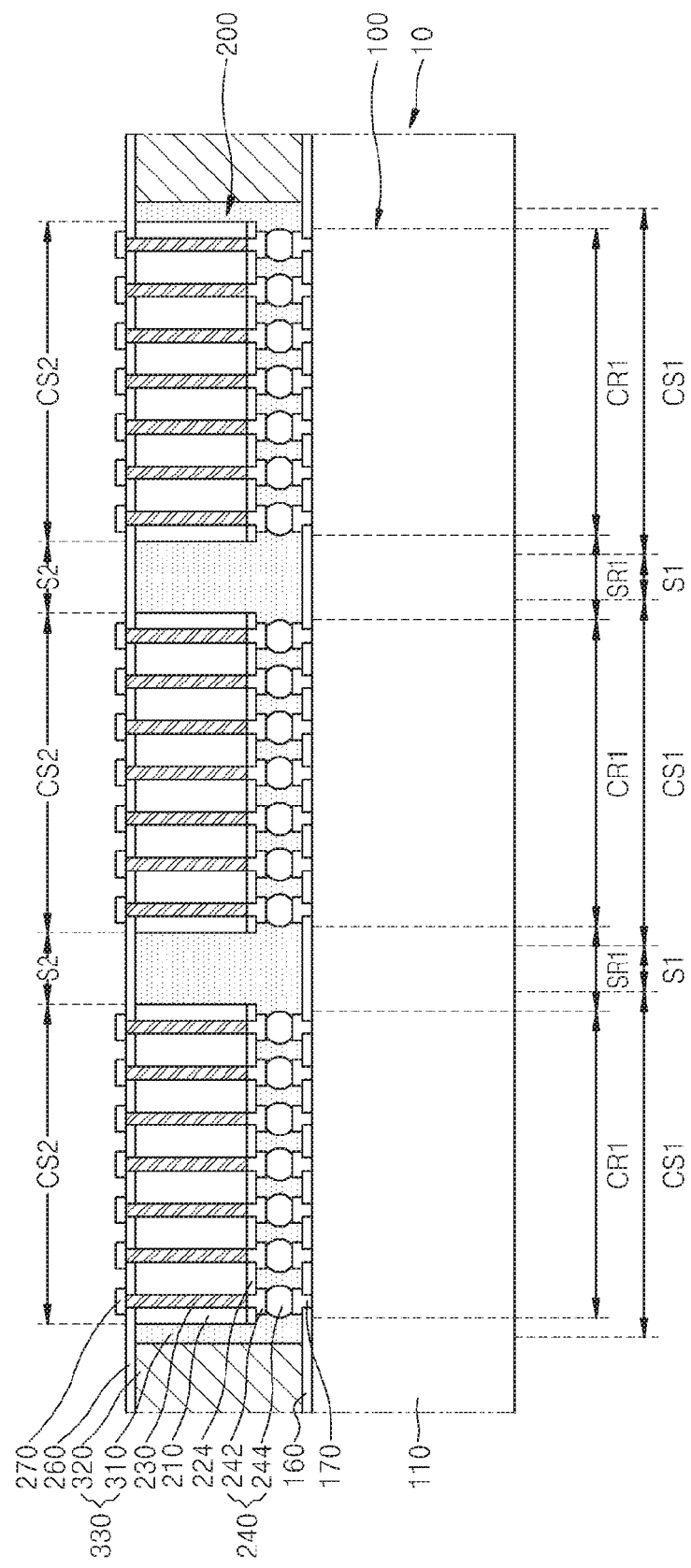

Referring to FIGS. 8 through 10, a trench h1 (a via hole) is formed in the second body layer 210 of the second chip 200 as shown in FIG. 8. The trench h1 may be formed to pass through the second body layer 210. The trench h1 may be formed to extend from the second back surface B2 to the second front surface F2 of the second body layer 210. The trench h1 may be formed to extend from the second back surface B2 to the second front surface F2 of the second chip 200. The trench h1 may be formed to expose the second connection member 240.

As shown in FIG. 9, a first through-silicon via (TSV) 230 that is formed in the trench h1 is formed. The first TSV 230 may be electrically connected to the second connection member 240. A protective layer 260 and a bump pad 270 constituting a third connection member 274 (see FIG. 11) are formed on the second back surface B2 of the second chip 200, that is, on the second back surface B2 of the second body layer 210. The bump pad 270 may be formed of a conductive material. A UBM may be formed on the bump pad 270. The bump pad 270 and the first connection member 170 may be formed of the same material or different materials, and may be formed by using the same method or different methods.

A process of forming the first TSV 230 and the third connection member 274 will now be explained with reference to FIGS. 10A through 10D.

Figure 10A:
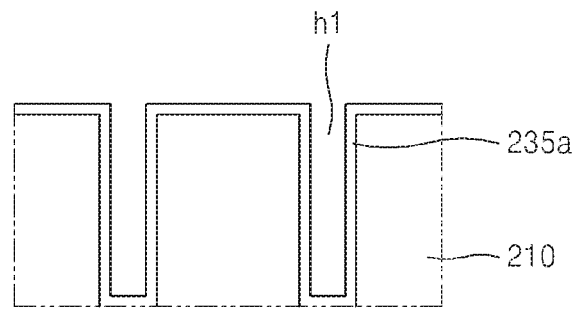

As shown in FIG. 10A, a spacer insulating layer 235a is formed on a surface of the second body layer 210 and an inner wall of the trench h1 (via hole). The spacer insulating layer 235a functions to insulate the second body layer 210 from the first TSV 230 that is to be formed in the trench h1.

Figure 10B:
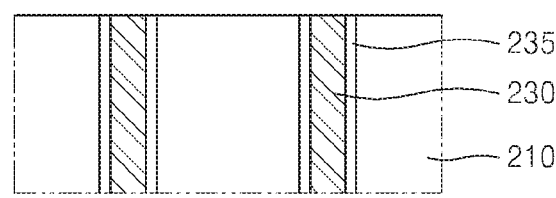

As shown in FIG. 10B, the first TSV 230 is formed in the trench h1. The first TSV 230 may be formed by using any of various manufacturing processes. For example, the spacer insulating layer 235a is formed on the inner wall of the trench h1 and the second body layer 210. Next, the trench h1 is buried, and a conductive layer is formed on the spacer insulating layer 235a and then is planarized. Accordingly, the first TSV 230, and a patterned spacer insulating layer 235 for insulating the second body layer 210 from the first TSV 230 are formed.

Figure 10C:
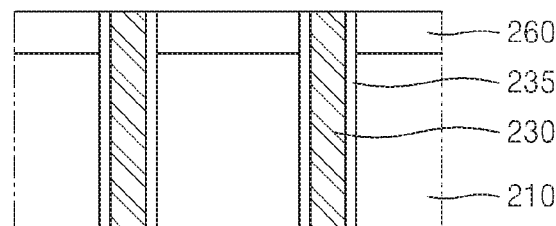
Figure 10D:
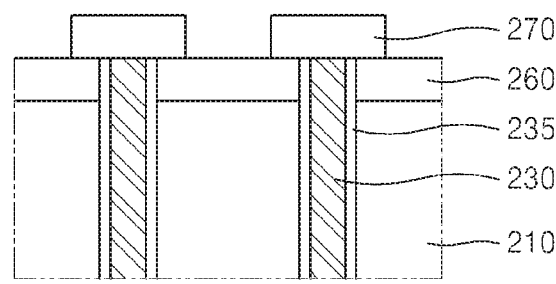

As shown in FIG. 10C, the second body layer 210 is recessed, and then the protective layer 260 is formed on both side walls of the first TSV 230 and the recessed second body layer 210. The protective layer 260 functions to protect the second body layer 210. The protective layer 260 functions to insulate the first TSVs 230 from each other. As shown in FIG. 10D, the bump pad 270 is formed over the first TSV 230.

Figure 11:
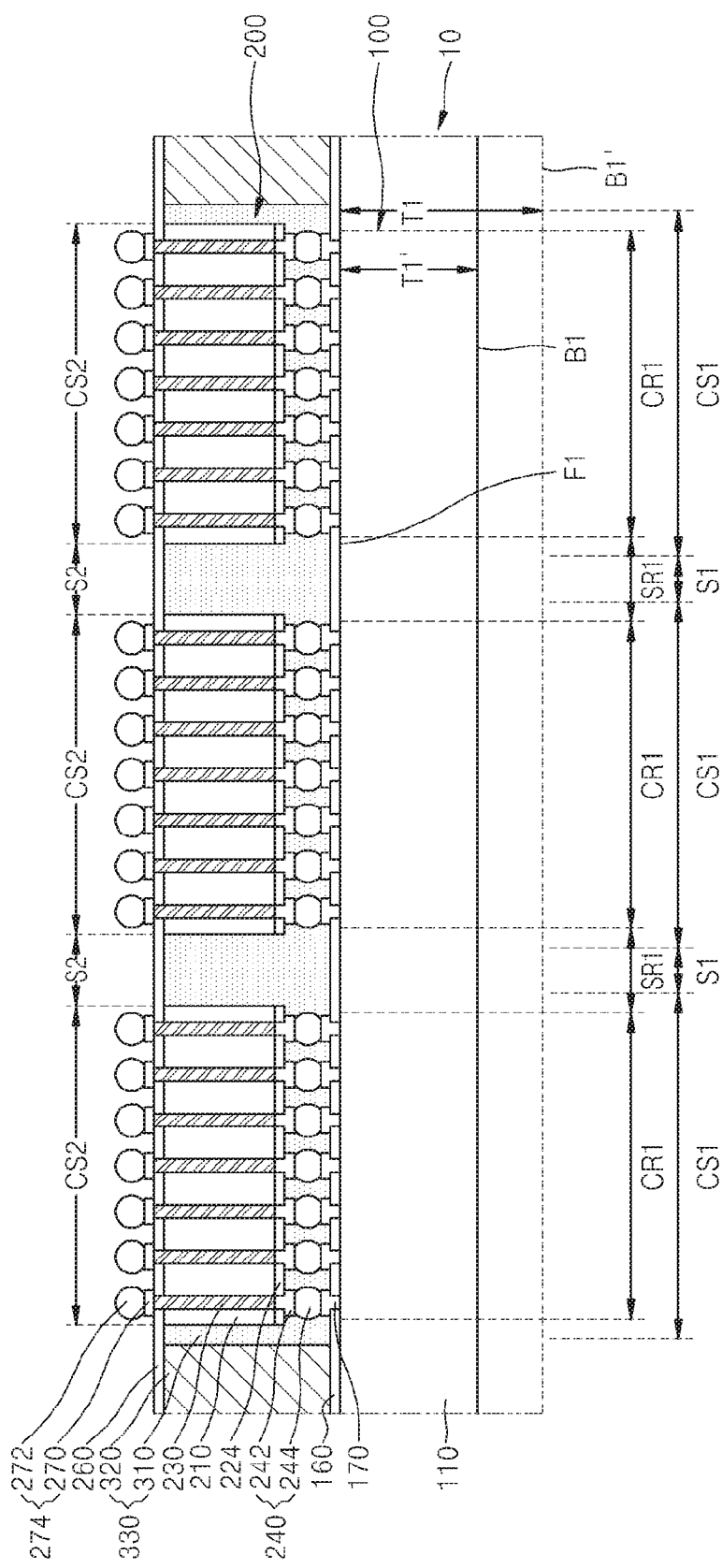

Referring to FIG. 11, a bump 272 is formed on the bump pad 270 of the second chip 200. Accordingly, the third connection member 274 including the bump pad 270 and the bump 272 is formed. The bump 272 may be formed of a conductive material such as Cu, Al, Au, or solder. However, the bump 272 is not limited to the above materials. A third chip may be further stacked on the third connection member 274 as described below.

A thickness of the first chip 100 is reduced by polishing a back surface B1' of the first chip 100. Accordingly, a final thickness of the first chip 100 may become T1'. The final thickness T1' of the first chip 100 may be adjusted to be greater than the thickness T2 of the second chip 200.

Figure 12:
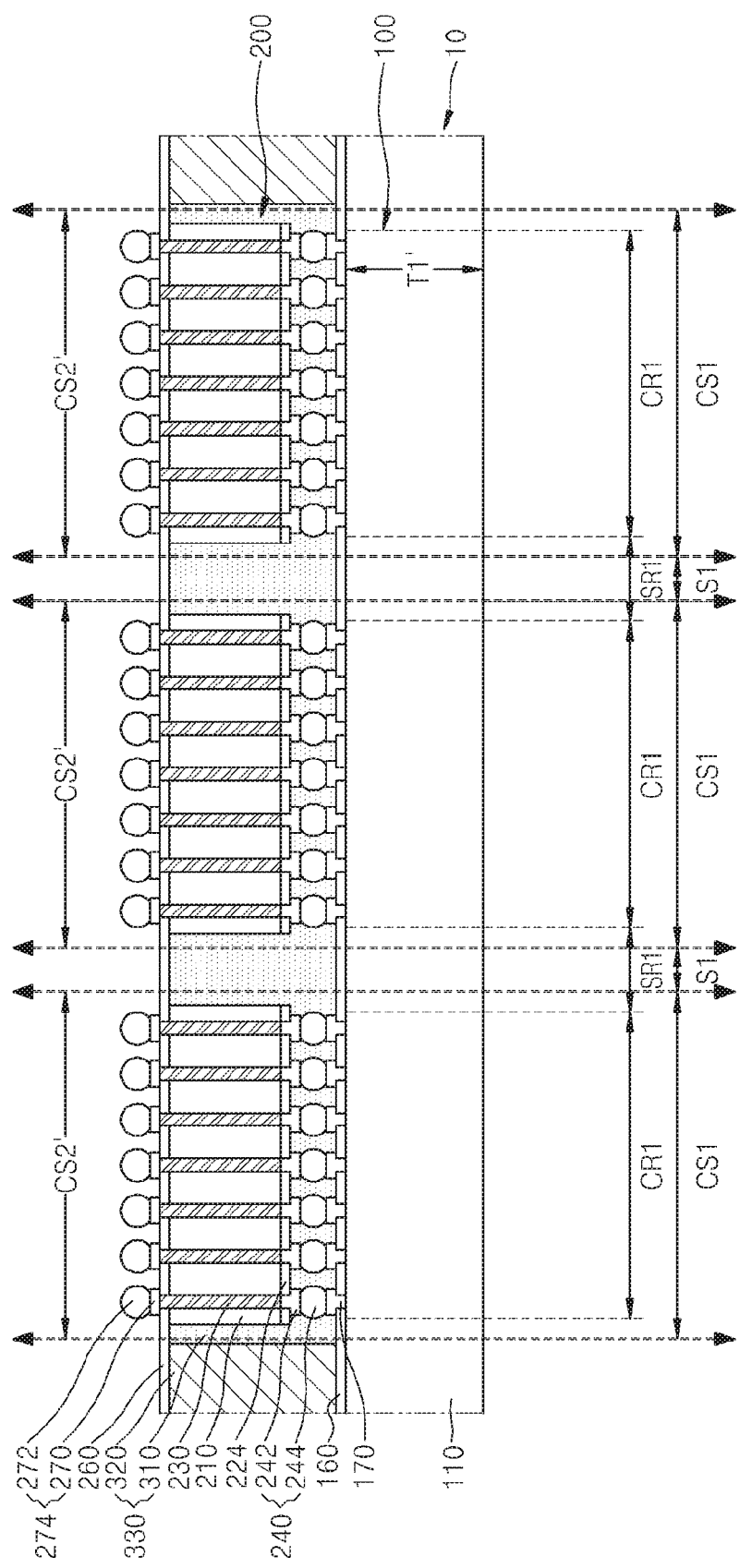
Figure 13:
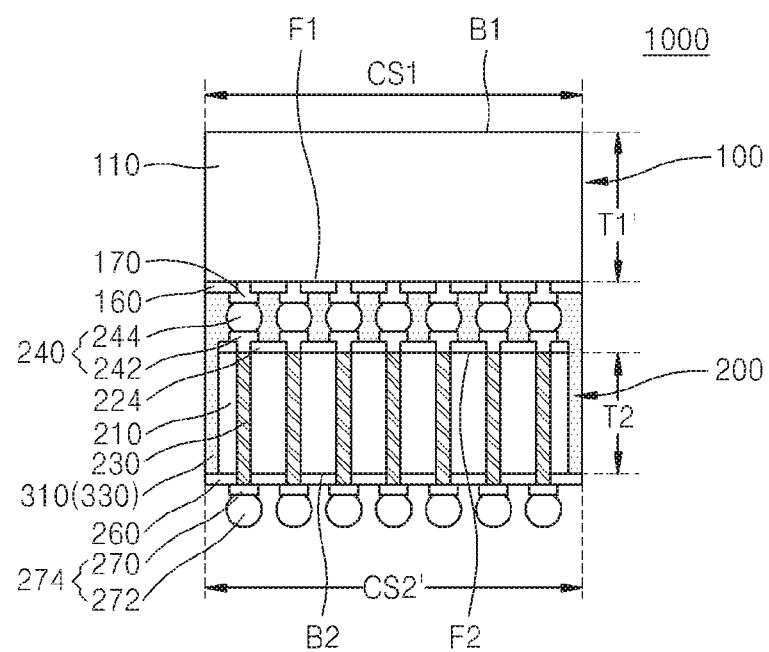

Referring to FIGS. 12 and 13, FIG. 13 illustrates that the first chip 100 is on top. The base wafer 10 and the first sealing member 330 are sawn into chip-stacked semiconductor packages 1000. In FIG. 12, the base wafer 10 and the first sealing member 330 are sawn based on the size CS1 of the first chip 100. Since the first sealing member 330 between the second chips 200 and the base wafer 10 are sawn based on the size Si that is a width of the blade and is less than the size S2, the sawing may be performed very easily. In this case, a size of the second chip 200 including the first sealing member 330, that is, the underfill 310, may be slightly increased from CS2 to CS2'.

Once each chip-stacked semiconductor package 1000 is formed by using the above sawing process, both side surfaces of the first chip 100 are exposed. In this case, when the chip-stacked semiconductor package 1000 is mounted on a board substrate and is molded again, an additional sealing member may be well coupled and attached to the side surfaces of the first chip 100.

According to the method of manufacturing the chip-stacked semiconductor package of an example embodiment, the second chips 200 are mounted on the base wafer 10 including the plurality of first chips 100. In this case, the size CS2 of each of the second chips 200 may be less than or equal to that of each of the first chips 100 by increasing the size S2 that is a width of the blade when a wafer including the second chip 200 is sawn and the second chip 200 is prepared.

Accordingly, even when a size of a scribe line area, for example, a width of a scribe line area, on a highly integrated wafer is small, an underfill process may be easily performed. Also, the chip-stacked semiconductor package 1000 may be manufactured by more easily sawing the base wafer 10 and the first sealing member 330.

According to the method of manufacturing the chip-stacked semiconductor package of an example embodiment, when the second chip 200 is stacked on the base wafer 10 including the first chip 100 and then each chip-stacked semiconductor package 1000 is formed by performing sawing, both side surfaces of the first chip 100 are exposed. In this case, when the chip-stacked semiconductor package 1000 is mounted on a board substrate and is molded again, an additional sealing member may be well coupled or attached to the side surfaces of the first chip 100.

A structure and characteristics of the chip-stacked semiconductor package 1000 manufactured by using the method of manufacturing the chip-stacked semiconductor package will now be briefly explained with reference to FIG. 13.

In detail, referring to FIG. 13 illustrating the first chip 100 that is on top, the chip-stacked semiconductor package 1000 may include the first chip 100, the second chip 200, and the first sealing member 330. The first chip 100 may include the first body layer 110, the passivation layer 160, and the first connection member 170. The first chip 100 may have the first front surface F1 and the first back surface B1 that is opposite to the first front surface F1. The first connection member 170 may be formed on the first front surface F1 such that the first connection member 170 and the second connection member 240 of the second chip 200 are arranged in a mirror-symmetric fashion with each other.

The second chip 200 may be disposed under the first chip 100. The second chip 200 may include the second body layer 210, the passivation layer 224, the first TSV 230, and the second connection member 240. The second chip 200 has the second front surface F2 and the second back surface B2 that is opposite to the second front surface F2. The second connection member 240 is disposed between the first front surface F1 and the second front surface F2 and is electrically connected to the first connection member 170 and the first TSV 230.

The protective layer 260 and the third connection member 274 may be formed under the second chip 200. The third connection member 274 may include the bump pad 270 and the bump 272, and the bump 272 is exposed to the outside. The third connection member 274 may be connected to an external member.

The first sealing member 330 fills a connected portion between the first chip 100 and the second chip 200, that is, a connected portion between the first connection member 170 of the first chip 100 and the second connection member 240 of the second chip 200. The first sealing member 330 may be formed to surround both side surfaces of the second chip 200. Accordingly, the first sealing member 330 that is formed on the both side surfaces of the second chip 200 and the first sealing member 330 that is formed on the connected portion between the first chip 100 and the second chip 200 may be formed of the same material.

The first sealing member 330 is not formed on the first back surface B1 of the first chip 100, and thus the first back surface B1 of the first chip 100 is exposed. No sealing member is formed on both side surfaces of the first chip 100, and thus the both side surfaces of the first chip 100 are exposed. Accordingly, when the chip-stacked semiconductor package 1000 is mounted on a main chip or a board substrate and is molded again as described below, an additional sealing member may be well coupled and attached to a top surface and the side surfaces of the first chip 100.

Both end portions of the first sealing member 330 that are formed to surround both side surfaces of the second chip 200 are vertically aligned with edges of the first chip 100. In other words, the size CS2' of the second chip 200 including the first sealing member 330 may be equal to the size CS1 of the first chip 100.

The final thickness T1' of the first chip 100 may be greater than the thickness T2 of the second chip 200. Accordingly, the risk of damage to the first chip 100 may be reduced and heat dissipation efficiency may be improved. Also, since a side surface and the first back surface B1 of the first chip 100 are exposed, heat dissipation efficiency of the chip-stacked semiconductor package 1000 may be improved.

FIGS. 14 and 15 are cross-sectional views for explaining a method of manufacturing the second chip 200, according to an example embodiment of inventive concepts. FIGS. 14 and 15 are cross-sectional views for explaining the method of manufacturing the second chips 200 of FIG. 3.

Referring to FIG. 14, a wafer 20 including the plurality of second chips 200 is prepared. The wafer 200 may be prepared by being adhered to a support substrate 840 by using an adhesive member 860. In the wafer 20, a size of a chip area is denoted by CR1, like in the first chip 100. The size CR1 of the chip area may be a width or a length. A size of a scribe line area between the second chips 200 is denoted by SR1, like in the first chip 100. The size SR1 of the scribe line area may be a width or a length.

Each of the second chips 200 may include the second body layer 210, the passivation layer 224, and the second connection member 240. The second chip 200 may have the second front surface F2 and the second back surface B2 that is opposite to the second front surface F2. The second front surface F2 may be an active surface on which device constituent elements are formed, and the second back surface B2 may be a non-active surface as described above.

The support substrate 840 may be formed of silicon, germanium, silicon-germanium, gallium-arsenic (GaAs), glass, plastic, or ceramic. The adhesive member 860 may be a non-conductive film (NCF), an anisotropic conductive film (ACF), an instant adhesive, a thermosetting adhesive, a laser-hardening adhesive, an ultrasonic hardening adhesive, or a non-conductive paste (NCP). The wafer 20 may be adhered such that the second connection member 240 faces the support substrate 840. That is, the wafer 20 may be adhered such that the second front surface F2 faces the support substrate 840.

Referring to FIG. 15, the wafer 20 is sawn along the scribe line area into the second chips 200. A size of each of the second chips 200 completed by the sawing of the wafer 20 may be denoted by CS2. The size CS1 of each of the second chips 200 may be a width or a length. A size sawn with a blade in the scribe line area is denoted by S2. The size S2 sawn with the blade may be a width or a length. The size S2 sawn with the blade may be a width of the blade.

Figure 16:
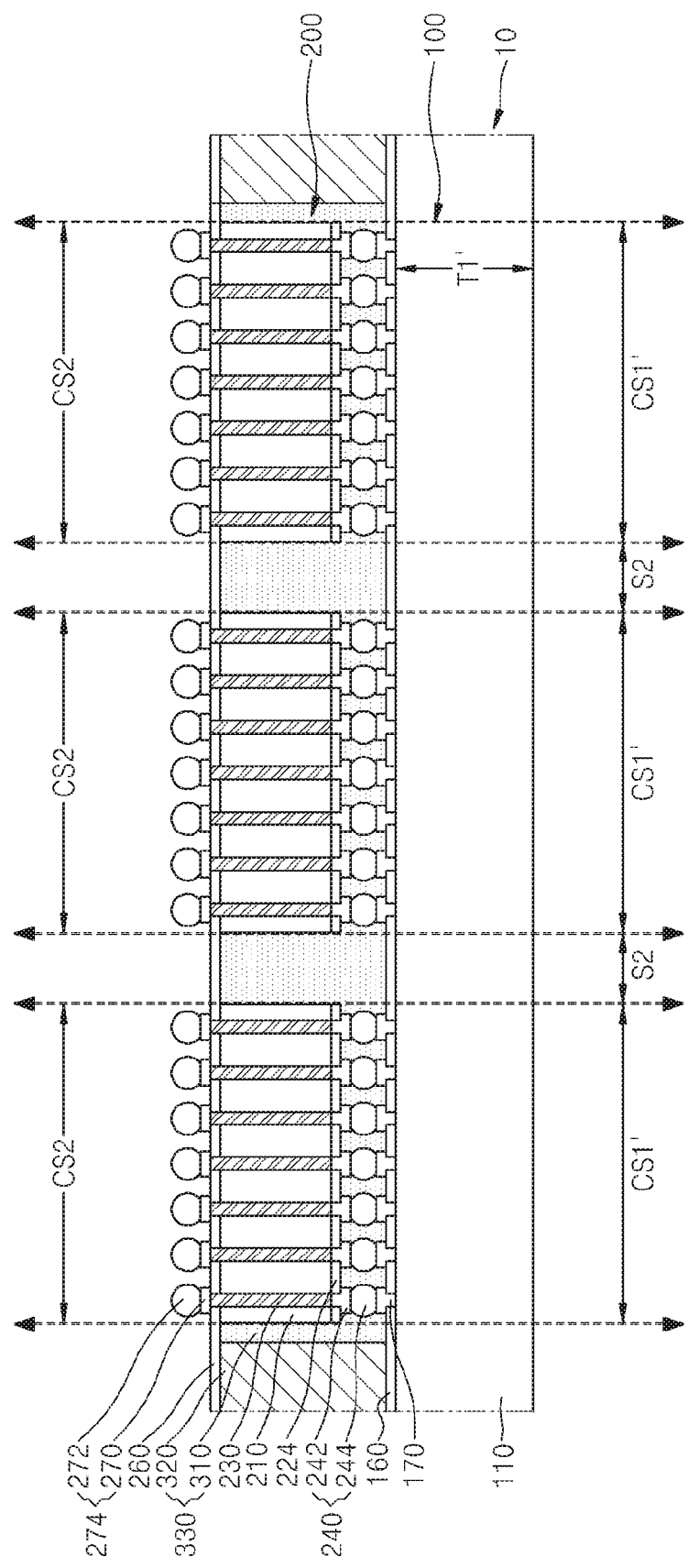
FIGS. 16 and 17 are cross-sectional views for explaining a method of manufacturing a chip-stacked semiconductor package according to another example embodiment of inventive concepts and the chip-stacked semiconductor package manufactured by using the method.
Figure 17:
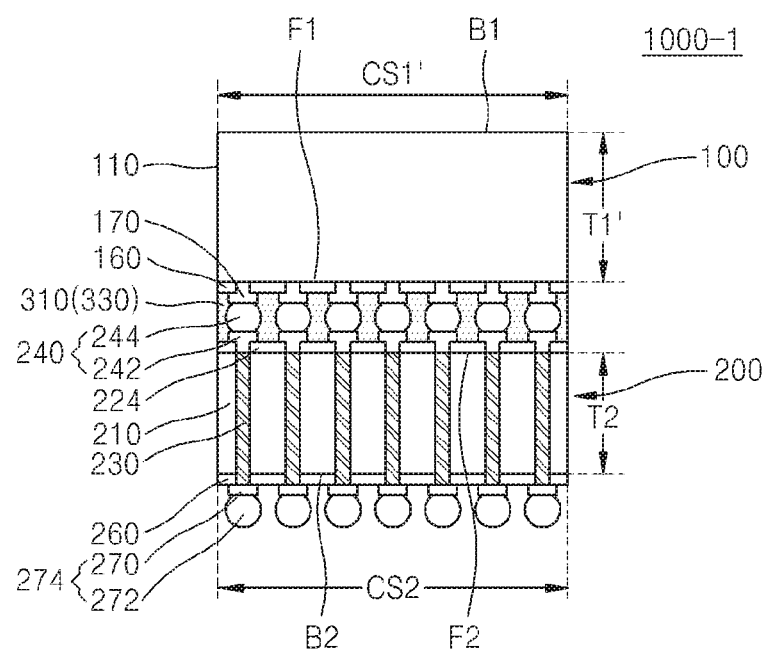

FIGS. 16 and 17 are cross-sectional views for explaining a method of manufacturing a chip-stacked semiconductor package according to another example embodiment of inventive concepts and the chip-stacked semiconductor package manufactured by using the method.

In detail, when the example embodiment of FIGS. 16 and 17 is compared with the example embodiment of FIGS. 1 through 13, the example embodiment of FIGS. 16 and 17 and the example embodiment of FIGS. 1 through 13 are the same except a process of sawing the base wafer 10 and the first sealing member 330. In FIGS. 16 and 17, the same description as that already made with reference to FIGS. 1 through 13 will be omitted or briefly given.

A manufacturing process illustrated in FIGS. 1 through 11 is performed. In this case, the plurality of second chips 200 that are sealed by the first sealing member 330 are disposed on the base wafer 10 including the first chips 100.

Referring to FIG. 16, the base wafer 10 and the first sealing member 330 are sawn based on the width CS2 of each of the second chips 200. The size S2 may be a width of a blade as stated above, and the base wafer 10 may be easily sawn based on the size S2 that is a width of the blade. In this case, a size of each of the first chips 100 is slightly reduced from CS1 to CS1'.

Referring to FIG. 17, when each chip-stacked semiconductor package 1000-1 is formed by using a sawing process, both side surfaces of the first chip 100 and the second chip 200 are exposed. According to the method of manufacturing the chip-stacked semiconductor package of FIGS. 16 and 17, when the second chip 200 is prepared by sawing the wafer including the second chip 200, a size of the second chip 200 may be less than or equal to that of the first chip 100 by increasing the size S2 that is a width of the blade, like in FIGS. 1 through 13. Accordingly, the chip-stacked semiconductor package 1000-1 may be manufactured by more easily sawing the base wafer 10 and the first sealing member 330.

According to the method of manufacturing the chip-stacked semiconductor package of FIGS. 16 and 17, a top surface and both side surfaces of the first chip 100 are exposed. In addition, both side surfaces of the second chip 200 are also exposed. In this case, when the chip-stacked semiconductor package 1000-1 is mounted on a board substrate and is molded again, an additional sealing member may be well coupled and attached to the side surfaces of the first chip 100 and the second chip 200.

A structure and characteristics of the chip-stacked semiconductor package 1000-1 manufactured by using the method of manufacturing the chip-stacked semiconductor package will now be briefly explained with reference to FIG. 17.

In detail, the chip-stacked semiconductor package 1000-1 of FIG. 17 is the same as the chip-stacked semiconductor package 1000 of FIG. 13 except that both side surfaces of the second chip 200 are exposed.

Although the first sealing member 330 may fill a connected portion between the first chip 100 and the second chip 200, that is, a connected portion between the first connection member 170 of the first chip 100 and the second connection member 240 of the second chip 200, the first sealing member 330 is not formed on both side surfaces of the second chip 200. Also, the first sealing member 330 is not formed on both side surfaces of the first chip 100, and thus the both side surfaces of the first chip 100 are exposed.

Accordingly, when the chip-stacked semiconductor package 1000-1 is mounted on a board substrate and is molded again, an additional sealing member may be well coupled and attached to the front back surface b 1 or the side surfaces of the first chip 100 or the side surfaces of the second chip 200. Both end portions of the second chip 200 are vertically aligned with edges of the first chip 100. In other words, the size CS2 of the second chip 200 is equal to the size CS1 of the first chip 100.

FIGS. 18 through 23 are cross-sectional views for explaining a method of manufacturing a chip-stacked semiconductor package according to another example embodiment of inventive concepts and the chip-stacked semiconductor package manufactured by using the method.

In detail, when the embodiment of FIGS. 18 through 23 is compared with the embodiment of FIGS. 1 through 13, the embodiment of FIGS. 18 through 23 and the embodiment of FIGS. 1 through 13 are the same except that a chip-stacked semiconductor package 1000-2 is formed by further stacking a third chip 200-1 on the second chip 200. Although one third chip 200-1 is stacked in FIGS. 18 through 23 for convenience of explanation, example embodiments are not limited thereto, and two or more third chips 200-1 may be stacked.

First, a manufacturing process of FIGS. 1 through 9 is performed. In this case, the plurality of second chips 200 that are sealed by the first sealing member 330 are disposed on the base wafer 10 including the first chips 100, and the bump pad 270 of the third connection member 274 is formed on the second back surface B2 of each of the second chips 200.

Figure 18:
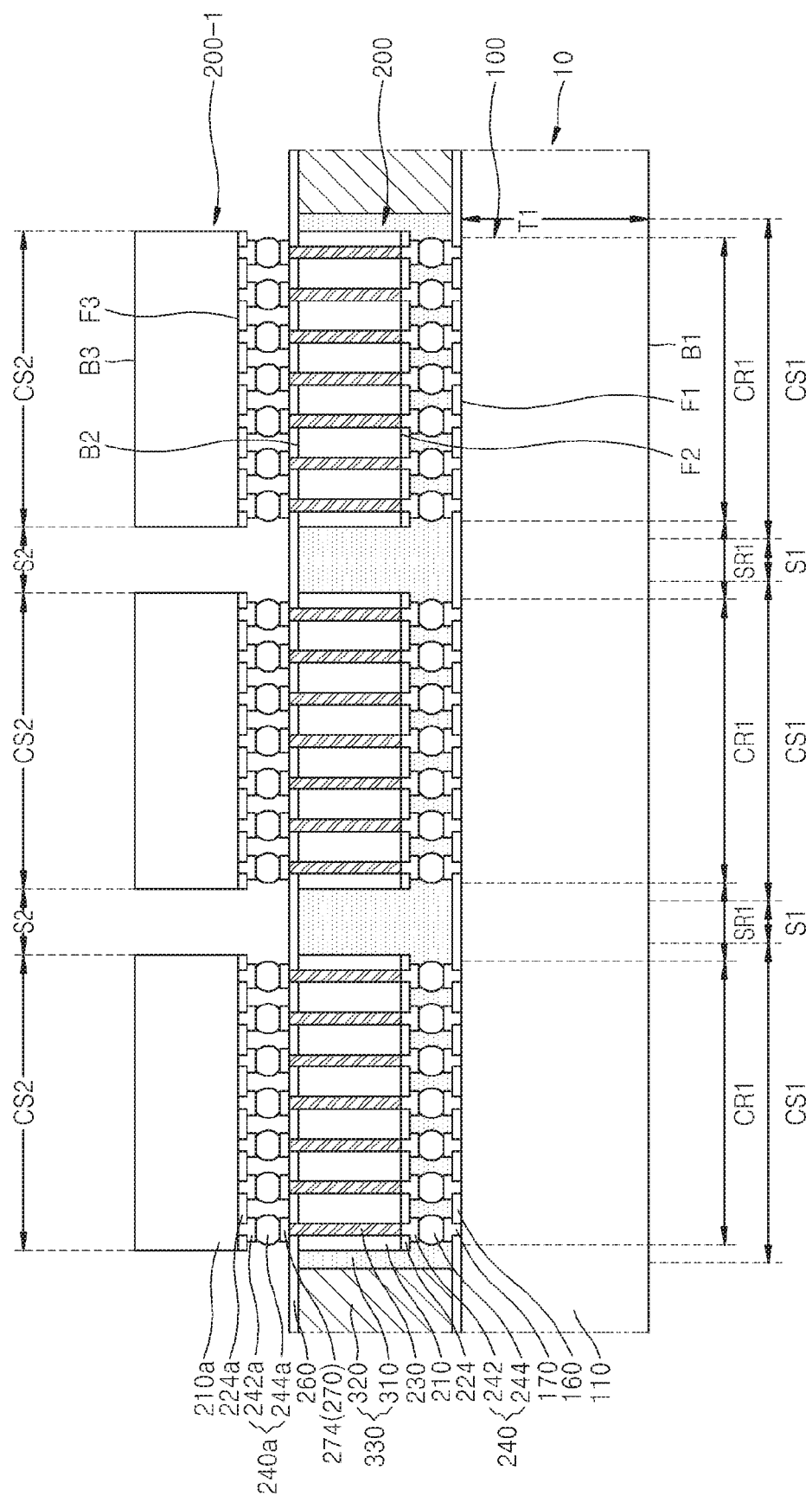
FIGS. 18 through 23 are cross-sectional views for explaining a method of manufacturing a chip-stacked semiconductor package according to another example embodiment of inventive concepts and the chip-stacked semiconductor package manufactured by using the method.

Referring to FIG. 18, the third chip 200-1 is prepared. The third chip 200-1 may have the same structure as that of the second chip 200 of FIGS. 14 and 15, and may be manufactured by using the same method as that used to manufacture the second chip 200 of FIGS. 14 and 15. The third chip 200-1 may have a third front surface F3 and a third back surface B3 that is opposite to the third front surface F3. The third chip 200-1 may include a third body layer 210a, a passivation layer 224a, and a fourth connection member 240a. The third body layer 210a that corresponds to the second body layer 210 of the second chip 200 may include a silicon substrate, an integrated circuit layer, and an interlayer insulating layer.

The third body layer 210a may have the third front surface F3 and the third back surface B3 that is opposite to the third front surface F3. The third front surface F3 of the third body layer 210a may be an active surface on which the integrated circuit layer is formed. The third back surface B3 of the third body layer 210a may be a non-active surface on which device constituent elements are not formed. The passivation layer 224a may be formed under the third body layer 210a. The fourth connection member 240a may include a bump pad 242a and a bump 244a as described with reference to FIG. 3.

The third chip 200-1 is stacked on each of the second chips 200. That is, the third chip 200-1 is stacked on the second chip 200 such that the third front surface F3 of the third chip 200-1 faces the second back surface B2 of the second chip 200. The fourth connection member 240a is disposed between the second back surface B2 and the third front surface F3 and is electrically connected to the third connection member 274. The stacking may be performed by adhering the fourth connection member 240a to the third connection member 274 of the second chip 200 by using thermocompression. The fourth connection member 240a that is formed on the third front surface F3 may be connected to the third connection member 274 of the second chip 200.

When the fourth connection ember 240a of the third chip 200-1 is aligned with the second connection member 240 of the second chip 200, the third chip 200-1 may be stacked on the second chip 200. Accordingly, the third chip 200-1 and the second chip 200 may be of different types. Alternatively, the third chip 200-1 and the second chip 200 may be of the same type.

A size of the third chip 200-1 is denoted by CS2, like in the second chip 200. The size CS2 of the third chip 200-1 may be a width or a length. The size CS2 of the third chip 200-1 may be less than or equal to the size CS1 of the first chip 100.

S2 denotes a size sawn with a blade in a scribe line area of a wafer for third chip (not shown), may be a width or a length, and is greater than the size S1. The size S2 may be a width of the blade. Since the size CS2 of the third chip 200-1 is less than or equal to the size CS1 of the first chip 100 and the size S2 sawn with the blade is greater than the size S1, a subsequent underfill process and a subsequent sawing process may be easily performed.

Figure 19:
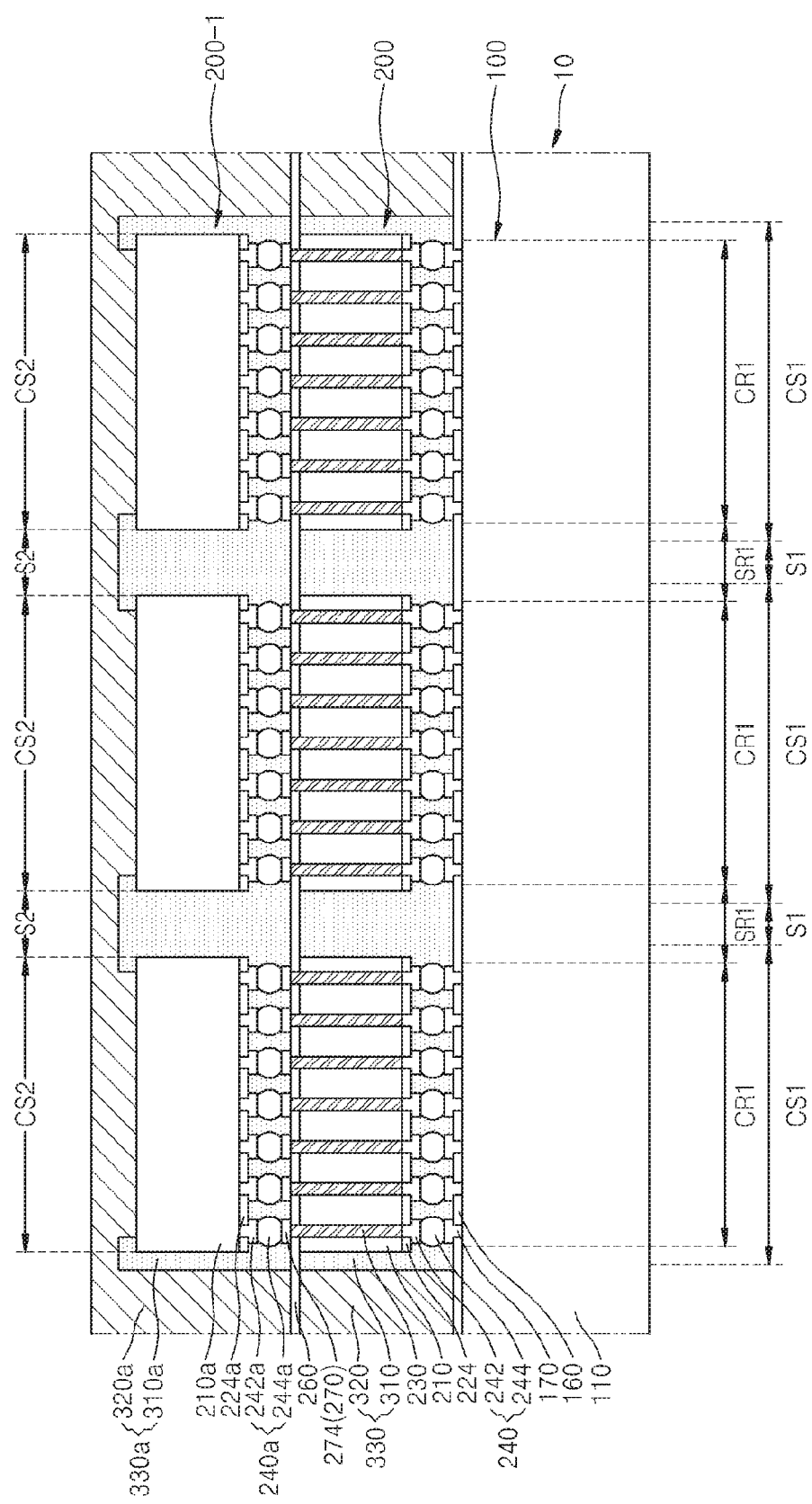

Referring to FIG. 19, an underfill 310a that fills a connected portion between the second chip 200 and the third chip 200-1 is formed. An underfill process may be easily performed even when a size of the scribe line area, for example, a width of the scribe line area, is small on a highly integrated wafer by reducing a size of the third chip 200-1 that is stacked on the second chip 200. The underfill 310a may fill the connected portion between the second chip 200 and the third chip 200-1, that is, a connected portion between the third connection member 274 of the second chip 200 and the fourth connection member 240a of the third chip 200-1.

The underfill 310a and the underfill 310 of FIG. 5 may be formed of the same material. The underfill 310a and a molding member that is to be subsequently formed may be formed of different materials or the same material. As shown in FIG. 19, the underfill 310a may seal the connected portion between the second chip 200 and the third chip 200-1 may partially seal a side surface of the third chip 200-1 and the second back surface B2 of the second chip 200. That is, the underfill 310a may fill only the connected portion between the second chip 200 and the third chip 2001, or the underfill 310a may be formed to surround the side surface of the third chip 200-1 while filling the connected portion between the second chip 200 and the third chip 200-1. Once the underfill 310a surrounds the side surface of the third chip 200-1, a side surface of the underfill 310a may be exposed after a semiconductor package is completed. The underfill process may be omitted when an MUF process is used.

Next, a molding member 320a that molds the third chip 200-1 is formed. The molding member 320a may be formed of a polymer such as a resin. For example, the molding member 320a may be formed of an EMC. Accordingly, the third chip 200-1 is sealed by using a second sealing member 330a including the underfill 310a and the molding member 320a. The second sealing member 330a may seal side surfaces and the third back surface B3 of the third chip 200-1. Due to the underfill 310a, the molding member 320a may seal a side surface of the underfill 310a.

Figure 20:
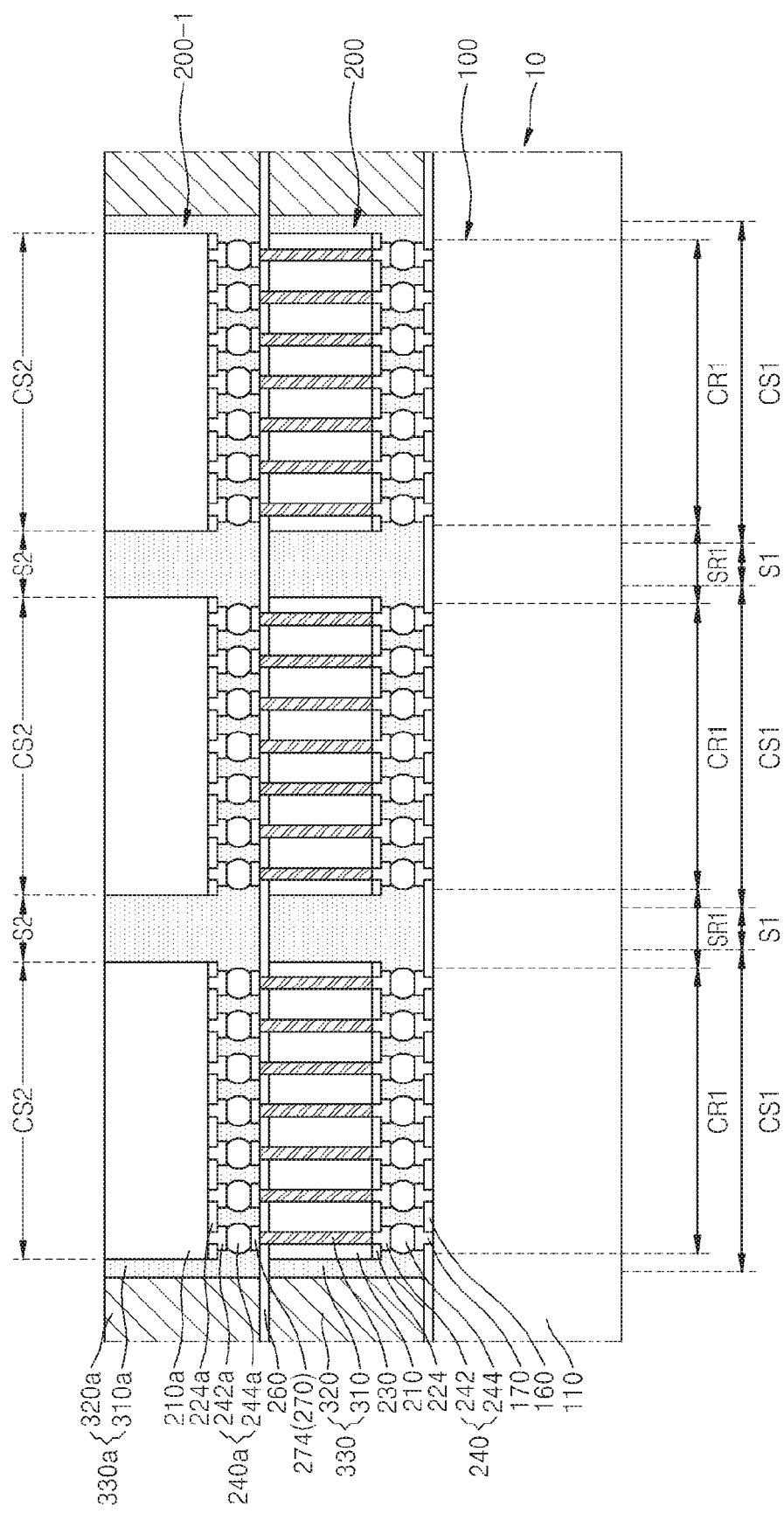

Referring to FIG. 20, a top surface (third back surface B3) of the third chip 200-1 may be exposed by grinding a top surface of the second sealing member 330a. The top surface of the second sealing member 330a may be ground to have same height as that of the top surface (third back surface B3) of the third chip 200-1. The top surface of the third 200-1 may be a back surface of a semiconductor substrate (that is, a silicon substrate) on which an integrated circuit layer is not formed, and thus the back surface of the silicon substrate may be exposed to the outside.

Figure 21:
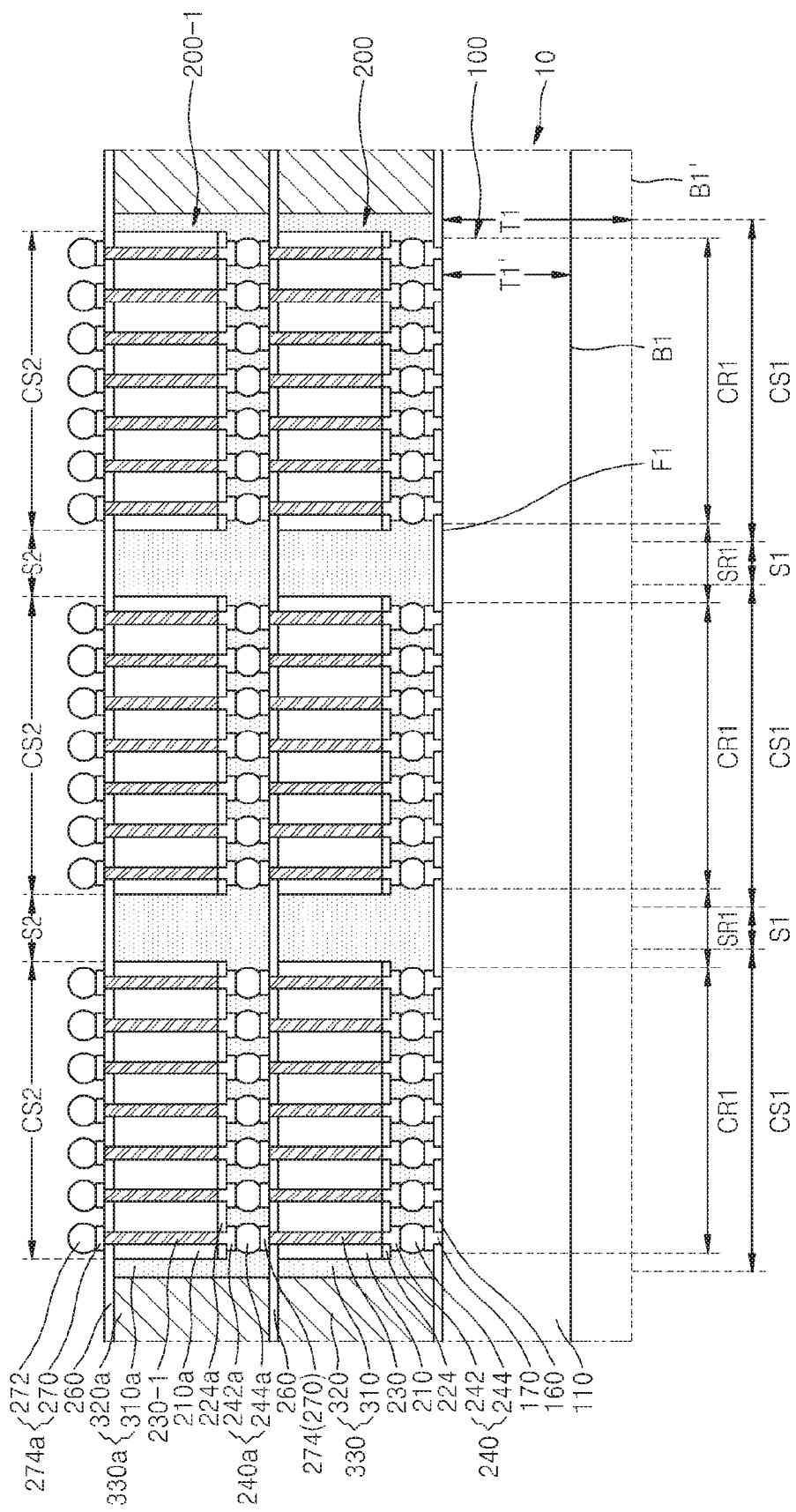

Referring to FIG. 21, a second TSV 230-1 is formed in the third body layer 210a of the third chip 200-1 by using the same method as that described with reference to FIGS. 8 through 10. The second TSV 230-1 may be electrically connected to the fourth connection member 240a.

Next, the protective layer 260 and a fifth connection member 274a are formed on the third back surface B3 of the third chip 200-1, that is, third back surface B3 of the third body layer 210a, by using the same method as that described with reference to FIGS. 10 and 11. The fifth connection member 274a may include the bump pad 270 and the bump 272. The fifth connection member 274a and the third connection member 274 may be formed of the same material.

A thickness of the first chip 100 is reduced by polishing the back surface B1' of the first chip 100. Accordingly, a final thickness of the first chip 100 may become T1'. The final thickness T1' of the first chip 100 may be adjusted to be greater than the thickness T2 of the second chip 200 and the third chip 200-1.

Figure 22:
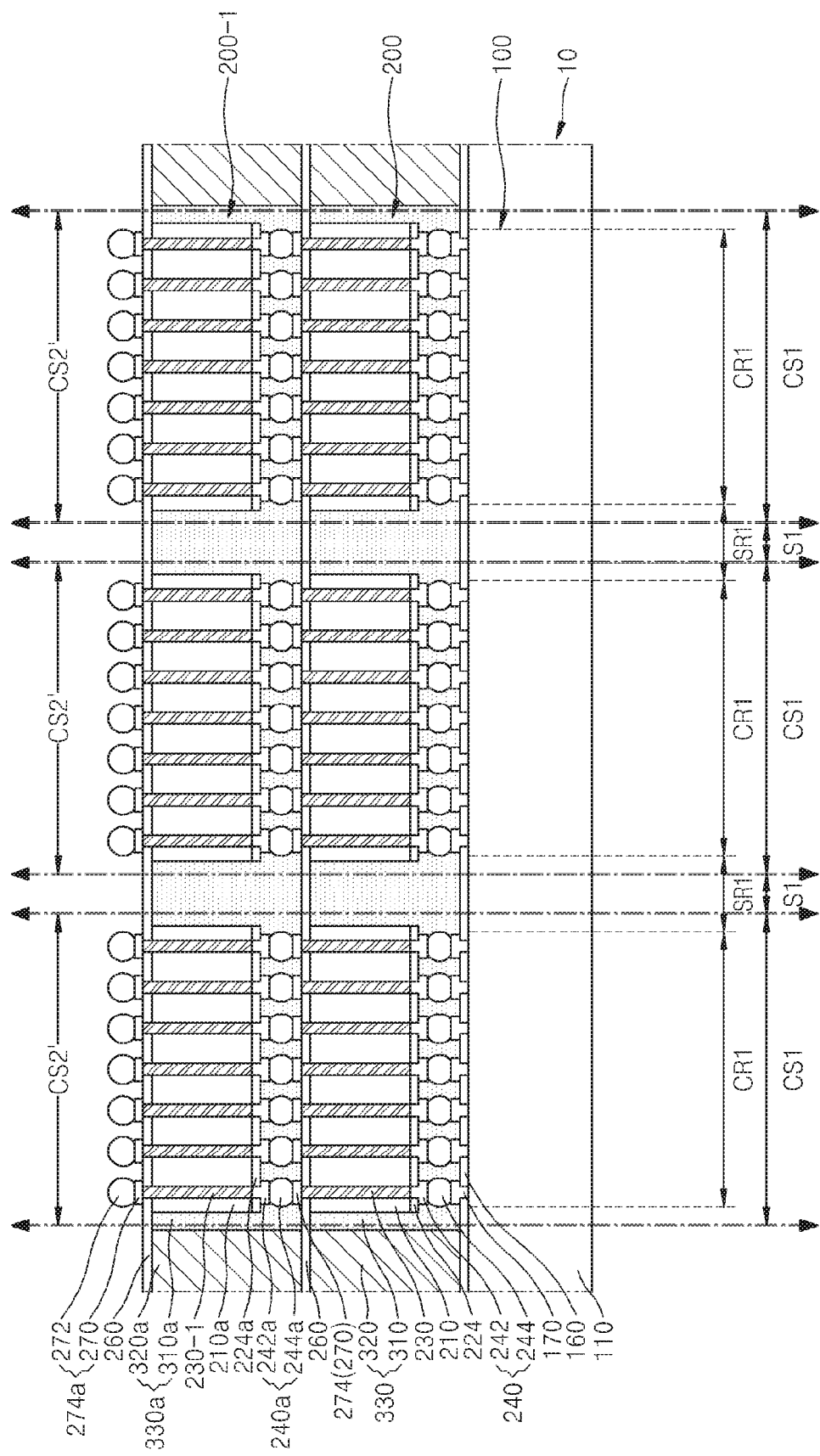
Figure 23:
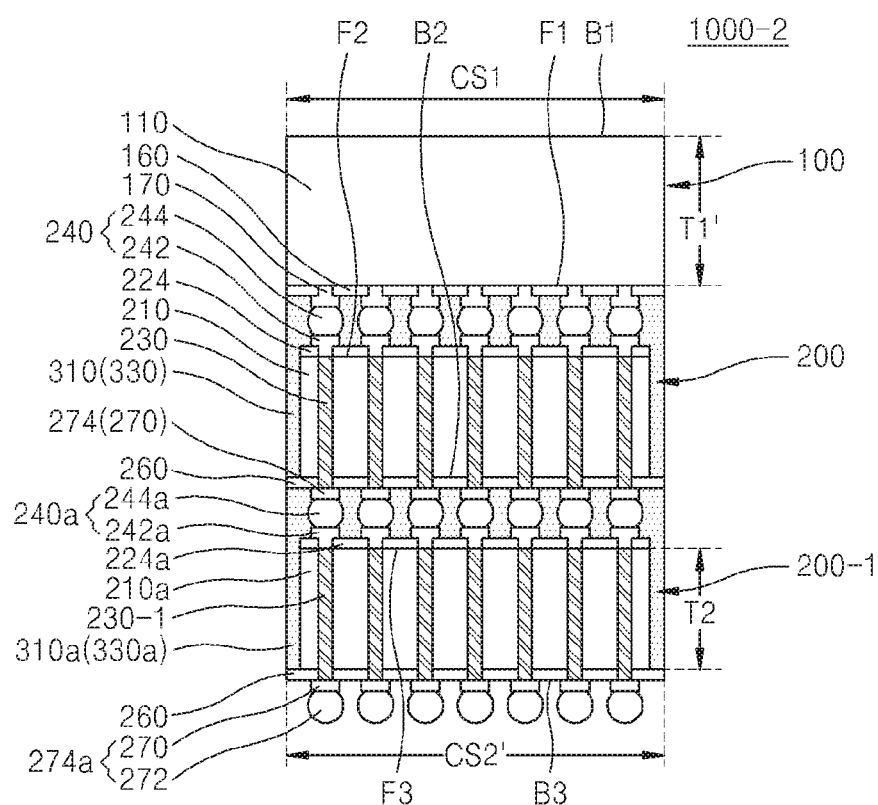

Referring to FIGS. 22 and 23, the base wafer 10 and the first and second sealing members 330 and 330a are sawn into the chip-stacked semiconductor packages 1000-2. In FIG. 22, the base wafer 10 and the first and second sealing members 330 and 330a are sawn based on the size CS1 of the first chip 100. Since the base wafer 10, and the first and second sealing members 330 and 330a between the second chips 200 and the third chips 200-1 are sawn based on the size S1 that is a width of the blade and is less than the size S2, the sawing may be performed very easily. In this case, a size of each of the second chip 200 and the third chip 200-1 respectively including the first and second sealing members 330 and 330a, that is, the underfills 310 and 310a, may be slightly increased from CS2 to CS2'. FIG. 23 illustrates that the first chip 100 is on top for convenience of explanation.

Once each chip-stacked semiconductor package 1000-2 is formed by using the above sawing process, both side surfaces and the first back surface B1 of the first chip 100 are exposed. In this case, when the chip-stacked semiconductor package 1000-2 is mounted on a board substrate and is molded again, an additional sealing member may be well coupled and attached to the side surfaces of the first chip 100.

According to the method of manufacturing the chip-stacked semiconductor package of the present embodiment, the second chips 200 and the third chips 200-1 are mounted on the base wafer 10 including the plurality of first chips 100. In this process, the size CS2 of each of the second chips 200 and the third chips 200-1 is less than that of each of the first chips 100 by increasing the size S2 that is a width of the blade when a wafer including the second chip 200 and the third chip 200-1 is sawn and the second chip 200 and the third chip 200-1 are prepared.

Accordingly, even when a size of a scribe line area, for example, a width of a scribe line area, on a highly integrated wafer is small, an underfill process may be easily performed. Also, the chip-stacked semiconductor package 1000-2 may be manufactured by more easily sawing the base wafer 10 and the first and second sealing members 330 and 300a.

A structure and characteristics of the chip-stacked semiconductor package 1000-2 manufactured by using the method of manufacturing the chip-stacked semiconductor package will be briefly explained with reference to FIG. 23.

In detail, referring to FIG. 23 illustrating the first chip 100 that is on top as described above, the chip-stacked semiconductor package 1000-2 may include the first chip 100, the second chip 200, the third chip 200-1, and the first and second sealing members 330 and 330a.

The first chip 100 may include the first body layer 110, the passivation layer 160, and the first connection member 170. The first chip 100 may have the first front surface F1 and the first back surface B1 that is opposite to the first front surface F1. The first connection member 170 may be formed on the first front surface F1 such that the first connection member 170 and the second connection member 240 of the second chip 200 are arranged in a mirror-symmetric fashion with each other.

The second chip 200 may be disposed under the first chip 100. The second chip 200 may include the second body layer 210, the passivation layer 224, the first TSV 230, and the second connection member 240. The second chip 200 has the second front surface F2 and the second back surface B2 that is opposite to the second front surface F2. The second connection member 240 is disposed between the first front surface F1 and the second front surface F2 and is electrically connected to the first connection member 170 and the first TSV 230.

The protective layer 260 and the third connection member 274 may be formed under the second chip 200. The third connection member 274 may include the bump pad 270. The first sealing member 330 fills a connected portion between the first chip 100 and the second chip 200, that is, a connected portion between the first connection member 170 of the first chip 100 and the second connection member 240 of the second chip 200.

The first sealing member 330 may be formed to surround both side surfaces of the second chip 200. Accordingly, the first sealing member 330 that is formed on the both side surfaces of the second chip 200 and the first sealing member 330 that is formed on the connected portion between the first chip 100 and the second chip 200 may be formed of the same material.

The third chip 200-1 may be disposed under the second chip 200. The third chip 200-1 may include the third body layer 210a, the passivation layer 224a, the second TSV 230-1, and the fourth connection member 240a. The third chip 200-1 has the third front surface F3 and the third back surface B3 that is opposite to the third front surface F3. The fourth connection member 240a is disposed between the second back surface B2 and the third front surface F3 and is electrically connected to the third connection member 274 and the second TSV 230-1.

The protective layer 260 and the fifth connection member 274a may be formed under the third chip 200-1. The fifth connection member 274a may include the bump pad 270 and the bump 272. The first sealing member 330a fills a connected portion between the second chip 200 and the third chip 200-1, that is, a connected portion between the third connection member 274 of the second chip 200 and the fourth connection member 240a of the third chip 200-1. The first sealing member 330a may be formed to surround both side surfaces of the third chip 200-1. Accordingly, the first sealing member 330a that is formed on the both side surfaces of the third chip 200-1 and the first sealing member 330a that is formed on the connected portion between the second chip 200 and the third chip 200-1 may be formed of the same material.

The first sealing member 330 is not formed on the first back surface B1 of the first chip 100, and thus the first back surface B1 of the first chip 100 is exposed. The first sealing member 330 is not formed on both side surfaces of the first chip 100, and thus the both side surfaces of the first chip 100 are exposed. Accordingly, when the chip-stacked semiconductor package 1000-2 is mounted on a main chip or a board substrate as described below and is molded again, an additional molding member may be well coupled and attached to a top surface of the first chip 100 or the side surfaces of the first chip 100.

Both end portions of the first and second sealing members 330 and 330a that are formed to surround both side surfaces of the second chip 200 and the third chip 200-1 are vertically aligned with edges of the first chip 100. In other words, the size CS2' of each of the second chip 200 and the third chip 200-1 respectively including the first and second sealing members 330 and 330a may be equal to the size CS1 of the first chip 100.

Figure 24:
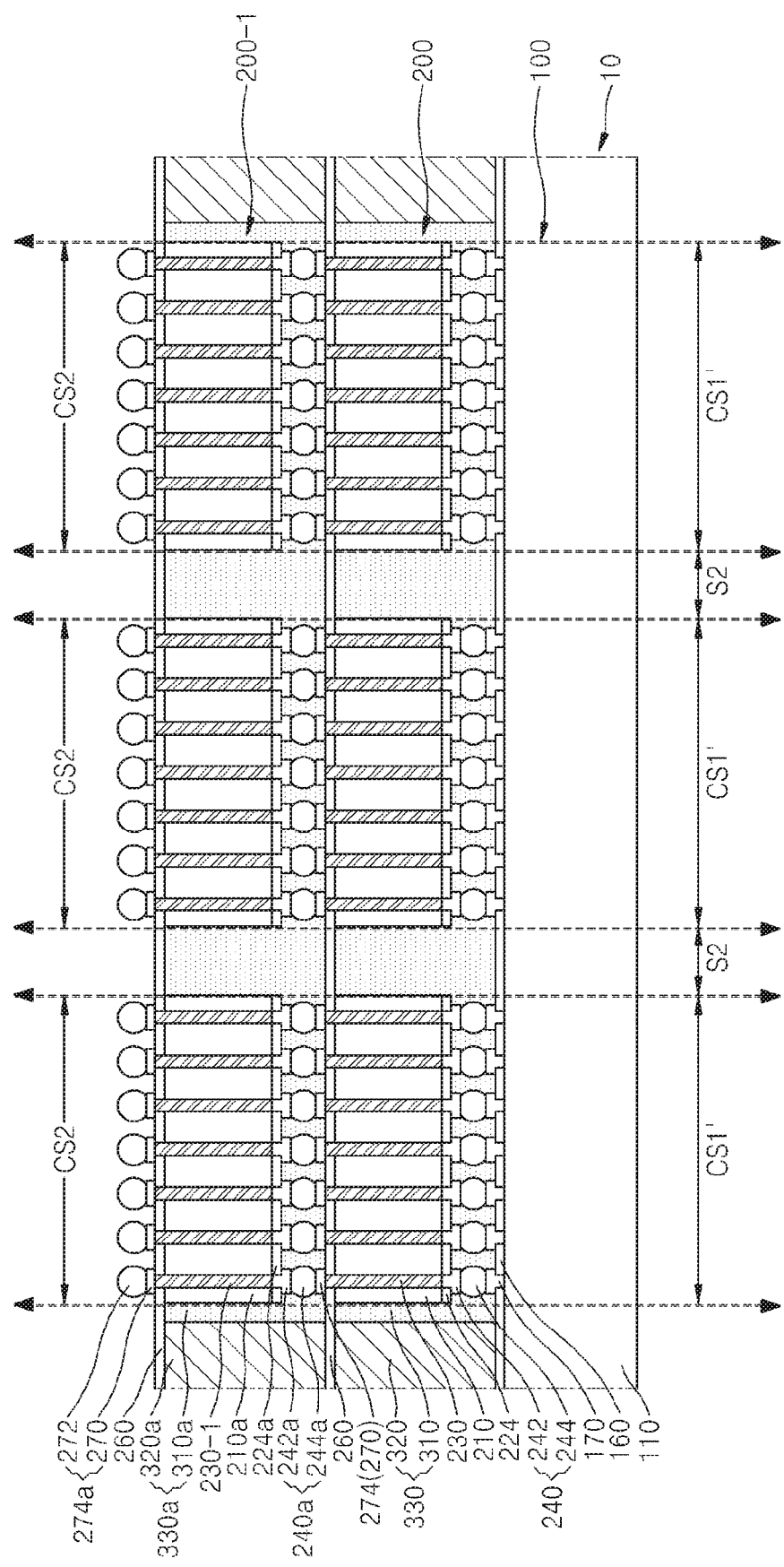
FIGS. 24 and 25 are cross-sectional views for explaining a method of manufacturing a chip-stacked semiconductor package according to another example embodiment of inventive concepts and the chip-stacked semiconductor package manufactured by using the method.
Figure 25:
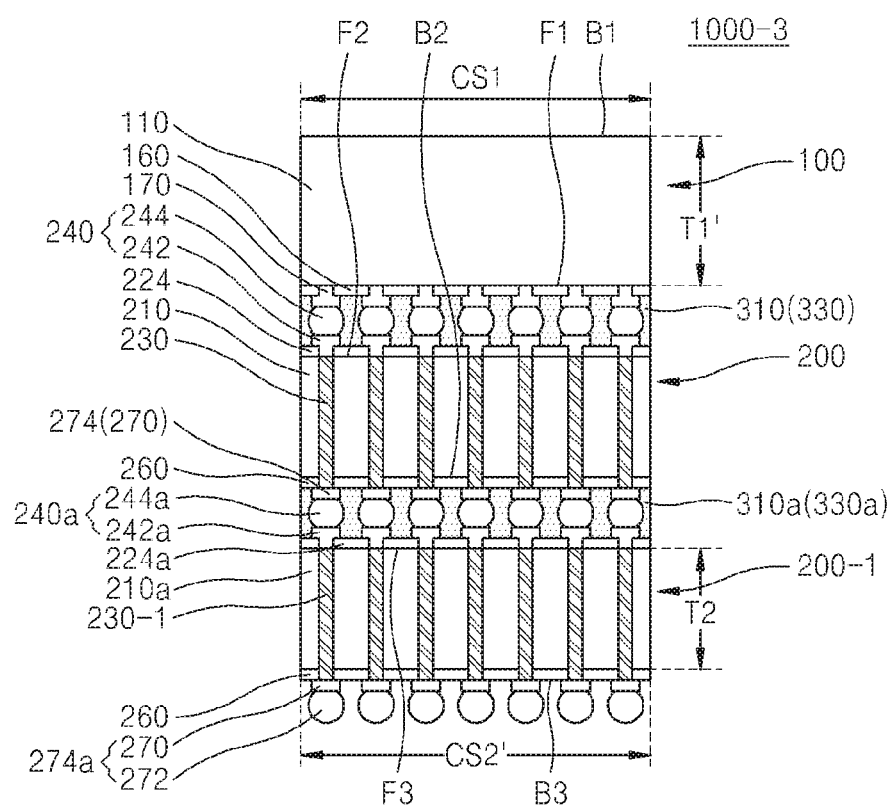

FIGS. 24 and 25 are cross-sectional views for explaining a method of manufacturing a chip-stacked semiconductor package according to another example embodiment of inventive concepts and the chip-stacked semiconductor package manufactured by using the method.

In detail, when the embodiment of FIGS. 24 and 25 is compared with the embodiment of FIGS. 18 through 23, the embodiment of FIGS. 24 and 25 and the embodiment of FIGS. 18 through 23 are the same except a process of sawing the base wafer 10 and the first and second sealing members 330 and 330a.

First, a manufacturing process of FIGS. 18 through 21 is performed. In this case, the second chips 200 and the third chips 200-1 that are sealed by the first and second sealing members 330 and 330a are disposed on the base wafer 10 that includes the first chips 100.

Referring to FIG. 24, the wafer 10 and the first and second sealing members 330 and 330a are sawn based on the width CS2 of each of the second chips 200 and the third chips 200-1. The size S2 may be a width of a blade as described above, and the base wafer 10 may be easily sawn based on the size S2 that is a width of the blade. In this case, a size of the first chip 100 is slightly reduced from CS1 to CS1'.

Referring to FIG. 25, once each chip-stacked semiconductor package 1000-3 is formed by using the above sawing process, both side surfaces of the first chip 100, the second chip 200, and the third chip 200-1 are exposed. According to the method of manufacturing the chip-stacked semiconductor package of FIGS. 24 and 25, a size of each of the second chip 200 and the third chip 200-1 is less than that of the first chip 100 by increasing the size S2 that is a width of the blade when a wafer including the second chip 200 is sawn and the second chip 200 is prepared, like in FIGS. 18 through 23. Accordingly, the chip-stacked semiconductor package 1000-3 may be manufactured by more easily sawing the base wafer 10 and the first and second sealing members 330 and 330a.

According to the method of manufacturing the chip-stacked semiconductor package of FIGS. 24 and 25, a top surface and both side surfaces of the first chip 100 are exposed. In addition, both side surfaces of the second chip 200 and the third chip 200-1 are also exposed. In this case, when the chip-stacked semiconductor package 1000-3 is mounted on a board substrate and is molded again, an additional sealing member may be well coupled and attached to the side surfaces of the first chip 100, the second chip 200, and the third chip 200-1.

A structure and characteristics of the chip-stacked semiconductor package 1000-3 manufactured by using the method of manufacturing the chip-stacked semiconductor package will now be briefly explained with reference to FIG. 25.

In detail, the chip-stacked semiconductor package 1000-3 of FIG. 25 and the chip-stacked semiconductor package 1000-2 of FIG. 23 are the same except that both side surfaces of the second chip 200 and the third chip 200-1 are exposed.

The first and second sealing members 330 and 330a are not formed on both side surfaces of the second chip 200 and the third chip 200-1. The first sealing member 330 is not formed on both side surfaces of the first chip 100, and thus the both side surfaces of the first chip 100 are not exposed.

Accordingly, when the chip-stacked semiconductor package 1000-3 is mounted on a board substrate and is molded again, an additional molding member may be well coupled and attached to a back surface and the side surfaces of the first chip 100 or the side surfaces of the second chip 200 and the third chip 200-1. Both end portions of the second chip 200 and the third chip 200-1 are vertically aligned with edges of the first chip 100. In other words, the size CS2 of each of the second chip 200 and the third chip 200-1 is equal to the size CS1 of the first chip 100.

Figure 26:
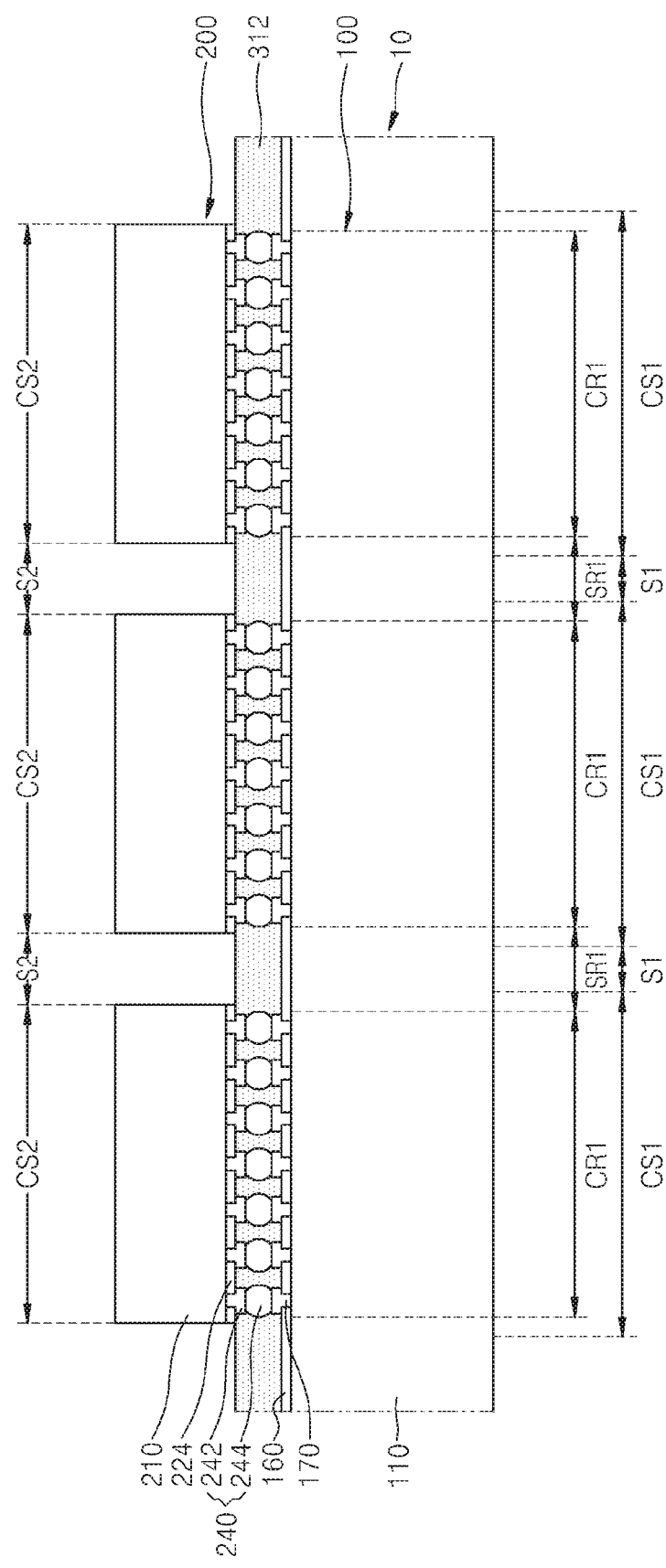
FIG. 26 is a cross-sectional view for explaining a method of manufacturing a chip-stacked semiconductor package according to another example embodiment of inventive concepts and the chip-stacked semiconductor package manufactured by using the method.

FIG. 26 is a cross-sectional view for explaining a method of manufacturing a chip-stacked semiconductor package according to another example embodiment of inventive concepts and the chip-stacked semiconductor package manufactured by using the method.

In detail, when FIG. 26 is compared with FIG. 5, FIG. 26 and FIG. 5 are the same except that an adhesive member 312 is formed instead of the underfill 310. A manufacturing process of FIGS. 6 through 13 may be performed after a process of FIG. 26.

In FIG. 26, the adhesive member 312 is formed on a front surface of the base wafer 10 on which the first connection member 170 is formed, and then the second chip 200 is stacked on the first chip 100. That is, the stacking may be performed by simply compressing the second connection member 240 of the second chip 200 to the first connection member 170 of the first chip 100 due to the adhesive member 312.

Accordingly, a connected portion between the first chip 100 and the second chip 200 is filled with the adhesive member 312. The adhesive member 312 fills a space between the first chip 100 and the second chip 200, and is not formed to surround a side wall of the second chip 200 as shown in FIG. 5. The adhesive member 312 may be, for example, an NCF, an ACF, an ultraviolet (UV) film, a temporary adhesive, a thermosetting adhesive, a laser-hardening adhesive, an ultrasonic hardening adhesive, or an NCP.

The NCF is a commonly used adhesive film having insulating characteristics. When the NCF is used, the second chip 200 may be stacked on the first chip 100 by being compressed. Accordingly, chip warpage, that is, chip deformation which may occur when the second chip 200 is stacked on the first chip 100 through heat and compression may be avoided, and thus a plurality of chips may be easily stacked.

The ACF has a structure in which conductive particles are dispersed in an insulating adhesive film. The ACF has anisotropic electrical characteristics, and thus allows electric current to flow only in a vertical direction in which the first and second connection members 170 and 240 are formed and not allows electric current to flow in a horizontal direction, that is, in a direction between the first and second connection members 170 and 240. Also, when an adhesive is melted by due to heat and pressure applied thereto, the conductive particles are arranged between electrodes to generate conductivity, and the adhesive is filled between neighboring electrodes to insulate the neighboring electrodes from each other.

The adhesive member 312 is not limited to the above materials, and may be formed of any of other adhesive materials that may firmly adhere the first and second chips 100 and 200 and may seal bumps and pads of connected portions.

In an example embodiment, the NCF may be used as the adhesive member 312 in order to stack multi-layer chips. In an example embodiment, since the adhesive member 312 is formed only on the connected portion between the first chip 100 and the second chip 200, the first sealing member 330 may directly contact side surfaces of the second chip 200 and may seal the side surfaces of the second chip 200 in a subsequent process.

Figure 27:
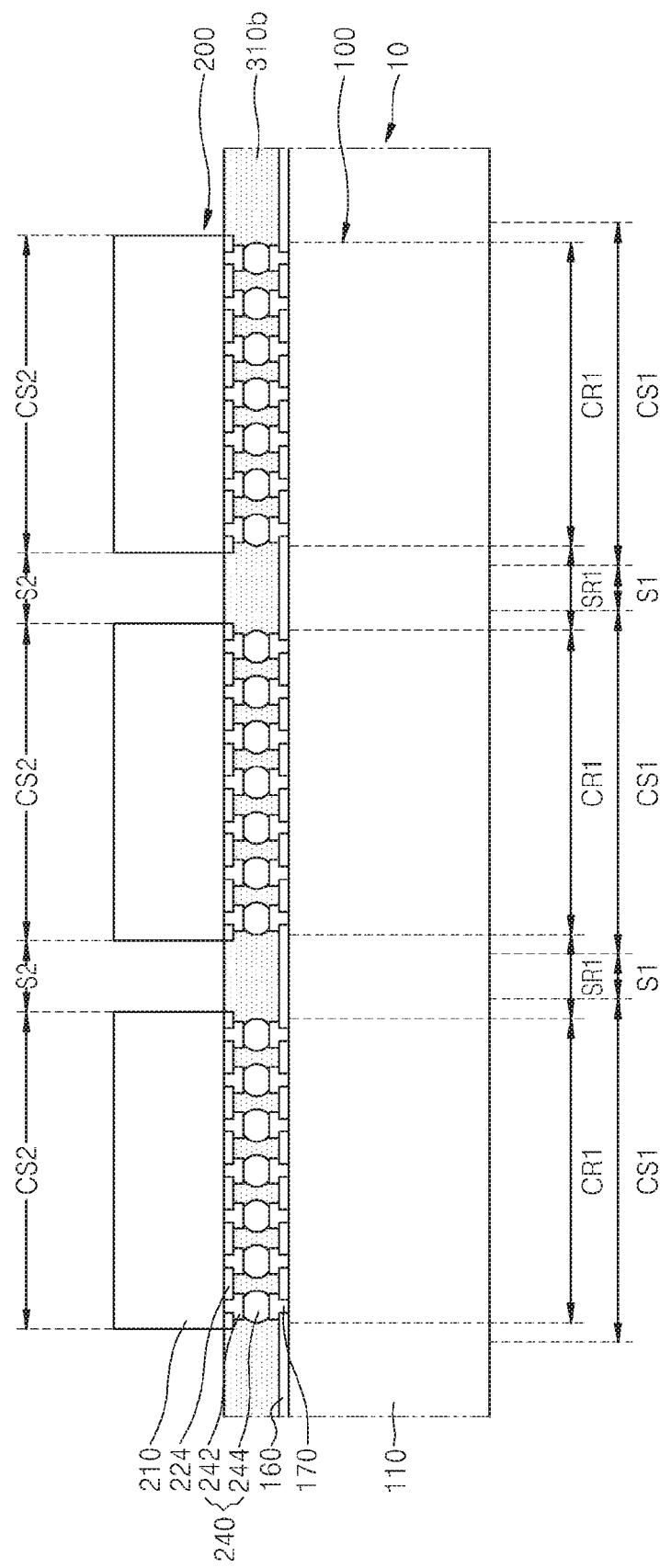
FIG. 27 is a cross-sectional view for explaining a method of manufacturing a chip-stacked semiconductor package according to another example embodiment of inventive concepts and the chip-stacked semiconductor package manufactured by using the method.

FIG. 27 is a cross-sectional view for explaining a method of manufacturing a chip-stacked semiconductor package according to another example embodiment of inventive concepts and the chip-stacked semiconductor package manufactured by using the method.

In detail, when FIG. 27 is compared with FIG. 5, FIG. 27 and FIG. 5 are the same except that an underfill 310b is formed between the first chip 100 and the second chip 200. A manufacturing process of FIGS. 6 through 13 may be performed after a process of FIG. 27.

In FIG. 27, the second chip 200 is stacked on the first connection member 170 of the first chip 100 as shown in FIG. 3. The stacking is performed by adhering the second connection member 240 of the second chip 200 to the first connection member 170 of the first chip 100 by using thermocompression.

Next, the underfill 310b is formed on a connected portion between the first chip 100 and the second chip 200. That is, the underfill 310b does not partially seal a side surface of the second chip 200 or the second back surface B2 of the second chip 200, and fills only the connected portion between the first chip 100 and the second chip 200. The underfill 310b may be formed of an underfill resin such as an epoxy resin as described above, and may include a silica filler or flux. The underfill 310b and a molding member that is to be subsequently formed may be formed of different materials or the same material.

In an example embodiment, since the underfill 310b is formed only on the connected portion between the first chip 100 and the second chip 200, the first sealing member 330 may directly contact side surfaces of the second chip 200 and may seal the side surfaces of the second chip 200 in a subsequent process.

Figure 28:
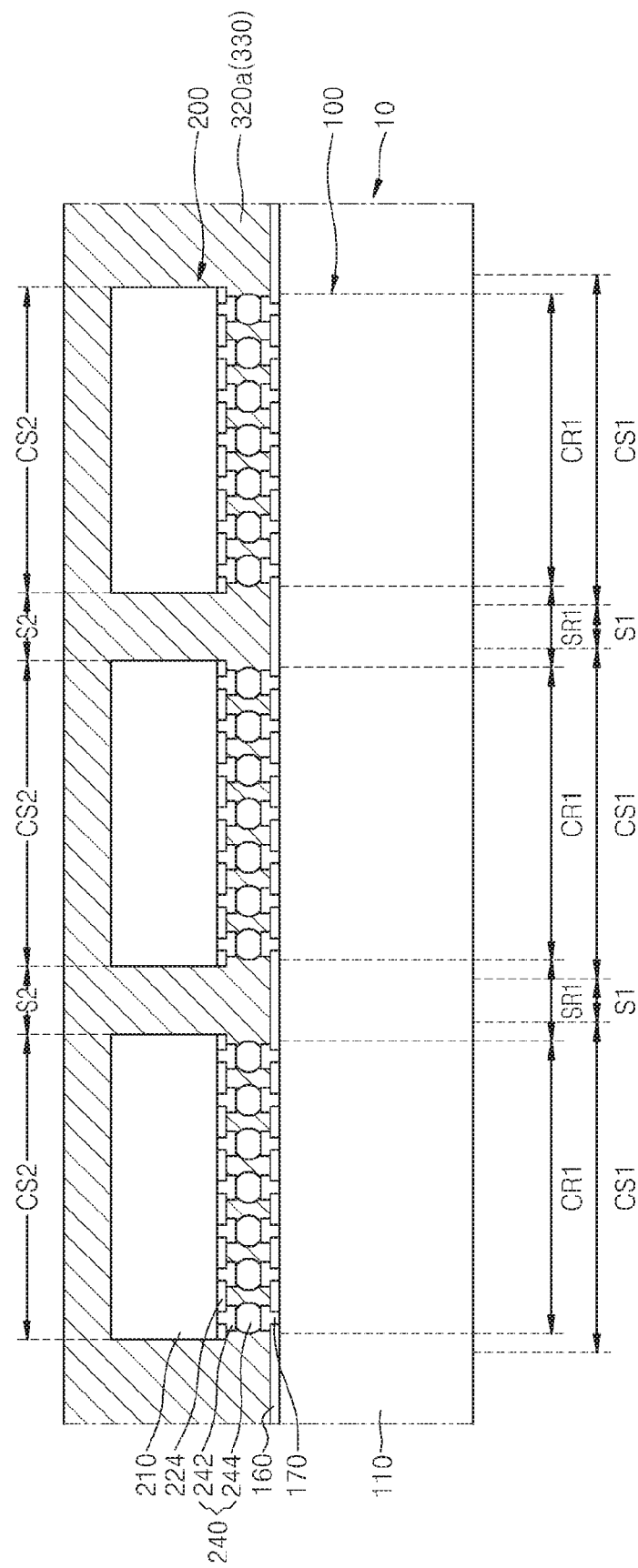
FIG. 28 is a cross-sectional view for explaining a method of manufacturing a chip-stacked semiconductor package according to another example embodiment of inventive concepts and the chip-stacked semiconductor package manufactured by using the method.

FIG. 28 is a cross-sectional view for explaining a method of manufacturing a chip-stacked semiconductor package according to another example embodiment of inventive concepts and the chip-stacked semiconductor package manufactured by using the method.

In detail, when FIG. 28 is compared with FIGS. 5 and 6, FIG. 28 and FIGS. 5 and 6 are the same except that the underfill 310 is not formed and the first sealing member 330 is formed by using the molding member 320a. A manufacturing process of FIGS. 7 through 13 may be performed after a process of FIG. 26.

In FIG. 28, the second chip 200 is stacked on the first connection member 170 of the first chip 100 as shown in FIG. 3. The stacking may be performed by adhering the second connection member 240 of the second chip 200 to the first connection member 170 of the first chip 100 by using thermocompression.

Next, the first sealing member 330 is formed by forming the molding member 320a that fills a connected portion between the first chip 100 and the second chip 200 and seals both side surfaces and a top surface of the second chip 200. The molding member 320a may fill the connected portion between the first chip 100 and the second chip 200, that is, a connected portion between the first connection member 170 of the first chip 100 and the second connection member 240 of the second chip 200.

The molding member 320a may be formed of a polymer such as a resin as described above. For example, the molding member 320a may be formed of an EMC. The molding member 320a may seal side surfaces and a top surface of the second chip 200.

FIGS. 29 through 32 are cross-sectional views for explaining a method of manufacturing a chip-stacked semiconductor package according to another example embodiment of inventive concepts and the chip-stacked semiconductor package manufactured by using the method.

In detail, when FIGS. 29 through 32 is compared with FIGS. 1 through 13, FIGS. 29 through 32 and FIGS. 1 through 13 are the same except that the first TSV 230 is formed in a second chip 200a.

Figure 29:
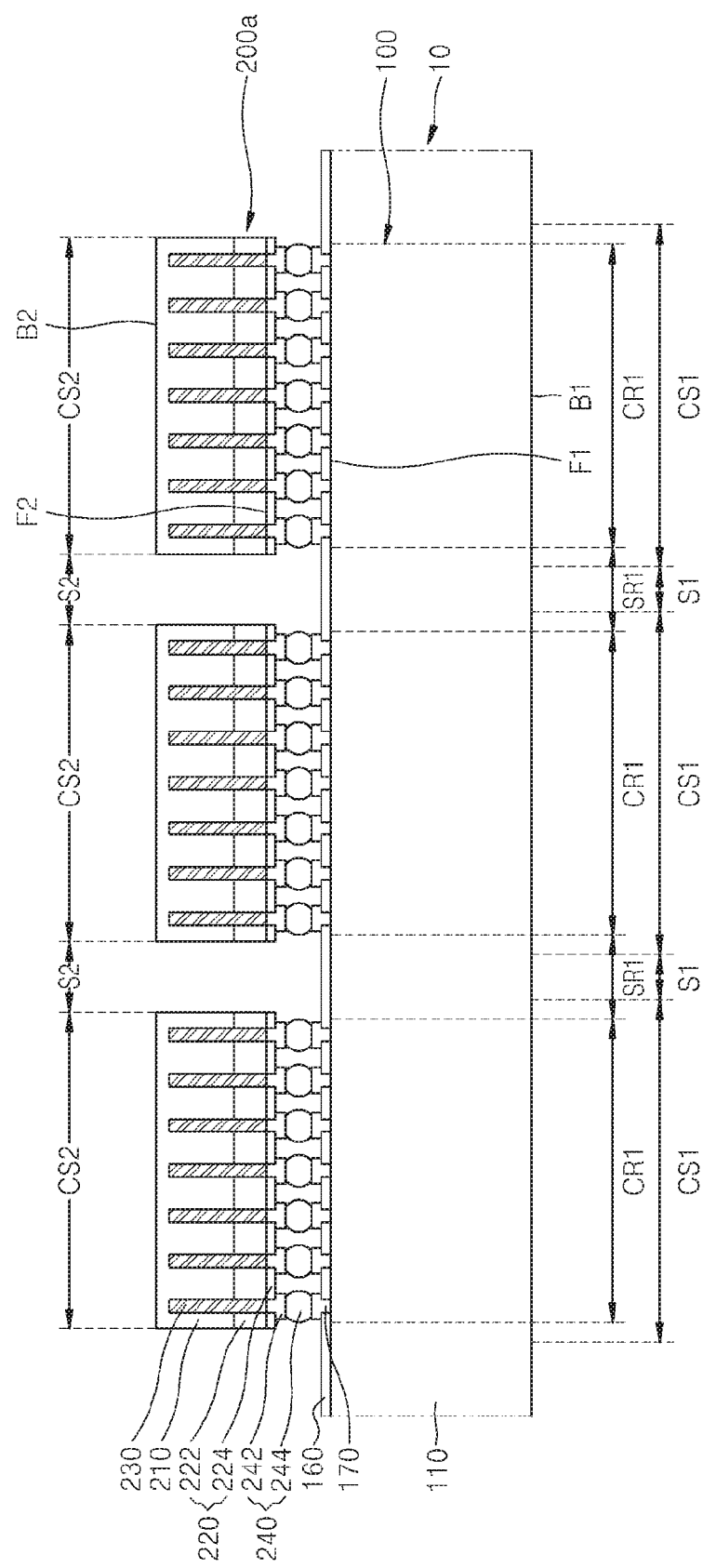
FIGS. 29 through 32C are cross-sectional views for explaining a method of manufacturing a chip-stacked semiconductor package according to another example embodiment of inventive concepts and the chip-stacked semiconductor package manufactured by using the method.

Referring to FIG. 29, a plurality of the second chips 200a in which the first TSV 230 is formed are prepared. That is, each of the second chips 200a may include the first TSV 230, the second body layer 210, an insulating layer 220 including an intermetal insulating layer 222 and a passivation layer 224, and the second connection member 240.

The first TSV 230 may be electrically connected to the second connection member 240. The first TSV 230 may not be formed to extend from the second front surface F2 of the second body layer 210 to the second back surface B2 of the second body layer 210. Accordingly, the first TSV 230 may be formed in the second body layer 210. A size of the second chip 200a may be denoted by CS2. The size CS2 of the second chip 200a may be a width or a length. A process of manufacturing the second chip 200a will be explained below in detail.

Next, the second chip 200a including the first TSV 230 is stacked on each of the first chips 100 as described with reference to FIG. 3. That is, the second chip 200a is stacked on the first chip 100 such that the second front surface F2 of the second chip 200a faces the first front surface F1 of the first chip 100. The second connection member 240 is electrically connected to the first connection member 170 between the first front surface F1 and the second front surface F2. The stacking may be performed by adhering the second connection member 240 of the second chip 200a to the first connection member 170 of the first chip 100 by using thermocompression.

Figure 30:
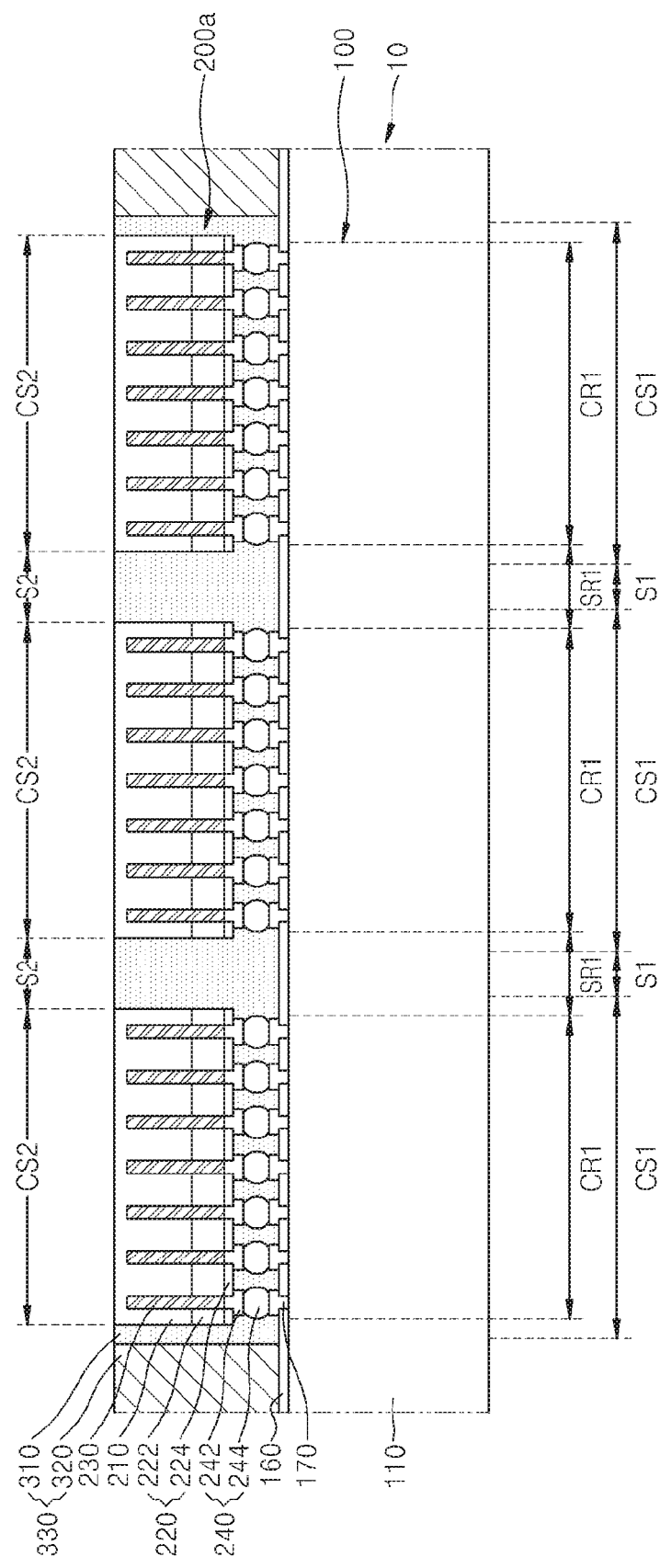

Referring to FIG. 30, the first sealing member 330 that seals the second chip 200a is formed as shown in FIGS. 5 through 7. The first sealing member 330 may include the underfill 310 and the molding member 320. The underfill 310 may fill a connected portion between the first chip 100 and the second chip 200a and may seal both side surfaces of the second chip 200a. The molding member 320 may be formed outside the underfill 310 and may seal side surfaces and the second back surface B2 of the second chip 200a.

Figure 31:
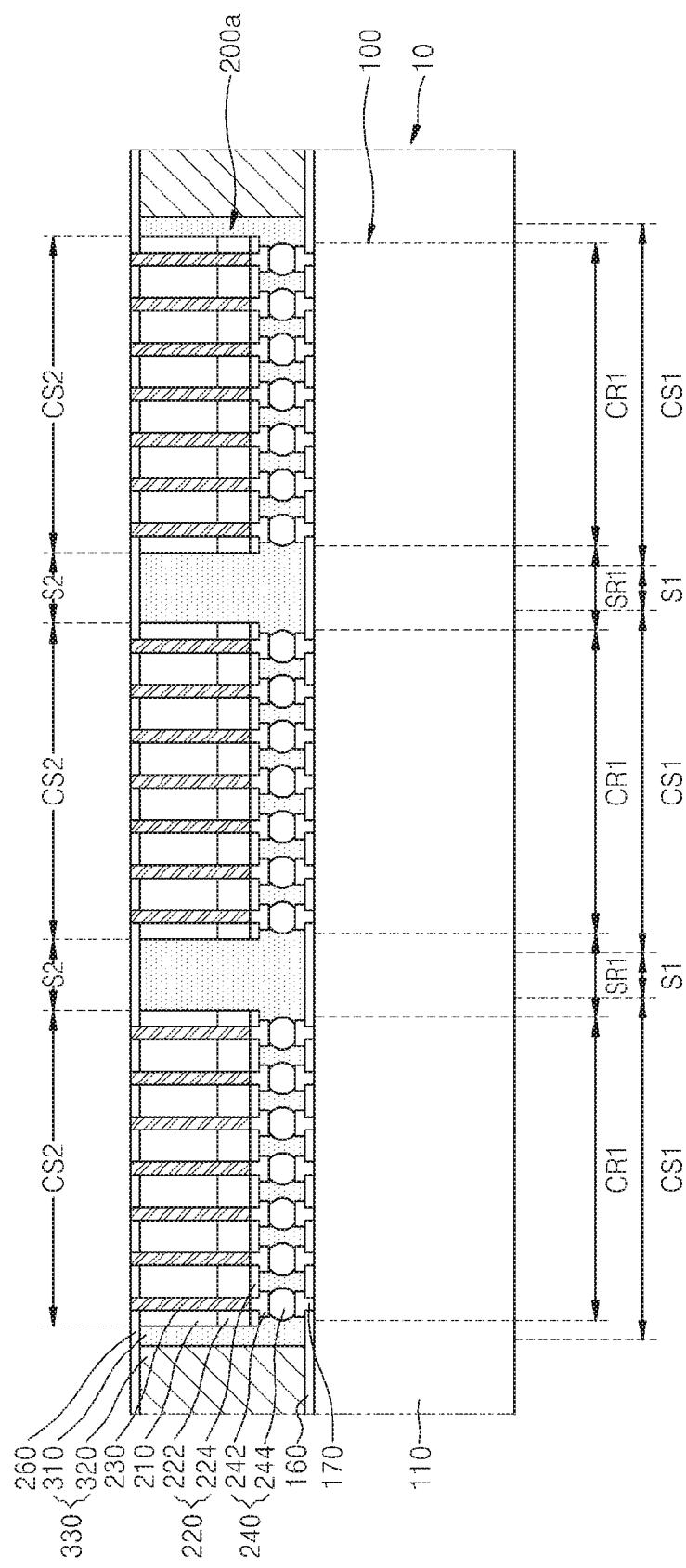

Referring to FIGS. 31 and 32, the bump pad 270 that constitutes the third connection member 274 (see FIG. 11) and the first TSV 230 that is exposed on the second back surface B2 of the second chip 200a, that is, the second back surface B2 of the second body layer 210 are formed as described with reference to FIGS. 9 and 10.

A process of forming the first TSV 230 and the third connection member 270 will now be explained in detail with reference to FIGS. 32A through 32C. A process of forming the first TSV 230 and the third connection member 270 may be similar to a method of FIGS. 10A through 10D. The first TSV 230 and the third connection member 270 may be formed by using any of various methods.

Figure 32A:
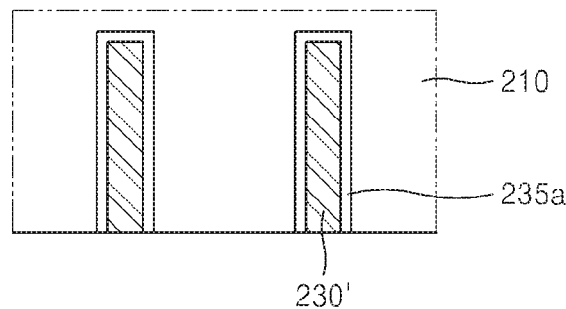
Figure 32B:
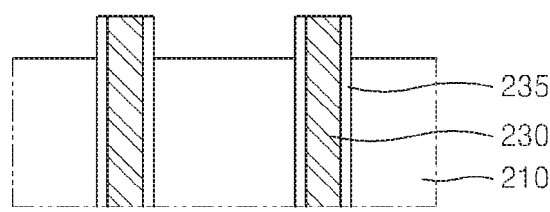

As shown in FIG. 32A, a first TSV 230' that is insulated by the spacer insulating layer 235a and is not exposed on the second back surface B2 is formed in the second body layer 210. Next, as shown in FIG. 32B, the second back surface B2 of the second body layer 210 is etched to be recessed. Accordingly, a back surface of the first TSV 230 may be exposed and the spacer insulating layer 235a may become the patterned spacer insulating layer 235.

Figure 32C:
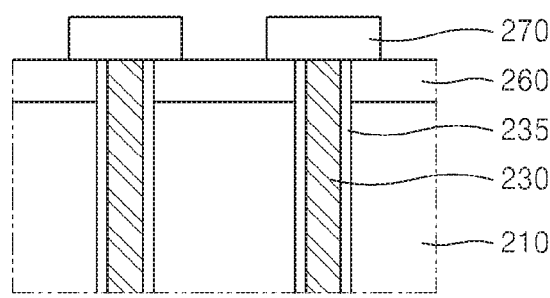

As shown in FIG. 32C, the protective layer 260 is formed on the recessed second back surface B2 of the second body layer 210 and on both side walls of the first TSV 230. The protective layer 260 functions to protect the second body layer 210. The protective layer 260 functions to insulate the first TSVs 230 from each other.

In an example embodiment, the patterned spacer insulating layer 235 that is formed on the first TSV 230 may remain when the second back surface B2 of the first body layer 210 is recessed. The first TSV 230 may be exposed when an insulating material layer is formed to a sufficient thickness on the second body layer 210 and then is etched to form the protective layer 260.

The bump pad 270 that constitutes the third connection member 274 (see FIG. 11) is formed on the first TSV 230. Next, the chip-stacked semiconductor package of FIG. 39 may be completed by performing a manufacturing process of FIGS. 11 through 13.

Figure 33:
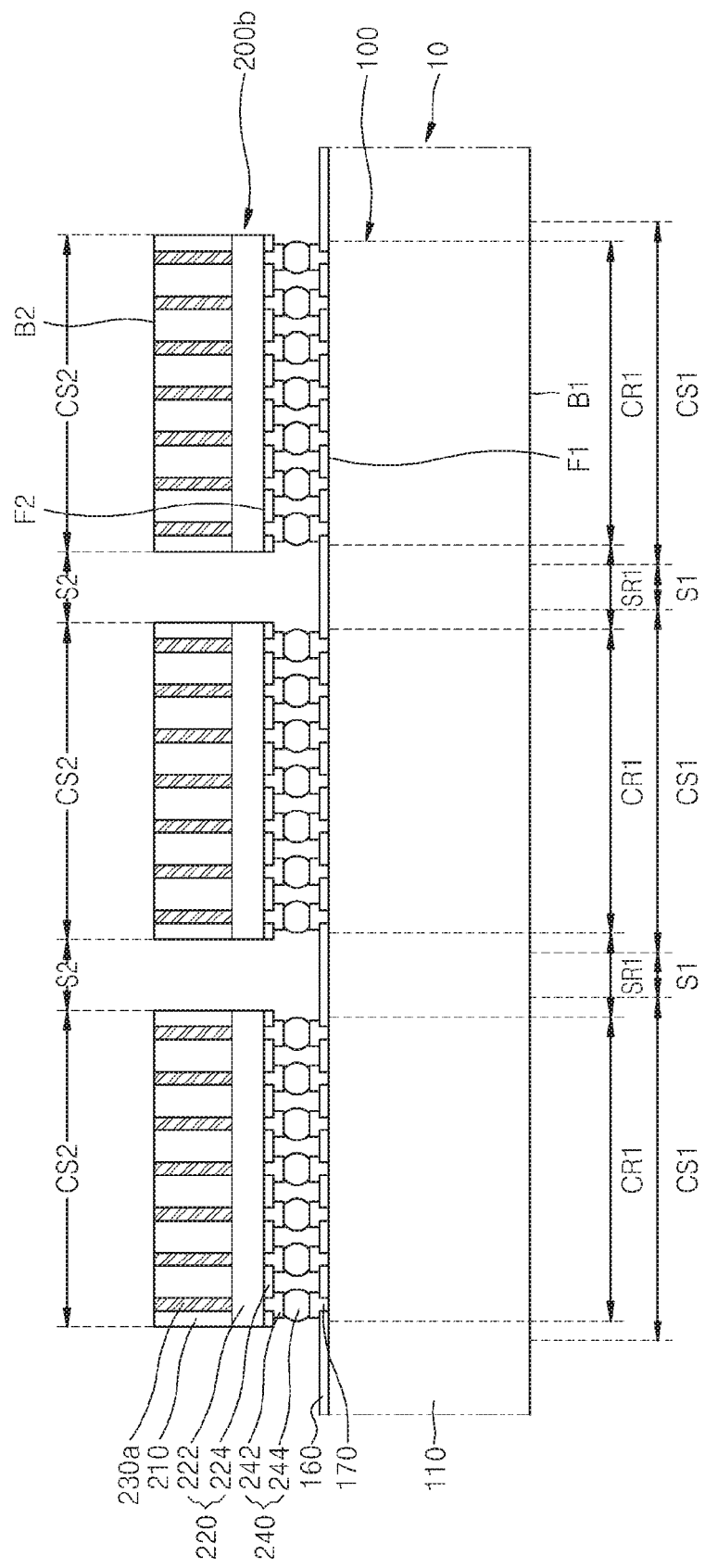
FIGS. 33 and 34 are cross-sectional views for explaining a method of manufacturing a chip-stacked semiconductor package according to another example embodiment of inventive concepts and the chip-stacked semiconductor package manufactured by using the method.
Figure 34:
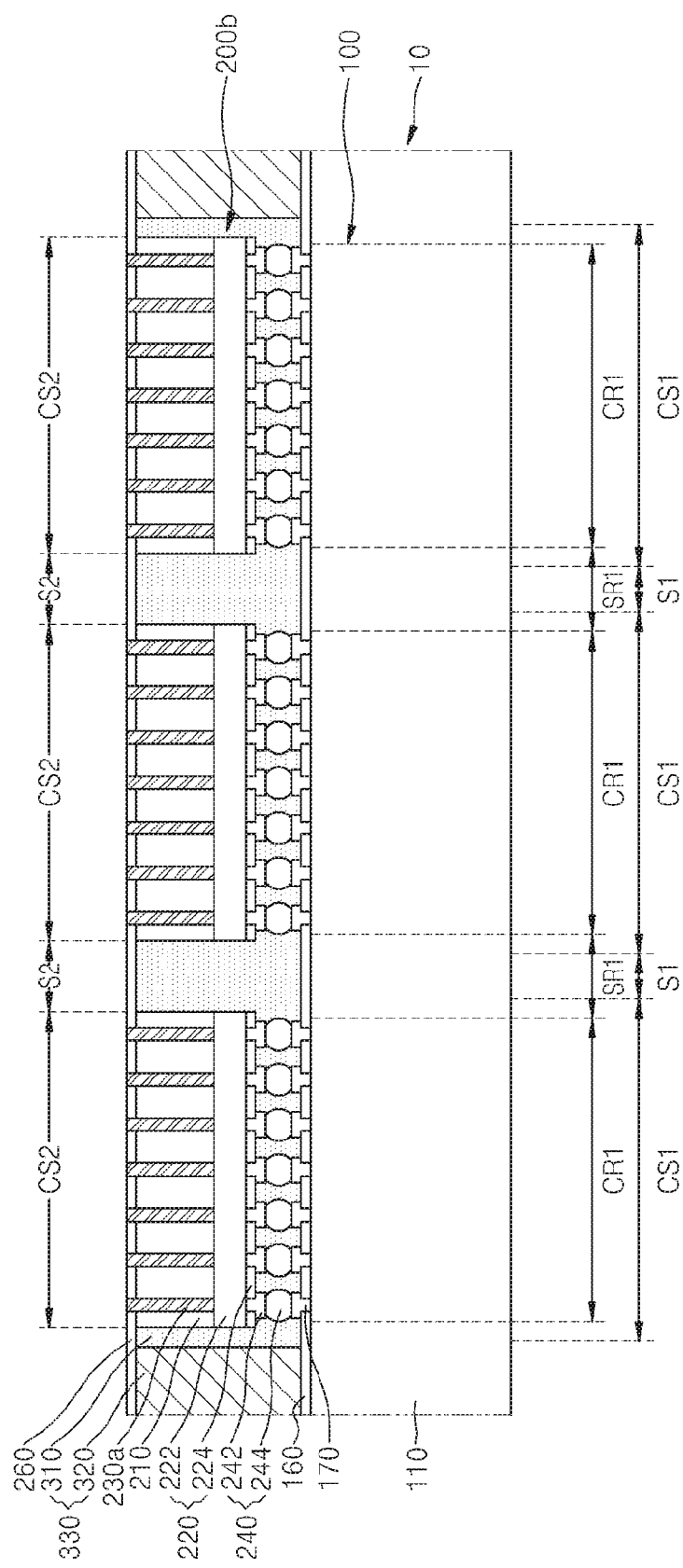

FIGS. 33 and 34 are cross-sectional views for explaining a method of manufacturing a chip-stacked semiconductor package according to another example embodiment of inventive concepts and the chip-stacked semiconductor package manufactured by using the method.

In detail, when FIGS. 33 and 34 is compared with FIGS. 1 through 13 and FIGS. 29 through 32, FIGS. 33 and 34 and FIGS. 1 through 13 and FIGS. 29 through 32 are the same except that the intermetal insulating layer 222 and first TSV 230a are formed on the second chip 200a. When FIGS. 33 and 34 is compared with FIGS. 29 through 32, FIGS. 33 and 34 and FIGS. 29 through 32 are the same except that the first TSV 230a is not formed to extend from the second back surface B2 to the second front surface F2 of the second body layer 210.

Referring to FIG. 33, a plurality of second chips 200b in which of each the first TSV 230a is formed are prepared. Each of the second chips 200b may include the first TSV 230a, the second body layer 210, the insulating layer 220 including the intermetal insulating layer 222 and the passivation layer 224, and the second connection member 240.

The first TSV 230a may be electrically connected to the second connection member 240 through wires in the intermetal insulating layer 222. The first TSV 230a may not be formed to extend from the second back surface B2 to the second front surface F2 of the second body layer 210. The first TSV 230a may be formed to extend from the second back surface B2 of the second body layer 210 to the intermetal insulating layer 222. A size of the second chip 200a may be denoted by CS2. The size CS2 of the second chip 200a may be a width or a length. A process of manufacturing the second chip 200b will be explained below in detail.

Next, the second chip 200b including the first TSV 230a is stacked on each of the first chips 100 as described with reference to FIG. 3. That is, the second chip 200b is stacked on the first chip 100 such that the second front surface F2 of the second chip 200b faces the first front surface F1 of the first chip 100. The second connection member 240 is electrically connected to the first connection member 170 between the first front surface F1 and the second front surface F2. The stacking may be performed by adhering the second connection member 240 of the second chip 200b to the first connection member 170 of the first chip 100 by using thermocompression.

Referring to FIG. 34, the first sealing member 330 that seals the second chip 200b is formed as described with reference to FIGS. 5 through 7. The first sealing member 330 may include the underfill 310 and the molding member 320. The underfill 310 may fill a connected portion between the first chip 100 and the second chip 200 and may seal both side surfaces of the second chip 200b. The molding member 320 may be formed outside the underfill 310 and may seal side surfaces and the second back surface B2 of the second chip 200b.

As described with reference to FIGS. 9, 10, and 32A through 32C, the bump pad 270 that constitutes the third connection member 274 (see FIG. 11) and the protective layer 260 are formed on the second back surface B2 of the second chip 200b, that is, the second back surface B2 of the second body layer 210. Next, the chip-stacked semiconductor package of FIG. 39 may be completed by performing a manufacturing process of FIGS. 11 through 13.

FIGS. 35 and 36 are cross-sectional views for explaining a method of manufacturing a second chip used in a method of manufacturing a chip-stacked semiconductor package, according to an example embodiment of inventive concepts.

In detail, the second chip 200b of FIGS. 35 and 36 has been used in the method of FIGS. 33 and 334. The second chip 200b of FIGS. 35 and 36 and the second chip 200 of FIGS. 14 and 15 are the same except that the insulating layer 220 including the intermetal insulating layer 222 and the passivation layer 224 and the first TSV 230a are further formed.

Referring to FIG. 35, the wafer including the plurality of second chips 200b each of which includes the first TSV 230a, the second body layer 210, the insulating layer 220 including the intermetal insulating layer 222 and the passivation layer 224, and the second connection member 240 is prepared. The wafer 20 may be prepared by being adhered to the support substrate 840 by using the adhesive member 860. A process of manufacturing the wafer 20 will be explained below in detail with reference to FIGS. 37A through 37F.

Referring to FIG. 36, the wafer 20 is sawn along a scribe line area into the second chips 200b. A size of each of the second chips 200b completed by sawing the wafer 20 may be denoted by CS2. The size CS2 of the second chip 200b may be a width or a length. A size sawn with a blade in the scribe line area is denoted by S2. The size S2 sawn with the blade may be a width or a length.

FIGS. 37A through 37F are cross-sectional views for explaining a method of manufacturing a second chip used in a method of manufacturing a chip-stacked semiconductor package, according to another example embodiment of inventive concepts. FIGS. 37A through 37F illustrate the second chip 200b of FIGS. 33 and 34.

Figure 37A:
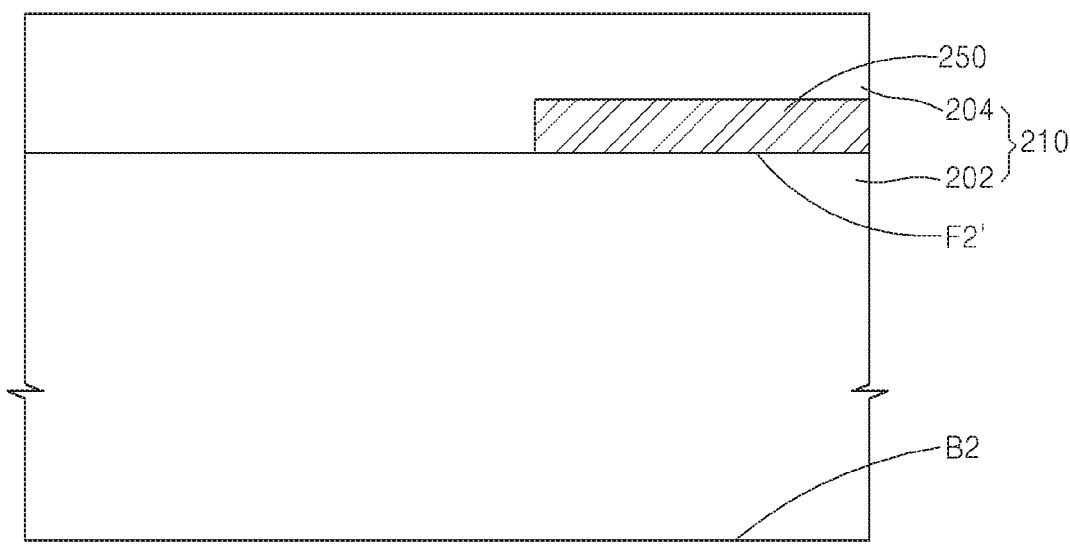
FIGS. 37A through 37F are cross-sectional views for explaining a method of manufacturing a second chip used in a method of manufacturing a chip-stacked semiconductor package, according to another example embodiment of inventive concepts.

Referring to FIG. 37A, an integrated circuit layer 250 is first formed on a front surface F2' of a semiconductor substrate 202, for example, a silicon substrate, and an interlayer insulating layer 204 that covers the integrated circuit layer 250 is formed on the front surface F2' of the semiconductor substrate 202. The semiconductor substrate 202 and the interlayer insulating layer 204 constitute the second body layer 210 of the second chip 200b.

The semiconductor substrate 202 may be formed as a single crystalline wafer, for example, a single crystalline silicon wafer. The integrated circuit layer 250 may include various circuit devices, for example, transistors and/or capacitors, according to a type of a chip.

The interlayer insulating layer 204 may be formed by using an appropriate insulating layer deposition method, for example, chemical vapor deposition (CVD). Since the interlayer insulating layer 204 may not be formed to be planarized according to a profile of the integrated circuit layer 250, the interlayer insulating layer 204 may be planarized after deposition. The planarization may be performed by using chemical-mechanical polishing (CMP) or etch-back.

Figure 37B:
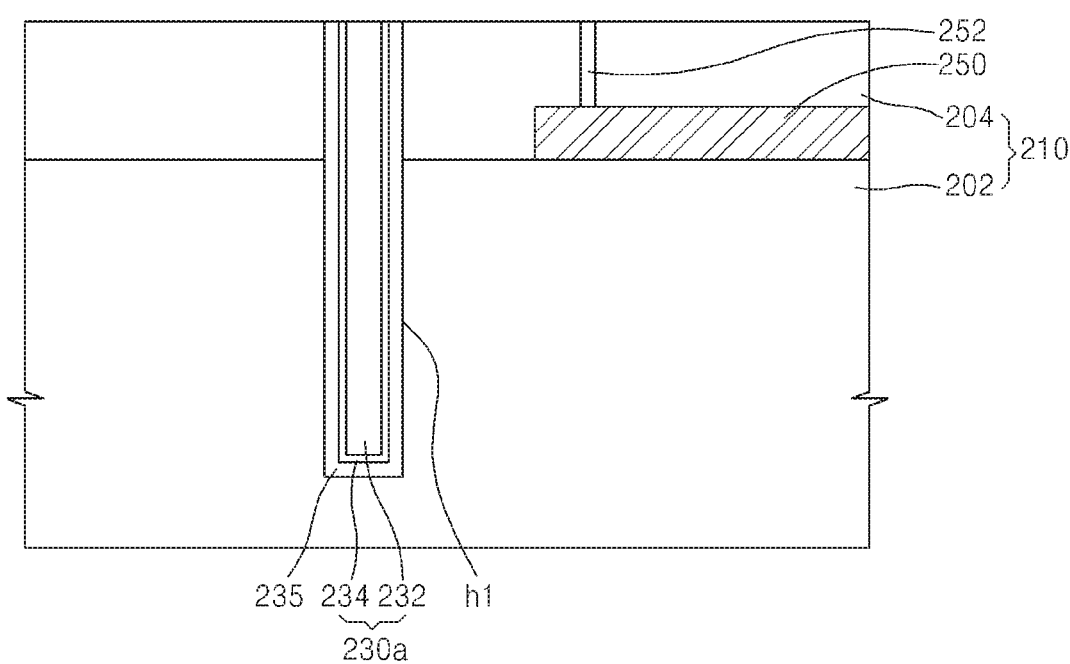

Referring to FIG. 37B, the patterned spacer insulating layer 235 and the first TSV 230 are formed by forming the trench h1 in the interlayer insulating layer 204 and the semiconductor substrate 202. In detail, a resist pattern (not shown) is formed on the interlayer insulating layer 204, and the trench h1 is formed by continuously removing the interlayer insulating layer 204 and the semiconductor substrate 202 by using an etching process by using the resist pattern. The trench h1 may be formed by using laser drilling.

As shown in FIG. 37B, the trench h1 may be formed not to pass through the semiconductor substrate 202 in consideration of polishing of a back surface B2 of the semiconductor substrate 202. In an embodiment, the trench h1 may be formed to pass through the semiconductor substrate 202. The trench h1 may be formed to have any of various shapes according to etching conditions or drilling conditions. For example, the trench h1 may be formed to have a relatively uniform cylindrical shape or have a width that decreases downward.

Next, the patterned spacer insulating layer 235 is formed in the trench h1. For example, the patterned insulating layer 235 may include an appropriate insulating layer, for example, an oxide layer, a nitride layer, a polymer, or parylene, and may be formed by using low temperature deposition, for example, low-temperature chemical vapor deposition (LTCVD), polymer spraying, or low-temperature physical vapor deposition (PVD).

Next, the first TSV 230a is formed on the patterned spacer insulating layer 235. For example, the first TSV 230a may be formed by forming a barrier metal layer 234 on the patterned insulating layer 235 in the trench h1 and forming a wired metal layer 232 on the barrier metal layer 234. The barrier metal layer 234 may have a stacked structure in which one or two selected from titanium (Ti), tantalum (Ta), TiN, and TaN are stacked. The wired metal layer 232 may have a stacked structure in which one or more selected from tungsten (W), Al, and Cu are stacked. The barrier metal layer 234 and the wired metal layer 232 may be formed by using CVD, plasma-enhanced CVD (PECVD), HDP-CVD, sputtering, metalorganic CVD (MOCVD), or atomic layer deposition (ALD). The wired metal layer 232 may be formed by using plating. In this case, a seed layer may be first formed and then a plating layer may be formed. When the wired metal layer 232 is formed by using plating, Cu may be used.

The trench h1 may be buried, and then may be planarized. For example, the planarization may be performed such that the patterned insulating layer 235 and the first TSV 230a may remain only in the trench h1 by using, for example, CMP or etch-back. After the planarization using CMP, preheat and buffering CMP may be performed.

Figure 37C:
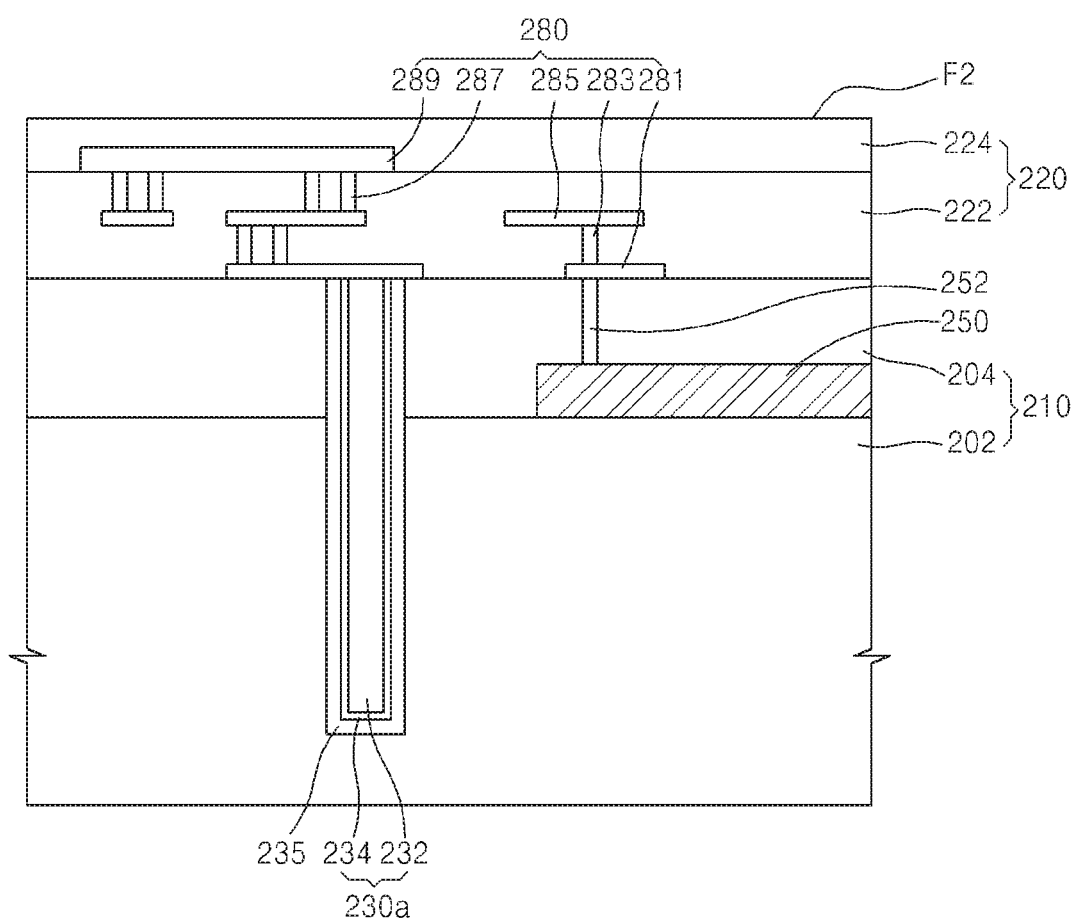

Referring to FIG. 37C, the insulating layer 220 including a multi-layer wired pattern 280 that is connected to the first TSV 230a, the intermetal insulating layer 222, and the passivation layer 224 is formed. For example, the multi-layer wired pattern 280 may be formed by repeatedly performing a process of forming a stacked structure in which first through third wired lines 281, 285, and 289 and vertical plugs 283 and 287 are stacked. The intermetal insulating layer 222 may be formed to have a multi-layer structure according to the stacked structure of the multi-layer wired pattern 280. When the insulating layer 220 including the multi-layer wired pattern 280, the intermetal insulating layer 222, and the passivation layer 224 is formed, the second front surface F2 of the second chip 200b may become a surface of the passivation layer 224.

The multi-layer wired pattern 280 may be formed by depositing and patterning a material film or by using a damascene process. For example, when the multi-layer wired pattern 280 includes Al and/or W, the multi-layer wired pattern 280 may be formed by using the former method, and when the multi-layer wired pattern 280 includes Cu, the multi-layer wired pattern 280 may be formed by using the latter method.

Figure 37D:
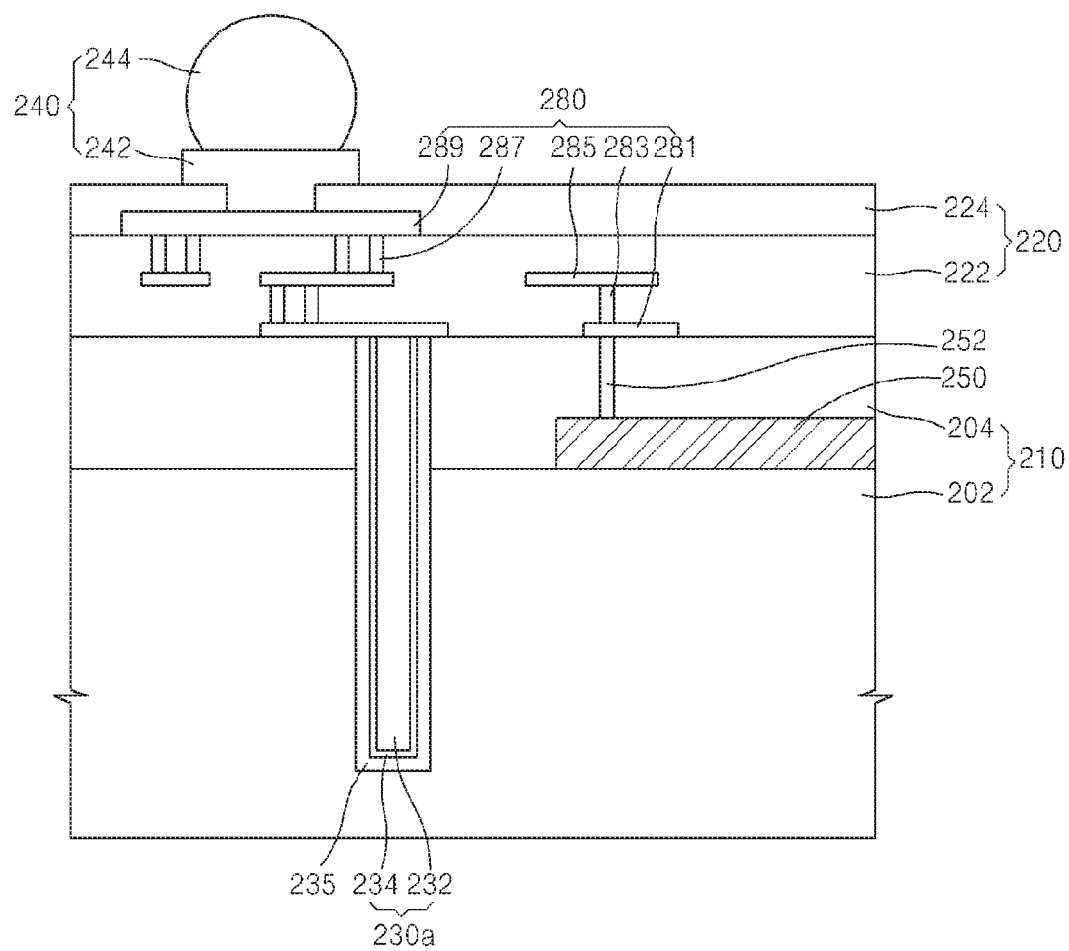

Referring to FIG. 37D, the second connection member 240 that is connected to the multi-layer wired pattern 280, for example, the third wired line 289, may be formed on the passivation layer 224. The second connection member 240 may be completed by forming a trench in the passivation layer 224, forming the bump pad 242 to fill the trench, and then forming the bump 244 on the bump pad 242. The first TSV 230a of the present embodiment may be formed to have a via-middle structure that is formed after the integrated circuit layer 250 is formed and before the multi-layer wired pattern 280 is formed.

Figure 37E:
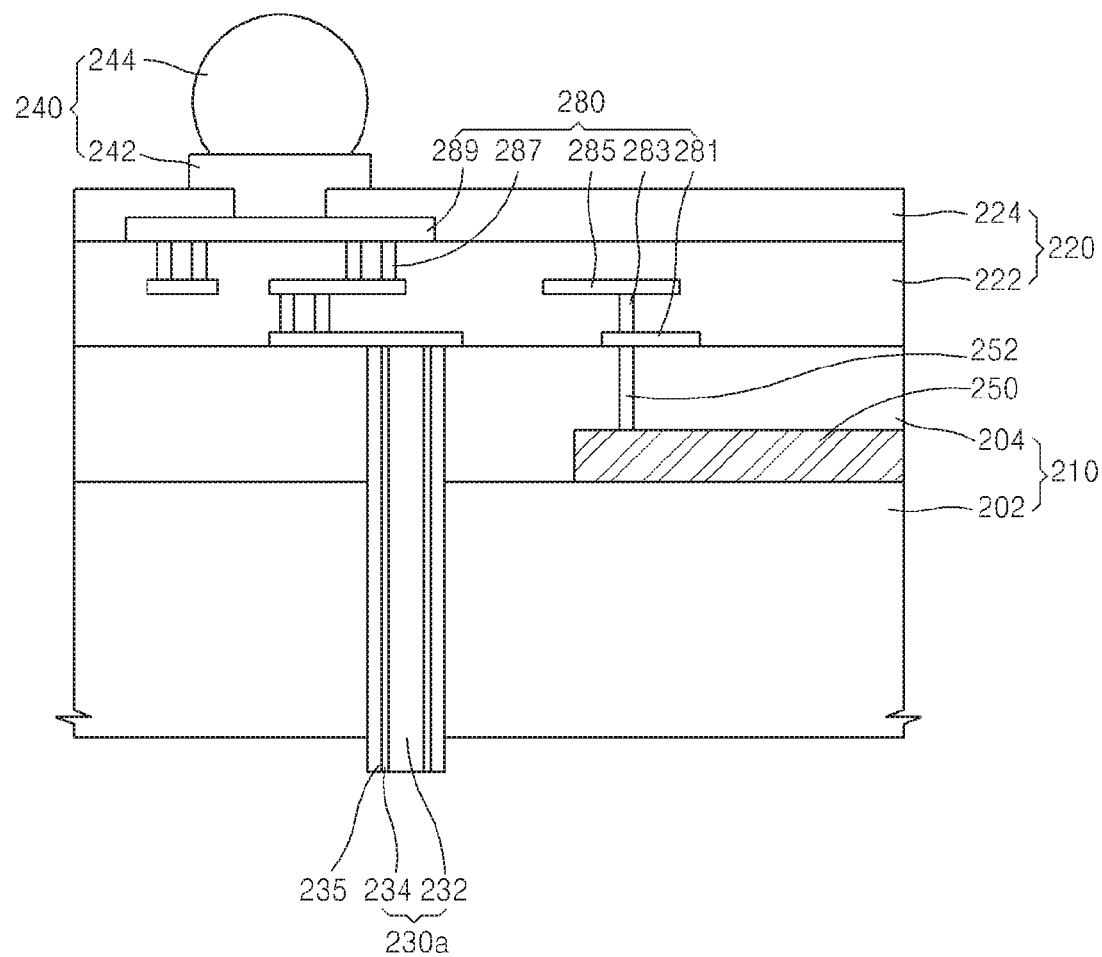

Referring to FIG. 37E, the patterned insulating layer 235 and the first TSV 230a are exposed by removing a predetermined thickness of the semiconductor substrate 202 from the back surface B2 of the semiconductor substrate 202. The patterned insulating layer 235 and the first TSV 230 may be exposed such that back surfaces of the patterned insulating layer 235 and the first TVS 230 protrude as shown in FIG. 37E.

The semiconductor substrate 202 may be removed by using grinding, CMP, isotropic etching, anisotropic etching, or a combination thereof. For example, a great portion of the semiconductor substrate 202 may be removed by using CMP, and then a remaining portion of the semiconductor substrate 202 may be recessed to be disposed under bottom surfaces of the patterned insulating layer 235 and the first TSV 230a by using isotropic etching, for example, wet etching.

Figure 37F:
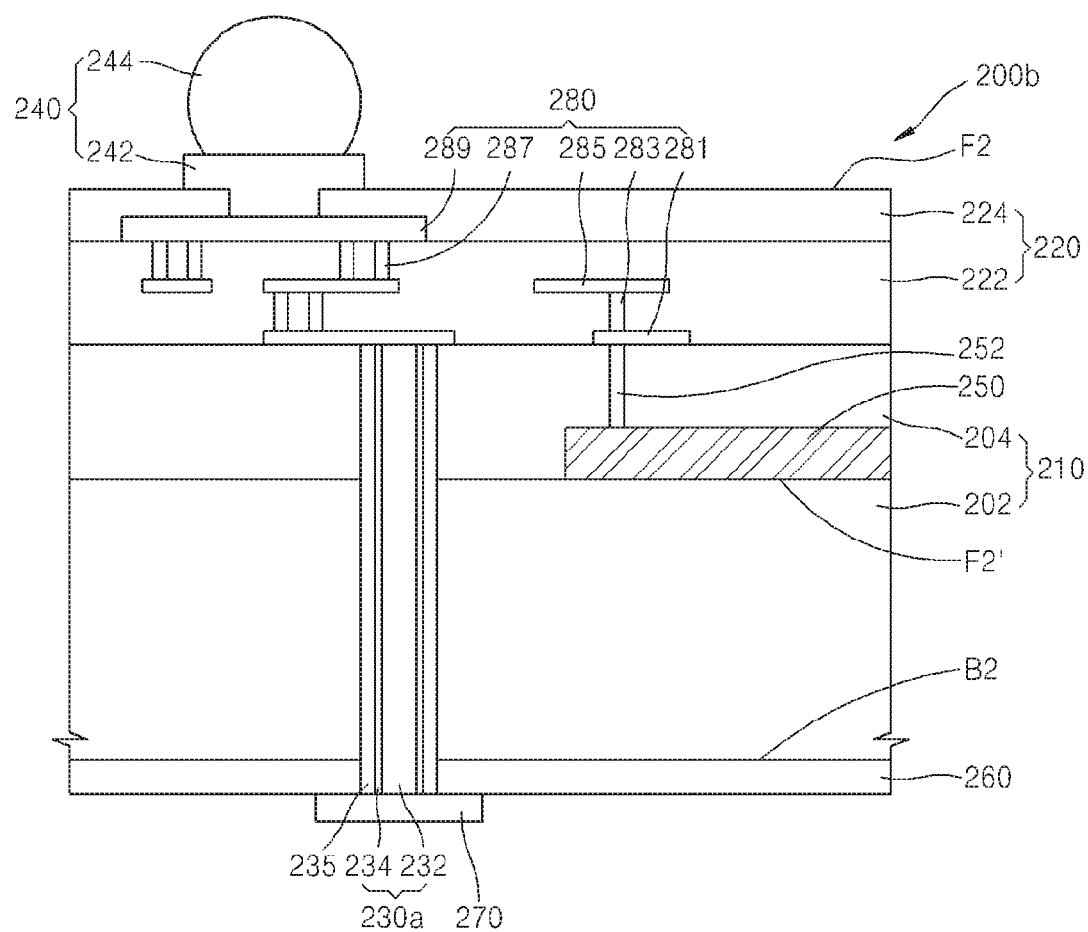

Referring to FIG. 37F, the protective layer 260 is formed on the protruding first TSV 230a and the back surface B2 of the semiconductor substrate 202. In an embodiment, in FIG. 37E, a surface of the first TSV 230a is not exposed and the barrier metal layer 234 and the patterned insulating layer 235 remain. The surface of the first TSV 230a may be exposed when an insulating material layer is formed on the first TSV layer 230a and the semiconductor substrate 202 and then is etched to form the protective layer 260.

Next, the bump pad 270 that is used as a third connection member connected to the first TSV 230a is formed. The second front surface F2 of the second chip 200b may become a surface of the passivation layer 224 as described above. After the bump pad 270 is formed, the chip-stacked semiconductor package may be completed by performing a manufacturing process of FIGS. 11 through 13.

Figure 38:
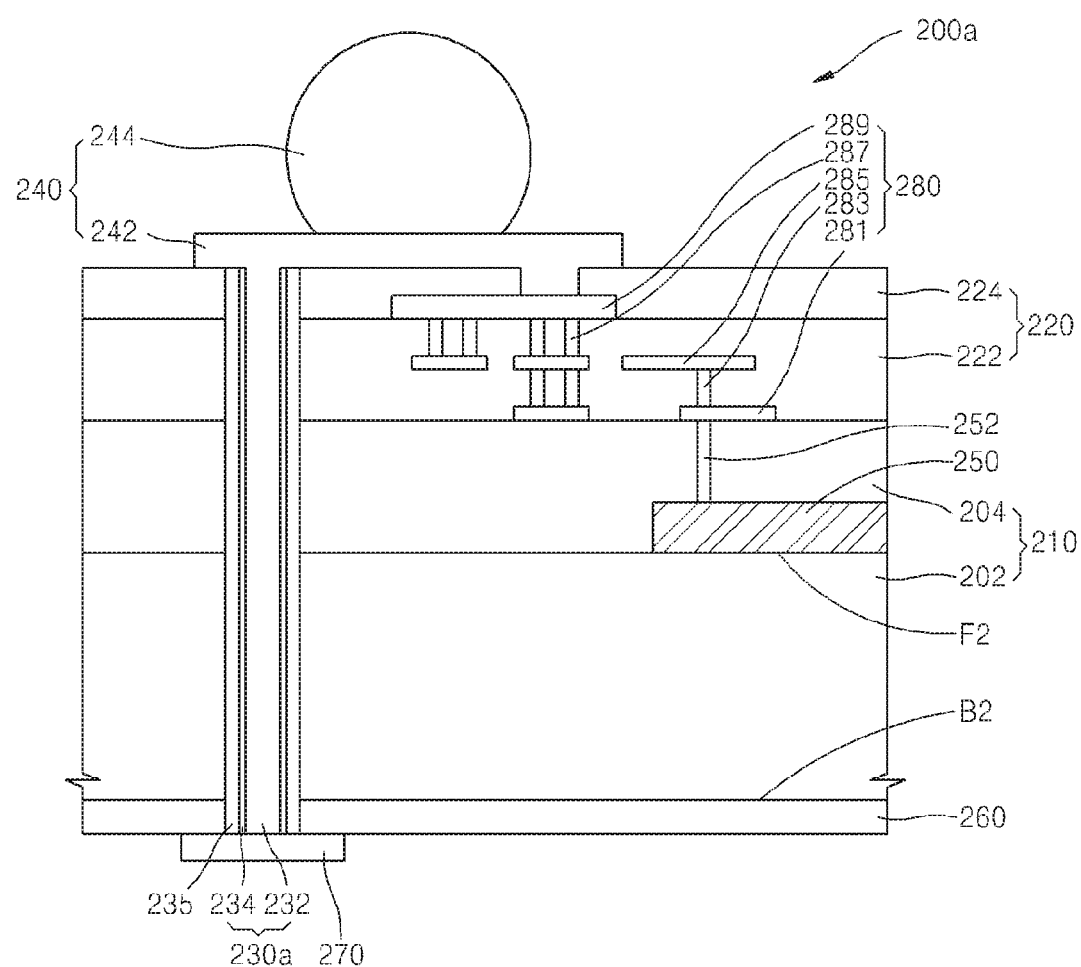
FIG. 38 is a cross-sectional view for explaining a method of manufacturing a second chip used in a method of manufacturing a chip-stacked semiconductor package, according to another example embodiment of inventive concepts.

FIG. 38 is a cross-sectional view for explaining a method of manufacturing a second chip used in a method of manufacturing a chip-stacked semiconductor package, according to another example embodiment of inventive concepts. FIG. 38 illustrates the second chip 200a of FIGS. 29 through 32.

In detail, the second chip 200a of FIG. 38 has a similar structure to that of the second chip 200b of FIG. 37F except the first TSV 230. Accordingly, the description already made with reference to FIGS. 37A through 37F will be omitted or briefly given for convenience of explanation.

In the second chip 200a, the first TSV 230 may be formed to have a via-last structure. Accordingly, the first TSV 230a may pass through the semiconductor substrate 202, the interlayer insulating layer 204, the intermetal insulating layer 222, and the passivation layer 224, and may be directly connected to the bump pad 242 of the second connection member 240. A layer structure of the first TSV 230 and the patterned insulating layer 235 are the same as those described with reference to FIGS. 37A through 37F.

Figure 39A:
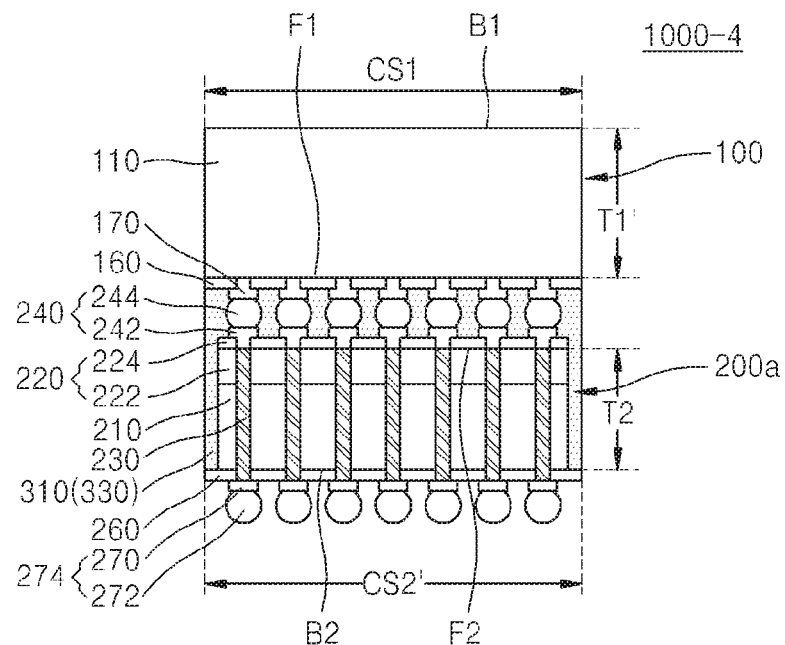
FIGS. 39A and 39B are cross-sectional views illustrating chip-stacked semiconductor packages according to some example embodiments of inventive concepts.
Figure 39B:
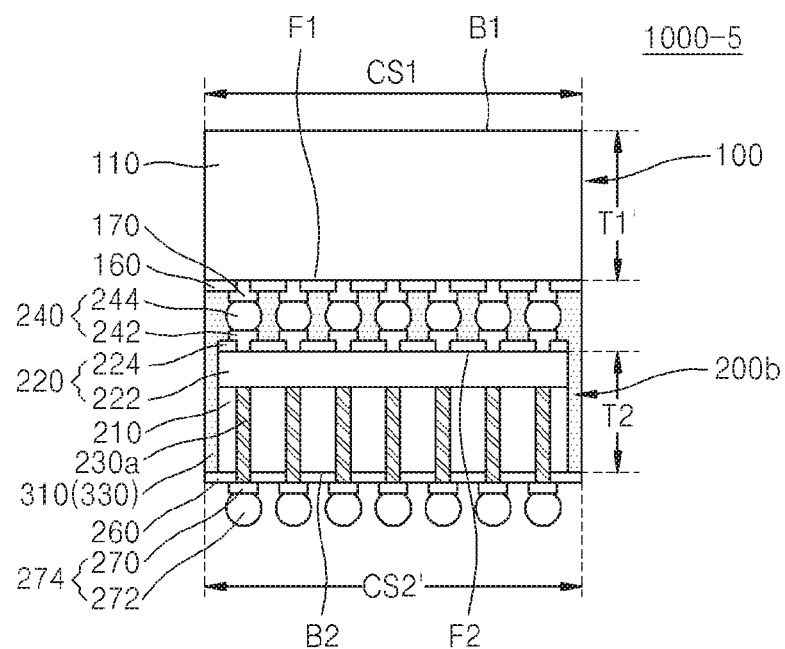

FIGS. 39A and 39B are cross-sectional views illustrating chip-stacked semiconductor packages according to some example embodiments of inventive concepts.

In detail, FIG. 39A illustrates a chip-stacked semiconductor package 1000-4 manufactured by using the method of FIGS. 29 through 32. FIG. 39B illustrates a chip-stacked semiconductor package 1000-5 manufactured by using the method of FIGS. 33 and 34.

The chip-stacked semiconductor packages 1000-4 and 1000-5 of FIGS. 39A and 39B are the same as the chip-stacked semiconductor package 1000 of FIG. 13 except the following. Accordingly, the description already made with reference to FIG. 13 will be omitted for convenience of explanation.

When the chip-stacked semiconductor package 1000-4 of FIG. 39A is compared with the chip-stacked semiconductor package 1000 of FIG. 13, the chip-stacked semiconductor package 1000-4 of FIG. 39A and the chip-stacked semiconductor package 1000 of FIG. 13 are the same except that the insulating layer 220 including the intermetal insulating layer 222 is formed on the second chip 220a. In other words, in the chip-stacked semiconductor package 1000-4 of FIG. 39A the insulating layer 220 including the intermetal insulating layer 222 and the passivation layer 224 may be formed on the second front surface F2 of the second chip 200a. The first TSV 230 of the second chip 200a of FIG. 39A may pass through the intermetal insulating layer 222 and may be connected to the second connection member 240.

When the chip-stacked semiconductor package 1000-5 of FIG. 39B is compared with the chip-stacked semiconductor package 1000 of FIG. 13, the chip-stacked semiconductor package 1000-5 of FIG. 39B and the chip-stacked semiconductor package 1000 of FIG. 13 are the same except that the insulating layer 220 including the intermetal insulating layer 222 is formed on the second chip 200b. In other words, in the chip-stacked semiconductor package 1000-4 of FIG. 39B, the insulating layer 220 including the intermetal insulating layer 222 and the passivation layer 224 may be formed on the second front surface F2 of the second chip 200b. The first TSV 230a of the second chip 200b of FIG. 39B may not pass through the intermetal insulating layer 222, and may be connected to the second connection member 240 through a wired pattern included in the insulating layer 220.

Figure 40:
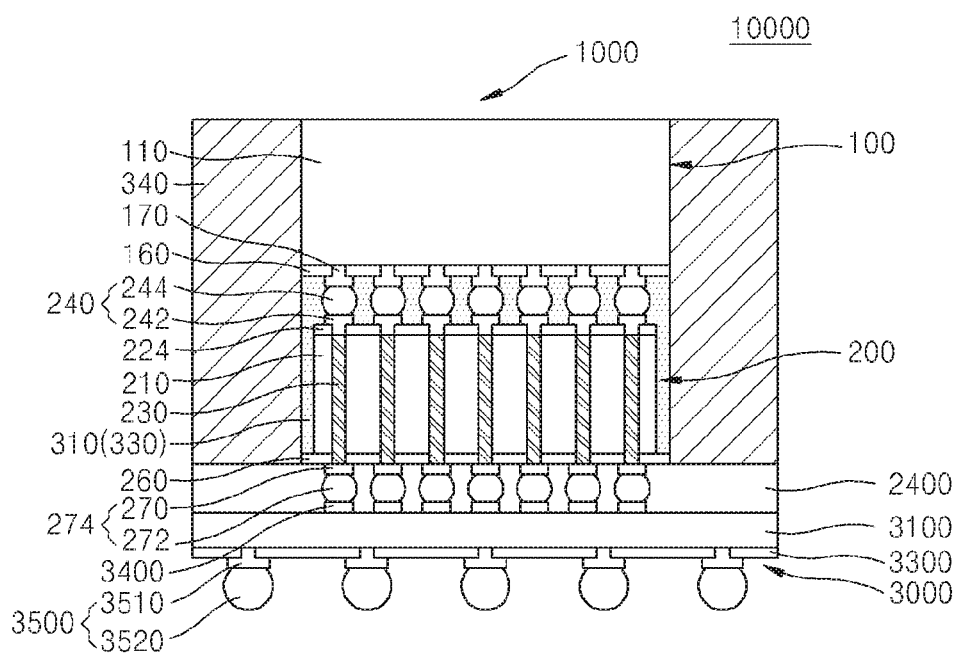
FIG. 40 is a cross-sectional view illustrating a chip-stacked semiconductor package according to another example embodiment of inventive concepts.

FIG. 40 is a cross-sectional view illustrating a chip-stacked semiconductor package 10000 according to another example embodiment of inventive concepts.

In detail, the chip-stacked semiconductor package 10000 of FIG. 40 may include a board substrate 3000 and an upper semiconductor package 1000. The upper semiconductor package 1000 may be the same as the chip-stacked semiconductor package 1000 of FIG. 13. Accordingly, the description of elements of the upper semiconductor package 1000 will be omitted or briefly given. Although the chip-stacked semiconductor package 1000 of FIG. 13 is illustrated as the upper semiconductor package 1000 in FIG. 40, any of the afore-described chip-stacked semiconductor packages may be used as the upper semiconductor package 1000.

The upper semiconductor package 1000 is stacked on the board substrate 3000, and the upper semiconductor package 1000 is sealed by an additional sealing member 340. The upper semiconductor package 1000 may be mounted on the board substrate 3000 by using an adhesive member 2400. The first sealing member 330 including the underfill 310 is formed on both side surfaces of the second chip 200, and the upper semiconductor package 1000 is sealed by using the additional sealing member 340 that is disposed on both side walls of the first sealing member 330. The additional sealing member 340 and a molding member that has been described above may be formed of the same material.

The board substrate 3000 may have any of various shapes, and may include a body layer 3100, a lower protective layer 330, an upper pad 3400, and a connection member 3500. The connection member 3500 may include a bump pad 3510 and a bump 3520. A plurality of wired patterns may be formed on the body layer 3100. The lower protective layer 3300 functions to protect the body layer 3100, and may be, for example, a solder resist.

Figure 41:
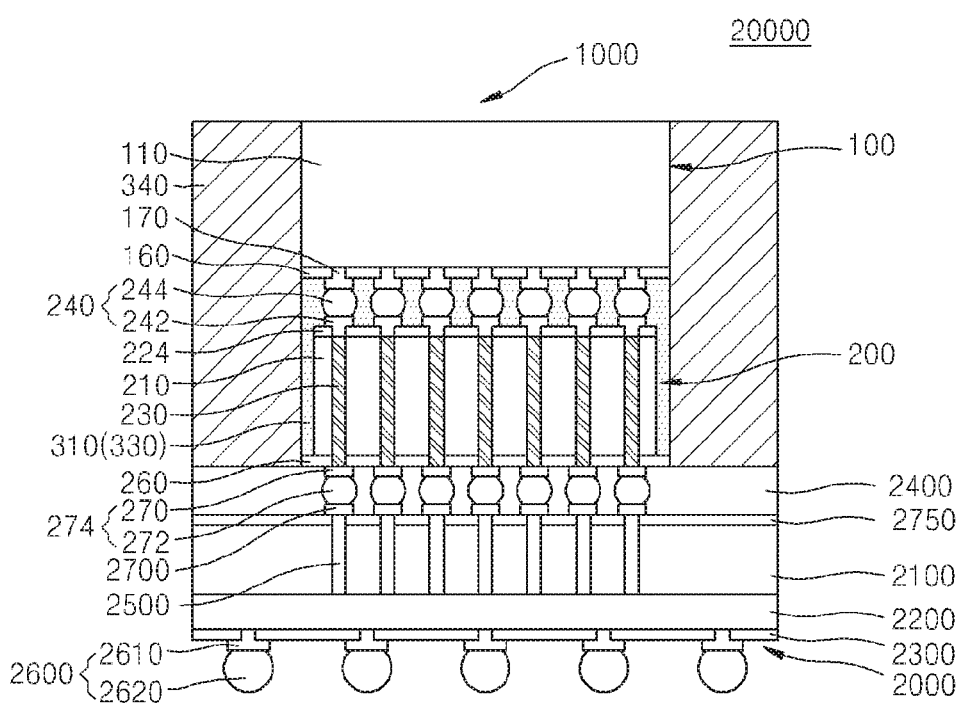
FIG. 41 is a cross-sectional view illustrating a chip-stacked semiconductor package according to another example embodiment of inventive concepts.

FIG. 41 is a cross-sectional view illustrating a chip-stacked semiconductor package 20000 according to another example embodiment of inventive concepts.

In detail, a chip-stacked semiconductor package 20000 of FIG. 41 may include a main chip 2000 and the upper semiconductor package 1000. The upper semiconductor package 1000 may be the same as the chip-stacked semiconductor package 1000 of FIG. 13. Accordingly, the description already made for elements of the upper semiconductor package 1000 will be omitted or briefly given. Although the chip-stacked semiconductor package 1000 of FIG. 13 is illustrated as the upper semiconductor package 1000 in FIG. 41, any of the afore-described chip-stacked semiconductor packages may be used as the upper semiconductor package 1000.

The upper semiconductor package 1000 is stacked on the main chip 20000, and the upper semiconductor package 1000 is sealed by the additional sealing member 340. The first sealing member 330 including the underfill 310 is formed on both side surfaces of the second chip 200, and the upper semiconductor package 1000 is sealed by the additional sealing member 340 that is disposed on both side walls of the first sealing member 330. The additional sealing member 340 and a molding member that has been described above may be formed of the same material.

The main chip 2000 may have a size that is greater than that of each of the first and second chips 100 and 200 included in the upper semiconductor package 1000. A horizontal size of the main chip 2000 may be equal to an entire horizontal size of the upper semiconductor package 1000, that is, a horizontal size of the upper semiconductor package 1000 including the additional sealing member 340. The upper semiconductor package 1000 may be mounted on the main chip 2000 by using the adhesive member 2400. Accordingly, a bottom surface of the additional sealing member 340 of the upper semiconductor package 1000 may be adhered to an outer edge portion of the main chip 2000 by using the adhesive member 2400.

The main chip 2000 may include a body layer 2100, a lower insulating layer 2200, a passivation layer 2300, a TSV 2500, connection members 2600 and 2700, and a protective layer 2750, like a memory chip. Various integrated circuit layers and multi-layer wired patterns in the lower insulating layer 2200 and the passivation layer 2300 may be formed according to a type of a main chip. The main chip 2000 may be a logic chip, for example, a central processing unit (CPU), a controller, or an application-specific integrated circuit (ASIC).

The number of the TSVs 2500 and the connection members 2700 corresponding to the TSVs 2500 may be equal to the number of the third connection members 274 of the second chip 200 of the upper semiconductor package 1000 that is stacked on the main chip 2000. If necessary, the number of the TSVs 2500 may be greater than the number of the third connection members 274.

Each of the connection members 2600 that are formed on a bottom surface of the main chip 2000 may include a bump pad 2610 and a bump 2620, and the number of the connection members 2600 may be less than the number of the TSVs 2500. Accordingly, the TSVs 2500 having no corresponding connection members 2600 may be collectively connected to one connection member 2600 through the multi-layer wired pattern.

The connection member 2600 that is formed on the main chip 2000 has a size that is greater than that of the third connection member 274 of the upper semiconductor package 1000. This is because it is difficult to reduce a size since wires that are formed on a board substrate (not shown) on which the main chip 2000 is mounted are standardized or the board substrate is formed of a specific material (for example, plastic). Accordingly, all of the TSVs 2500 may not respectively correspond to the connection members 2600.

Figure 42:
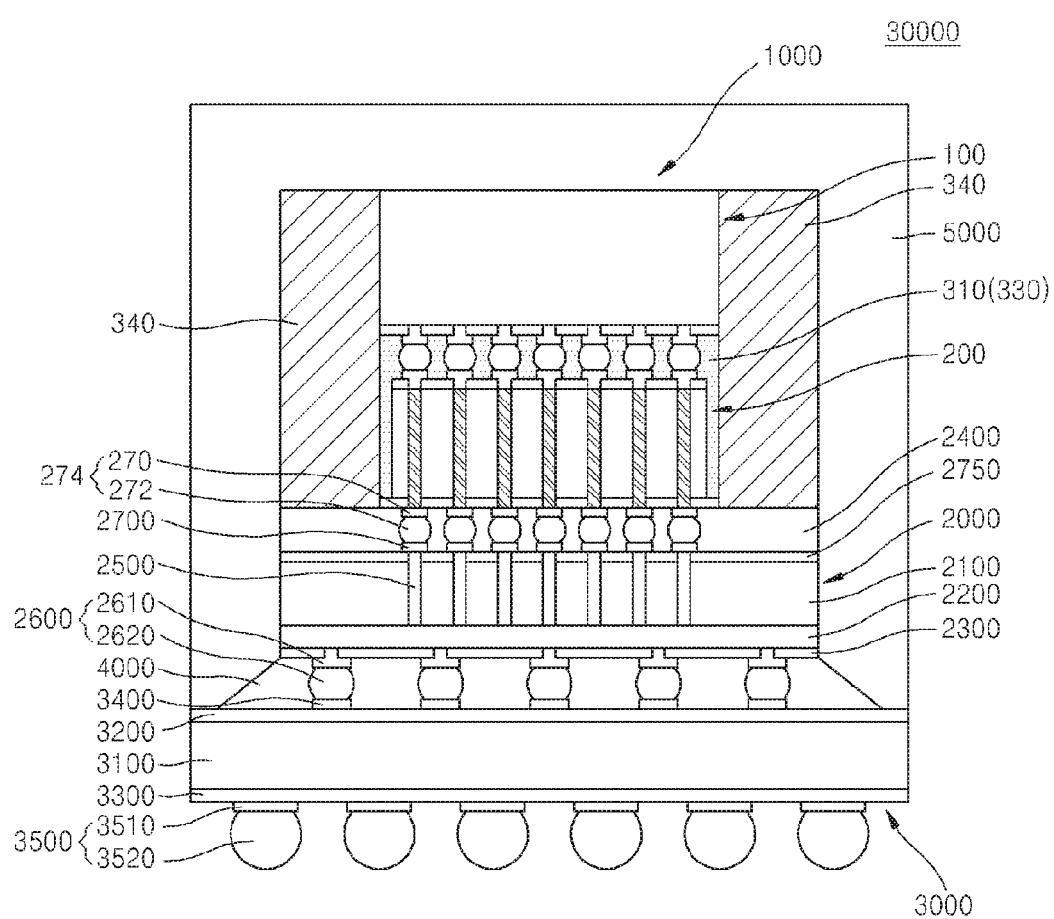
FIG. 42 is a cross-sectional view illustrating a chip-stacked semiconductor package according to another example embodiment of inventive concepts.

FIG. 42 is a cross-sectional view illustrating a chip-stacked semiconductor package 30000 according to another example embodiment of inventive concepts.

In detail, a chip-stacked semiconductor package 30000 of FIG. 42 may include a board substrate 3000, the main chip 2000, the upper semiconductor package 1000, an underfill 4000, and an outer sealing member 5000. The upper semiconductor package 1000 and the main chip 2000 may be the same as those of FIG. 41. Accordingly, a detailed explanation of elements of the upper semiconductor package 1000 and the main chip 2000 will be omitted.

The upper semiconductor package 1000 and the main chip 2000 may be mounted on the board substrate 3000 by using the connection member 2600. The board substrate 3000 may have any of various shapes, and may include a body layer 3100, an upper protective layer 3200, a lower protective layer 3300, an upper pad 3400, and a connection member 3500. A plurality of wired patterns may be formed on the body layer 3100. The connection member 3500 may include a bump pad 3510 and a bump 3520. The upper protective layer 3200 and the lower protective layer 3300 function to protect the body layer 3100, and may be, for example, solder resists.

The outer sealing member 5000 may seal side surfaces and top surfaces of the upper semiconductor package 1000 and the main chip 2000, and a bottom surface of the outer sealing member 5000 may be adhered to an outer edge portion of the board substrate 3000. The underfill 4000 fills a connected portion between the main chip 2000 and the board substrate 3000. Although the underfill 4000 is formed on the connected portion between the main chip 2000 and the board substrate 3000 in FIG. 42, the underfill 4000 may be omitted when the outer sealing member 5000 is formed by using MUF.

Figure 43:
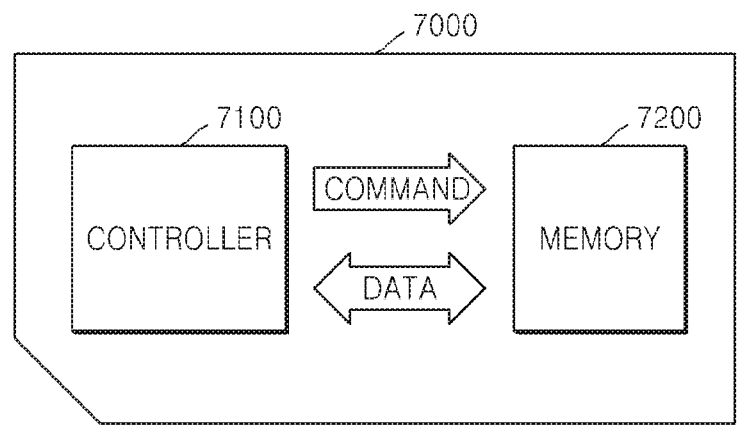
FIG. 43 is a block diagram illustrating a memory card including a chip-stacked semiconductor package, according to an example embodiment of inventive concepts.

FIG. 43 is a block diagram illustrating a memory card 7000 including a chip-stacked semiconductor package, according to an example embodiment of inventive concepts.

In detail, a controller 7100 and a memory 7200 in the memory card 7000 may be disposed to exchange an electrical signal. For example, when the controller 7100 sends a command, the memory 7200 may transmit data. The controller 7100 and/or the memory 7200 may include a chip-stacked semiconductor package according to any one of example embodiments of the inventive concepts. The memory 7200 may include a memory array (not shown) or a memory array bank (not shown).

The memory card 7000 may be used in a memory device such as a memory stick card, a smart media (SM) card, a secure digital (SD) card, a mini SD card, or a multimedia card (MMC).

Figure 44:
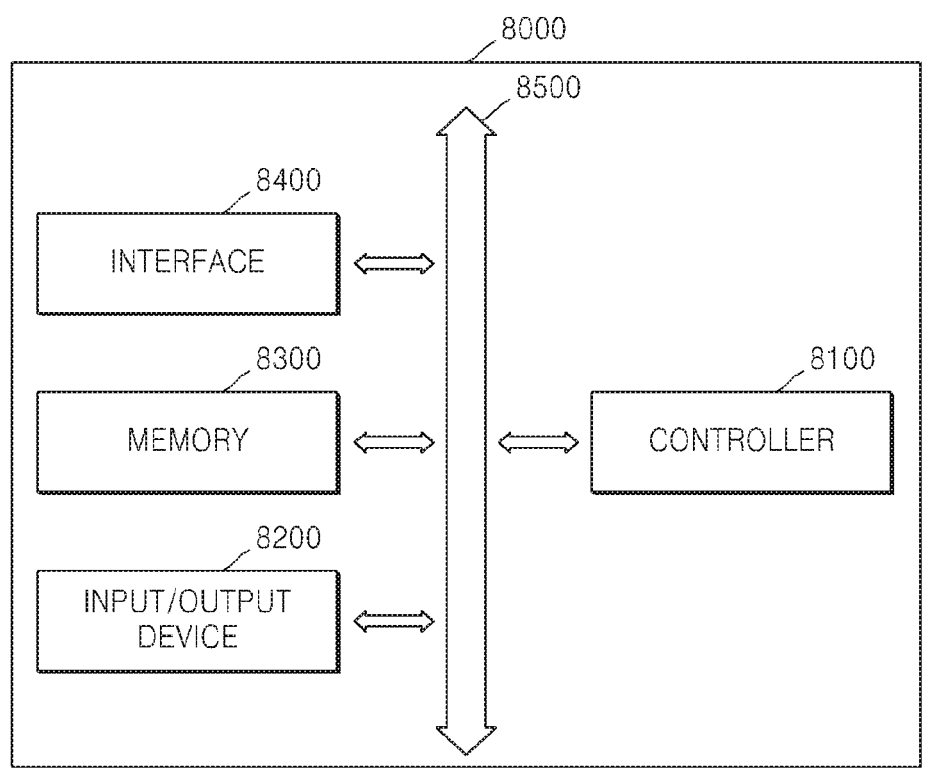
FIG. 44 is a block diagram illustrating an electronic system including a chip-stacked semiconductor package, according to an example embodiment of inventive concepts.

FIG. 44 is a block diagram illustrating an electronic system 8000 including a chip-stacked semiconductor package, according to an example embodiment of inventive concepts.

In detail, the electronic system 8000 may include a controller 8100, an input/output device 8200, a memory 8300, and an interface 8400. The electronic system 8000 may be a mobile system or a system that transmits or receives information. The mobile system may be a personal digital assistant (PDA), a portable computer, a web tablet, a wireless phone, a mobile phone, a digital music player, or a memory card.

The controller 8100 may function to execute a program and control the electronic system 8000. The controller 8100 may be, for example, a microprocessor, a digital signal processor, a microcontroller, or the like. The input/output device 8200 may be used to input or output data of the electronic system 8000.

The electronic system 8000 may be connected to an external device, such as a personal computer or a network, by using the input/output device 8200, and may exchange data with the external device. The input/output device 8200 may be, for example, a keypad, a keyboard, or a display unit. The memory 8300 may store code and/or data for operating the controller 8100, and/or may store data processed by the controller 8100. The controller 8100 and the memory 8300 may include a chip-stacked semiconductor package according to any one of example embodiments of inventive concepts. The interface 8400 may be a path through which data is transmitted between the electronic system 8000 and the external device. The controller 8100, the input/output device 8200, the memory 8300, and the interface 8400 may communicate with one another via a bus 8500.

For example, the electronic system 8000 may be used in a mobile phone, an MP3 player, a navigation system, a portable multimedia player (PMP), a solid-state disk (SSD), or a household appliance.

According to the one or more example embodiments of inventive concepts, when first chips and second chips are to be stacked, the second chips are directly stacked on the first chips that are formed on a base wafer without using a temporary carrier wafer. Accordingly, since the temporary carrier wafer is not used, a process of attaching or detaching the temporary carrier wafer to or from the base wafer is not required and package manufacturing costs may be greatly reduced.

According to the one or more example embodiments of inventive concepts, when the second chips are stacked on the first chips, a thickness of the first chips may be greater than a thickness of the second chips. Accordingly, the risk of damage to the first chips may be reduced and heat dissipation efficiency may be improved.

According to the one or more example embodiments of inventive concepts, when the second chips are stacked on the first chips, side surfaces and back surfaces of the first chips are exposed, and thus heat dissipation efficiency of a chip-stacked semiconductor package may be improved.

According to the one or more example embodiments of inventive concepts, the second chips are stacked on the base wafer including the plurality of first chips and a size of the second chips is less than or equal to a size of the first chips. Accordingly, an underfill process or a sawing process may be more easily performed without being affected by a size, for example, a width, of a scribe line area on the base wafer that is highly integrated, and thus the chip-stacked semiconductor package may be reliably manufactured.

According to the one or more example embodiments of inventive concepts, the chip-stacked semiconductor package in which side surfaces or back surfaces of the first chips or side surfaces of the second chips are exposed may be obtained. When the chip-stacked semiconductor package is mounted on a main chip or a board substrate and is molded again, an additional sealing member may be well coupled and attached to the back surfaces or the side surfaces of the first chips or the side surfaces of the second chips.

While inventive concepts have been particularly shown and described with reference to example embodiments thereof, it will be understood that various changes in form and details may be made therein without departing from the spirit and scope of the following claims. Accordingly, the true technical scope of inventive concepts is defined by the technical spirit of the appended claims.

What is claimed is:

1. A method of manufacturing a chip-stacked semiconductor package, the method comprising:
   preparing a base wafer, the base wafer including a plurality of first chips, each of the plurality of first chips having a first front surface, a first back surface that is opposite to the first front surface, and a first connection member on the first front surface;
   preparing a plurality of second chips, each of the plurality of second chips having a second front surface, a second back surface that is opposite to the second front surface, and a second connection member on the second front surface;
   stacking the plurality of second chips on the plurality of first chips such that the second connection member is electrically connected to the first connection member between the first front surface and the second front surface;
   sealing the plurality of second chips by using a first sealing member;
   forming a first through-silicon via (TSV) that is electrically connected to the second connection member in each of the plurality of second chips after the sealing of the plurality of second chips; and
   separating the plurality of first chips and the plurality of second chips, the plurality of first chips and the plurality of second chips being on the base wafer, each first connection member and a corresponding second connection member being symmetric with respect to each other.

2. The method of claim 1, further comprising:
   forming a third connection member on the second back surface of each of the plurality of second chips, after the forming the first TSV, the third connection member connected to the first TSV.

3. The method of claim 2, further comprising:
   attaching at least one third chip to each of the plurality of second chips,
   wherein each of the at least one third chip has a third front surface, a third back surface that is opposite to the third front surface, and a fourth connection member on the third front surface, the fourth connection member is electrically connected to the third connection member between the second back surface and the third front surface.

4. The method of claim 3, further comprising:
   forming a second sealing member that fills a space between the third connection member and the fourth connection member.

5. The method of claim 4, wherein the second sealing member is on a connected portion between the third connection member and the fourth connection member, and the second sealing member is on a side surface of the third chip.

6. The method of claim 3, further comprising:
   sealing the at least one third chip using a second sealing member; and
   forming a second TSV that is electrically connected to the third connection member, the second TSV being in the at least one third chip.

7. The method of claim 3, further comprising:
   forming a fifth connection member on the third back surface of the third chip.

8. The method of claim 1, wherein the separating of the plurality of first and second chips comprises:
   sawing a first width of the base wafer; and
   sawing a second width of the plurality of second chips, the second width being less than the first width.

9. The method of claim 8, wherein the sawing the first width and the sawing the second width are performed before forming the first TSV.

10. The method of claim 1, wherein the separating of the plurality of first and second chips comprises:
    sawing the base wafer to form the first sealing member on side surfaces of each of the plurality of second chips.

11. The method of claim 1, wherein the separating of the plurality of first and second chips comprises:
    sawing the base wafer to expose side surfaces of each of the plurality of second chips.

12. The method of claim 1, wherein the sealing the plurality of second chips seals first and second sides of each of the plurality of second chips and the method further comprises:
    molding the plurality of second chips by applying a molding member after the sealing the plurality of second chips.

13. The method of claim 1, further comprising:
    forming a third connection member on the second back surface of the second chip; stacking the first and second chips to one of a main chip and a board substrate, the third connection member connecting the first and second chips to one of the main chip and the board substrate.

14. A method of manufacturing a chip-stacked semiconductor package, the method comprising:
    preparing a base wafer, the base wafer including a plurality of first chips, each of the plurality of first chips has a first front surface, a first back surface that is opposite to the first front surface, and a first connection member on the first front surface;
    preparing a plurality of second chips, each of the plurality of second chips has a second front surface, a second back surface that is opposite to the second front surface, a second connection member on the second front surface, and a first through-silicon via (TSV), the first TSV is electrically connected to the second connection member;
    stacking the plurality of second chips on the plurality of first chips such that the first connection member and the second connection member are symmetric with respect to each other;
    electrically connecting the second connection member to the first connection member between the first front surface and the second front surface;
    sealing the plurality of second chips by a first sealing member;
    forming a third connection member on the second back surface of each of the plurality of second chips, the third connection member connected to the first TSV;
    attaching at least one third chip to each of the plurality of second chips, each of the at least one third chip having a third front surface, a third back surface opposite to the third front surface, a fourth connection member on the third front surface, and a second TSV connected to the fourth connection member, the second TSV electrically connecting the fourth connection member to the third connection member between the second back surface and the third front surface;
    sealing the at least one third chip using a second sealing member; and
    separating the plurality of first chips, the plurality of second chips, and the at least one third chip, the separating of the plurality of first chips, the plurality of second chips, and the at least one third chip including, sawing the base wafer to form the first sealing member and the second sealing member on side surfaces of the plurality of second chips and the at least one third chip.

15. The method of claim 14, further comprising:
forming a fifth connection member on the third back surface of the third chip.

16. The method of claim 14, wherein the second sealing member fills a space between the third connection member and the fourth connection member.

17. The method of claim 14, wherein the second sealing member is on a connected portion between the third connection member and the fourth connection member.

18. A method of manufacturing a chip-stacked semiconductor package, the method comprising:
preparing a base wafer, the base wafer including a plurality of first chips, each of the plurality of first chips has a first front surface, a first back surface that is opposite to the first front surface, and a first connection member on the first front surface;
preparing a plurality of second chips, each of the plurality of second chips has a second front surface, a second back surface that is opposite to the second front surface, a second connection member on the second front surface, and a first through-silicon via (TSV), the first TSV is electrically connected to the second connection member;
stacking the plurality of second chips on the plurality of first chips such that the first connection member and the second connection member are symmetric with respect to each other;
electrically connecting the second connection member to the first connection member between the first front surface and the second front surface;
sealing the plurality of second chips by a first sealing member;
forming a third connection member on the second back surface of each of the plurality of second chips, the third connection member connected to the first TSV;
attaching at least one third chip to each of the plurality of second chips, each of the at least one third chip having a third front surface, a third back surface opposite to the third front surface, a fourth connection member on the third front surface, and a second TSV connected to the fourth connection member, the second TSV electrically connecting the fourth connection member to the third connection member between the second back surface and the third front surface;
sealing the at least one third chip using a second sealing member; and
separating the plurality of first chips, the plurality of second chips, and the at least one third chip, the separating of the plurality of first chips, the plurality of second chips, and the at least one third chip including,
sawing the base wafer to expose side surfaces of each of the plurality of second chips and the at least one third chip.

19. The method of claim 18, further comprising:
forming a fifth connection member on the third back surface of the third chip.

20. The method of claim 18, wherein the second sealing member fills a space between the third connection member and the fourth connection member.

* * * * *